United States Patent
Itonaga

(10) Patent No.: US 9,490,285 B2
(45) Date of Patent: Nov. 8, 2016

(54) SOLID-STATE IMAGING DEVICE AND MANUFACTURING METHOD THEREOF, AND ELECTRONIC APPARATUS

(75) Inventor: Kazuichiroh Itonaga, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/299,951

(22) Filed: Nov. 18, 2011

(65) Prior Publication Data

US 2012/0147207 A1 Jun. 14, 2012

(30) Foreign Application Priority Data

Nov. 24, 2010 (JP) ................. 2010-260973

(51) Int. Cl.
*H01L 27/146* (2006.01)
*H01L 23/13* (2006.01)

(52) U.S. Cl.
CPC ......... *H01L 27/14618* (2013.01); *H01L 23/13* (2013.01); *H01L 27/1464* (2013.01); *H01L 27/1469* (2013.01); *H01L 27/14634* (2013.01); *H01L 2924/0002* (2013.01)

(58) Field of Classification Search
CPC .................. H01L 27/14618; H01L 27/14625; H01L 27/14683; H01L 27/14685; H01L 27/14601; H01L 27/14634
USPC ......... 257/415, 432–434, E21.127, E21.124, 257/E21.499; 438/57, 64, 66
See application file for complete search history.

(56) References Cited

U.S. PATENT DOCUMENTS

| | | | |
|---|---|---|---|
| 5,252,850 A * | 10/1993 | Schempp | 257/433 |
| 5,880,777 A * | 3/1999 | Savoye et al. | 348/217.1 |
| 5,909,244 A * | 6/1999 | Waxman et al. | 348/222.1 |
| 6,489,992 B2 * | 12/2002 | Savoye | 348/340 |
| 6,791,072 B1 * | 9/2004 | Prabhu | 250/208.1 |
| 7,190,039 B2 * | 3/2007 | Boettiger et al. | 257/432 |
| 7,390,687 B2 * | 6/2008 | Boettiger et al. | 438/64 |
| 7,507,944 B1 | 3/2009 | Arnzen et al. | |
| 7,547,955 B2 * | 6/2009 | Minamio et al. | 257/432 |
| 7,646,075 B2 * | 1/2010 | Akram | 257/434 |
| 7,696,588 B2 * | 4/2010 | Boettiger et al. | 257/432 |
| 7,888,188 B2 * | 2/2011 | Jiang et al. | 438/125 |
| 7,923,793 B2 * | 4/2011 | Choi et al. | 257/415 |
| 7,935,559 B1 * | 5/2011 | Giffard et al. | 438/69 |
| 8,013,410 B2 * | 9/2011 | Imai et al. | 257/432 |

(Continued)

FOREIGN PATENT DOCUMENTS

| | | | | |
|---|---|---|---|---|
| JP | 2003-188366 | | 7/2003 | |
| JP | 2004079578 A | * | 3/2004 | H01L 27/14 |

(Continued)

OTHER PUBLICATIONS

Machine translation of JP2005/243960A, Miyota KK.*

(Continued)

*Primary Examiner* — Marvin Payen
*Assistant Examiner* — Victor Barzykin
(74) *Attorney, Agent, or Firm* — Sheridan Ross P.C.

(57) ABSTRACT

A solid-state imaging device includes a supporting substrate that includes a concave portion, a solid-state imaging chip that is bonded on the supporting substrate so as to seal the concave portion in a view-angle region, a stress film that is formed on the surface of the solid-state imaging chip, and an imaging surface curved toward the concave portion at least in the view-angle region.

6 Claims, 29 Drawing Sheets

(56) References Cited

U.S. PATENT DOCUMENTS

| | | | |
|---|---|---|---|
| 8,248,499 B2* | 8/2012 | Sutton et al. | 348/294 |
| 2006/0186492 A1 | 8/2006 | Boettiger et al. | |
| 2006/0275941 A1* | 12/2006 | Oliver et al. | 438/57 |
| 2007/0120212 A1* | 5/2007 | Boettiger et al. | 257/432 |
| 2007/0132089 A1 | 6/2007 | Jiang et al. | |
| 2007/0228502 A1 | 10/2007 | Minamio | |
| 2009/0115875 A1 | 5/2009 | Choi et al. | |
| 2010/0025789 A1* | 2/2010 | Imai et al. | 257/432 |
| 2012/0159996 A1* | 6/2012 | Sutton | 65/406 |
| 2012/0217606 A1* | 8/2012 | Itonaga | 257/443 |
| 2012/0299140 A1* | 11/2012 | Sekine | 257/432 |
| 2013/0032921 A1* | 2/2013 | Tai et al. | 257/447 |

FOREIGN PATENT DOCUMENTS

| | | | | |
|---|---|---|---|---|
| JP | 2004-104259 | | 4/2004 | |
| JP | 2005045142 A | * | 2/2005 | H01L 27/14 |
| JP | 2005-064060 | | 3/2005 | |
| JP | 2005191218 A | * | 7/2005 | H01L 27/14 |
| JP | 2005-243960 | | 9/2005 | |
| JP | 2005260436 A | * | 9/2005 | H04N 5/335 |
| JP | 2007-266380 | | 10/2007 | |
| JP | 2008-294960 | | 12/2008 | |
| JP | 2009-049499 | | 3/2009 | |

OTHER PUBLICATIONS

Kwon et al., "Contraction stress build-up of anisotropic conductive films (ACFs) for flip-chip interconnection: Effect of thermal and mechanical properties of ACFs", J. Appl. Polym. Sci., vol. 93, pp. 2634-2641 (2004).*

European Search Report dated Mar. 22, 2012, issued in connection with counterpart EP Application No. 11 009 067.7.

* cited by examiner

SOLID-STATE IMAGING DEVICE AND MANUFACTURING METHOD THEREOF, AND ELECTRONIC APPARATUS

BACKGROUND

The present disclosure relates to a solid-state imaging device and a manufacturing method thereof, and an electronic apparatus such as a camera including the solid-state imaging device.

As a solid-state imaging device (imaging sensor), a CMOS solid-state imaging device, a CCD solid-state imaging device and the like are suggested. As illustrated in FIG. 39, in general, a camera 161 using the solid-state imaging device includes the solid-state imaging device 162 which is formed in a flat plate-shape, and an imaging lens system 164 which combines a plurality of lenses 163. When the imaging lens system images an object, deviation of a focal position between a center portion of an imaging surface and the peripheral portion is generated by a lens aberration referred to as a field curvature. In order to suppress the aberration, as illustrated in FIG. 39, correction of the aberration is performed by combining a plurality of lenses 163.

On the other hand, in order to suppress the aberration, various solid-state imaging devices which curve a semiconductor chip itself constituting the solid-state imaging device into a cylindrical shape or a spherical shape are suggested (for example, referred to Japanese Unexamined Patent Application Publication Nos. 2004-104259, 2003-188366, and 2005-243960).

SUMMARY

In all solid-state imaging devices having a curved surface described in the above Patent Documents, each semiconductor chip is divided from a semiconductor wafer, and the entire semiconductor chip is constituted to be curved in the state of the semiconductor chip. For example, as illustrated in FIGS. 40A and 40B, a base 166 having a cylindrical curved surface 166a is provided, a thinned semiconductor chip 167 is pressed to the curved surface 166a of the base 166 by a presser 168 having a cylindrical surface 168a, and the entire semiconductor chip 167 is curved into a cylindrical shape.

However, as illustrated in FIG. 41, the center O of the semiconductor chip 167 and a center P of a view-angle region 169 which is a pixel region are deviated from each other. In addition, it is preferable that the center P of the view-angle region and an optical center (a center of lens) Q of the imaging lens system 164 coincide with each other. However, when the semiconductor chip 167 is curved, the center O of the semiconductor chip 167 corresponds to the curved bottom position (the deepest bottom position), and the center P of the view-angle region is deviated from the bottom position. Since the imaging lens system 164 is positioned so that the optical center Q comes to the bottom position, as a result, the center P of the view-angle region and the optical center Q are deviated from each other, and the focus is not matched. That is, when the semiconductors 167 are curved one by one, the microfabrication may be not performed, and it is difficult for the center P of the view-angle region and the optical center Q of the lens to be matched to each other. Therefore, it is difficult to evenly focus in the entire view-angle region.

Therefore, it is desirable to provide a solid-state imaging device and a manufacturing method thereof capable of improving matching accuracy between a center of a view-angle region and an optical center of an imaging lens system, curving an imaging surface, and suppressing a lens aberration. In addition, it is desirable to provide an electronic apparatus such as a camera including the solid-state imaging device.

According to an embodiment of the present disclosure, there is provided a solid-state imaging device including a supporting substrate that includes a concave portion, a solid-state imaging chip that is bonded on the supporting substrate so as to seal the concave portion in a view-angle region, a stress film that is formed on a surface of the solid-state imaging chip, and an imaging surface curved toward the concave portion at least in the view-angle region.

In the solid-state imaging device of the embodiment of the present disclosure, the solid-state imaging chip is supported to the supporting substrate so as to seal the concave portion by the view-angle region, and the view-angle region is curved by a stress of the stress film which is formed on the surface of the solid-state imaging chip. Since the curved surface corresponds to a field curvature which is generated by an imaging lens aberration, the imaging lens aberration can be suppressed in the solid-state imaging chip side, and the number of lenses in an imaging lens system can be reduced. In addition, only the view-angle region is curved and the center of the curved view-angle region and the center of the concave portion can be matched to each other, and the semiconductor wafer is bonded on the supporting substrate as it is at first. Therefore, the view-angle region in each solid-state imaging portion of the semiconductor wafer and each concave portion of the supporting substrate can be matched to each other with high accuracy. The center of the concave portion and the optical center are matched to each other, and as a result, the center of the view-angle region and the optical center of the imaging lens system can be matched to each other with high accuracy.

According to another embodiment of the present disclosure, there is provided a solid-state imaging device including a supporting substrate that includes a concave portion, an adhesive agent having volumetric shrinkage which is filled in the concave portion, a solid-state imaging chip that is bonded on the supporting substrate so as to seal the concave portion in a view-angle region and is adhered by the adhesive agent, and an imaging surface in which the view-angle region is curved to the concave portion side by the volumetric shrinkage of the adhesive agent due to light irradiation or heating.

In the embodiment of the solid-state imaging device of the present disclosure, the solid-state imaging chip is supported to the supporting substrate so as to seal the concave portion by the view-angle region, and the view-angle region is curved by the volumetric shrinkage of the adhesive agent in the concave portion due to light irradiation or heating. Since the curved surface corresponds to a field curvature which is generated by an imaging lens aberration, the imaging lens aberration can be suppressed in the solid-state imaging chip side, and the number of the lenses in the imaging lens system can be reduced. Only the view-angle region is curved and the center of the curved view-angle region and the center of the concave portion can be matched to each other, and the semiconductor wafer is bonded on the supporting substrate at first. Therefore, the view-angle region in each solid-state imaging portion of the semiconductor wafer and each concave portion of the supporting substrate can be matched to each other with high accuracy. The center of the concave portion and the optical center are matched to each other, and as a result, the center of the view-angle region and the optical center of the imaging lens system can be matched to each other with high accuracy.

According to still another embodiment of the present disclosure, there is provided a solid-state imaging device a supporting substrate that includes a concave portion, a solid-state imaging chip that is bonded on the supporting substrate so as to seal the concave portion by a view-angle region, and an imaging surface in which the view-angle region is curved to the concave portion side by differential pressure between a vacuum in the concave portion and the atmospheric pressure of the outside of the solid-state imaging chip. In the solid-state imaging device of the embodiment of the disclosure, the solid-state imaging chip is supported to the supporting substrate so as to seal the concave portion by the view-angle region, and the view-angle region is curved by differential pressure between a vacuum in the concave portion and the atmospheric pressure of the outside of the solid-state imaging chip. Since the curved surface corresponds to a field curvature which is generated by an imaging lens aberration, the imaging lens aberration can be suppressed in the solid-state imaging chip side, and the number of the lenses in the imaging lens system can be reduced. Only the view-angle region is curved and the center of the curved view-angle region and the center of the concave portion can be matched to each other, and the semiconductor wafer is bonded on the supporting substrate as it is at first. Therefore, the view-angle region in each solid-state imaging portion of the semiconductor wafer and each concave portion of the supporting substrate can be matched to each other with high accuracy. The center of the concave portion and the optical center are matched to each other, and as a result, the center of the view-angle region and the optical center of the imaging lens system can be matched to each other with high accuracy.

According to still another embodiment of the present disclosure, there is provided a solid-state imaging device including a solid-state imaging chip that includes solid-state imaging portions, a supporting substrate adhered to the solid-state imaging chip and having a concave portion that is formed so that a portion corresponding to an view-angle region of the solid-state imaging portion of the supporting substrate is removed over an entire region in the thickness direction of the corresponding portion, an adhesive agent that is filled in the concave portion and has volumetric shrinkage, a sealing substrate that seals the adhesive agent in the rear surface of the supporting substrate, and an imaging surface in which the view-angle region is curved to the concave portion side by the volumetric shrinkage of the adhesive agent due to light irradiation or heating.

In the solid-state imaging device of the embodiment of the present disclosure, the solid-state imaging chip is supported to the supporting substrate, the adhesive agent is filled in the concave portion which is removed over the entire region in the thickness direction of the supporting substrate and formed, and the sealing substrate is formed on the rear surface of the supporting substrate. The view-angle region is curved by the volumetric shrinkage of the adhesive agent due to light irradiation or heating. Since the curved surface corresponds to a field curvature which is generated by an imaging lens aberration, the imaging lens aberration can be suppressed in the solid-state imaging chip side, and the number of the lenses in the imaging lens system can be reduced. Only the view-angle region is curved and the center of the curved view-angle region and the center of the concave portion can be matched to each other, and the semiconductor wafer is bonded on the supporting substrate as it is at first. Therefore, the view-angle region in each solid-state imaging portion of the semiconductor wafer and each concave portion of the supporting substrate can be matched to each other with high accuracy. The center of the concave portion and the optical center are matched to each other, and as a result, the center of the view-angle region and the optical center of the imaging lens system can be matched to each other with high accuracy.

According to still another embodiment of the present disclosure, there is provided a manufacturing method of a solid-state imaging device including: forming a plurality of concave portions in a supporting substrate; and forming a stress film on a surface of a semiconductor wafer which includes a plurality of solid-state imaging portions corresponding to each chip region. Subsequently, the manufacturing method includes bonding the semiconductor wafer on the supporting substrate so as to seal each concave portion in a view-angle region of each of the solid-state imaging portions. Subsequently, the manufacturing method includes curving the view-angle regions of the plurality of solid-state imaging portions to the concave portions side by stress of the stress film in a state where the semiconductor wafer is thinned. In addition, the manufacturing method includes dividing the semiconductor wafer and the supporting substrate into the plurality of solid-state imaging portions.

In the manufacturing method of the solid-state imaging device of the embodiment of the present disclosure, the view-angle region of each solid-state imaging portion is bonded on the supporting substrate so as to seal the concave portion in the state of the semiconductor wafer, and the view-angle region of each solid-state imaging portion is curved to the concave portion side by the stress of the stress film which is formed on the surface of the semiconductor wafer. When the semiconductor wafer is bonded on the supporting substrate as it is, matching of the position between the view-angle region in each solid-state imaging portion and each concave portion of the supporting substrate can be performed with high accuracy. In addition, since only the view-angle region is curved to the concave portion side by stress of the stress film in the state where the semiconductor wafer is thinned, the center of the view-angle region and the center of the concave portion can be matched to each other with high accuracy. Moreover, since the semiconductor wafer and the supporting substrate are divided into the solid-state imaging portions, the solid-state imaging device can be manufactured so that the center of the view-angle region and the optical center of the imaging lens system are matched to each other with high accuracy. Therefore, a plurality of the curved solid-state imaging devices can be effectively manufactured simultaneously.

According to still another embodiment of the present disclosure, there is provided a manufacturing method of a solid-state imaging device including forming a plurality of concave portions on the supporting substrate and filling an adhesive agent having volumetric shrinkage into the concave portion. Subsequently, the manufacturing method includes bonding a semiconductor wafer including a plurality of solid-state imaging portions on the supporting substrate so as to seal each concave portion by the view-angle region of each of the solid-state imaging portions, and adhering by the adhesive agent. Subsequently, the manufacturing method includes curving the view-angle regions of the plurality of the solid-state imaging portions to the concave portions side by a volumetric shrinkage effect of the adhesive agent due to light irradiation or heating in a state where the semiconductor wafer is thinned. In addition, the manufacturing method includes dividing the semiconductor wafer and the supporting substrate into the plurality of solid-state imaging portions.

In the manufacturing method of the solid-state imaging device of the embodiment of the present disclosure, the view-angle region of each solid-state imaging portion is bonded and adhered on the supporting substrate so as to seal the concave portion filled with the adhesive agent in the state of the semiconductor wafer. In addition, the view-angle region of each solid-state imaging portion is curved to the concave portion side by the volumetric shrinkage of the adhesive agent due to light irradiation or heating. When the semiconductor wafer is bonded on the supporting substrate as it is, matching of the position between the view-angle region in each solid-state imaging portion and each concave portion of the supporting substrate can be performed with high accuracy. In addition, in the state where the semiconductor wafer is thinned, since only the view-angle region is curved to the concave portion side by the volumetric shrinkage of the adhesive agent, the center of the view-angle region and the center of the concave portion can be matched to each other with high accuracy. Moreover, since the semiconductor wafer and the supporting substrate are divided into the solid-state imaging portions, the solid-state imaging device can be manufactured so that the center of the view-angle region and the optical center of the imaging lens system are matched to each other with high accuracy. Therefore, a plurality of the curved solid-state imaging devices can be effectively manufactured simultaneously.

According to still another embodiment of the present disclosure, there is provided a manufacturing method of a solid-state imaging device including forming a plurality of concave portions on a supporting substrate and bonding a semiconductor wafer including a plurality of solid-state imaging portions on the supporting substrate so as to seal each concave portion by an view-angle region of each of the solid-state imaging portions in a vacuum chamber. Thereafter, the manufacturing method includes bringing the chamber to atmospheric pressure, curving the view-angle regions of the plurality of solid-state imaging portions to the concave portions side by differential pressure between a vacuum and the atmospheric pressure in a state where the semiconductor wafer is thinned. In addition, the manufacturing method includes dividing the semiconductor wafer and the supporting substrate into the plurality of solid-state imaging portions.

In the manufacturing method of the solid-state imaging device of the embodiment of the present disclosure, in the vacuum chamber, the view-angle region of each solid-state imaging portion is bonded on the supporting substrate so as to seal the concave portion in the state of the semiconductor wafer. Thereafter, by bringing the inner portion of the chamber to atmospheric pressure, differential pressure is generated between the inner portion and the outer portion of the concave portion, and the view-angle region of each solid-state imaging portion is curved to the concave portion side. When the semiconductor wafer is bonded on the supporting substrate as it is, matching of the position between the view-angle region in each solid-state imaging portion and each concave portion of the supporting substrate can be performed with high accuracy. In addition, in the state where the semiconductor wafer is thinned, since only the view-angle region is curved to the concave portion side by the differential pressure between the inner and the outer portion of the concave portion, the center of the view-angle region and the center of the concave portion can be matched with to each other with high accuracy. Moreover, since the semiconductor wafer and the supporting substrate are divided into the solid-state imaging portions, the solid-state imaging device can be manufactured so that the center of the view-angle region and the optical center of the imaging lens system are matched to each other with high accuracy. Therefore, a plurality of the curved solid-state imaging devices can be effectively manufactured simultaneously.

According to still another embodiment of the present disclosure, there is provided a manufacturing method of a solid-state imaging device including the following. A semiconductor wafer including a plurality of solid-state imaging portions is bonded on a supporting substrate, and after the semiconductor wafer is thinned, a portion corresponding to an view-angle region of the solid-state imaging portion of the supporting substrate is removed over the entire region in the thickness direction of the corresponding portion, and a concave portion is formed. An adhesive agent having volumetric shrinkage is filled into the concave portion. A sealing substrate sealing the concave portion is bonded on the rear surface of the supporting substrate, and the adhesive agent is sealed. The view-angle region is curved by the volumetric shrinkage effect of the adhesive agent due to light irradiation or heating. The semiconductor wafer and the supporting substrate are divided into the plurality of solid-state imaging portions.

In the manufacturing method of the solid-state imaging device of the embodiment of the present disclosure, the semiconductor wafer is bonded on the supporting substrate as it is, and after the semiconductor is thinned, the portion of the supporting substrate corresponding to each view-angle region is removed over the entire region in the thickness direction of the corresponding portion, a concave portion is formed, and the adhesive agent is filled into the concave portion and is sealed by the sealing substrate. Subsequently, the view-angle region of each solid-state imaging portion is curved to the rear portion side by the volumetric shrinkage of the adhesive agent due to light irradiation or heating. When the semiconductor wafer is bonded on the supporting substrate as it is, matching of the position between the view-angle region in each solid-state imaging portion and each concave portion of the supporting substrate can be performed with high accuracy. In addition, in the state where the semiconductor wafer is thinned, since only the view-angle region is curved to the concave portion side by the volumetric shrinkage of the adhesive agent, the center of the view-angle region and the center of the concave portion can be matched to each other with high accuracy. Moreover, since the semiconductor wafer and the supporting substrate are divided into the solid-state imaging portions, the solid-state imaging device can be manufactured so that the center of the view-angle region and the optical center of the imaging lens system are matched to each other with high accuracy. Therefore, a plurality of the curved solid-state imaging devices can be effectively manufactured simultaneously.

According to still another embodiment of the present disclosure, there is provided an electronic apparatus including a solid-state imaging device, an optical system that introduces incident light into a photoelectric conversion portion of the solid-state imaging device, and a signal processing circuit that processes an output signal of the solid-state imaging device. The solid-state imaging device includes a supporting substrate that includes the concave portion, a solid-state imaging chip that is bonded on the supporting substrate so as to seal the concave portion in a view-angle region, a stress film that is formed on the surface of the solid-state imaging chip, and an imaging surface curved toward the concave portion at least in the view-angle region.

In the electronic apparatus of the embodiment of the present disclosure, since the electronic apparatus includes the solid-state imaging devices according to embodiments of the present disclosure, the imaging lens aberration is suppressed, matching accuracy between a center of an view-angle region and an optical center of an imaging lens system is improved, and the lens aberration can be suppressed by the curved imaging surface.

According to the solid-state imaging device of the embodiments of the present disclosure, since the view-angle region is curved, the matching accuracy between the center of the view-angle region and the optical center of the imaging lens system is improved. In addition, since the imaging surface is curved, the lens aberration can be suppressed.

According to the manufacturing method of the solid-state imaging device of the embodiments of the present disclosure, it is possible to manufacture the solid-state imaging device capable of improving the matching accuracy between the center of the view-angle region and the optical center of the imaging lens system and curving the imaging surface and suppressing the lens aberration.

According to the electronic apparatus of the embodiment of the present disclosure, since the electronic apparatus includes the solid-state imaging device according to embodiments of the present disclosure, the electronic apparatus having a high quality image can be provided.

DETAILED DESCRIPTION OF EMBODIMENTS

Hereinafter, embodiments of the present disclosure will be described. In addition, the description is performed according to the following order.

1. First Embodiment (Configuration Example of Solid-State Imaging Device and Example of Manufacturing Method Thereof)
2. Second Embodiment (Configuration Example of Solid-State Imaging Device and Example of Manufacturing Method Thereof)
3. Third Embodiment (Configuration Example of Solid-State Imaging Device and Example of Manufacturing Method Thereof)
4. Fourth Embodiment (Configuration Example of Solid-State Imaging Device and Example of Manufacturing Method Thereof)
5. Fifth Embodiment (Configuration Example of Solid-State Imaging Device and Example of Manufacturing Method Thereof)
6. Sixth Embodiment (Configuration Example of Solid-State Imaging Device and Example of Manufacturing Method Thereof)
7. Seventh Embodiment (Configuration Example of Solid-State Imaging Device and Example of Manufacturing Method Thereof)
8. Eighth Embodiment (Configuration Example of Solid-State Imaging Device and Example of Manufacturing Method Thereof)
9. Ninth Embodiment (Configuration Example of Solid-State Imaging Device and Example of Manufacturing Method Thereof)
10. Tenth Embodiment (Configuration Example of Solid-State Imaging Device and Example of Manufacturing Method Thereof)
11. Eleventh Embodiment (Configuration Example of Solid-State Imaging Device and Example of Manufacturing Method Thereof)
12. Twelfth Embodiment (Configuration Example of Solid-State Imaging Device and Example of Manufacturing Method Thereof)
13. Thirteenth Embodiment (Configuration Example of Solid-State Imaging Device and Example of Manufacturing Method Thereof)
14. Fourteenth Embodiment (Configuration Example of Electronic Apparatus)

1. First Embodiment

Configuration Example of Solid-State Imaging Device

Figure 1:
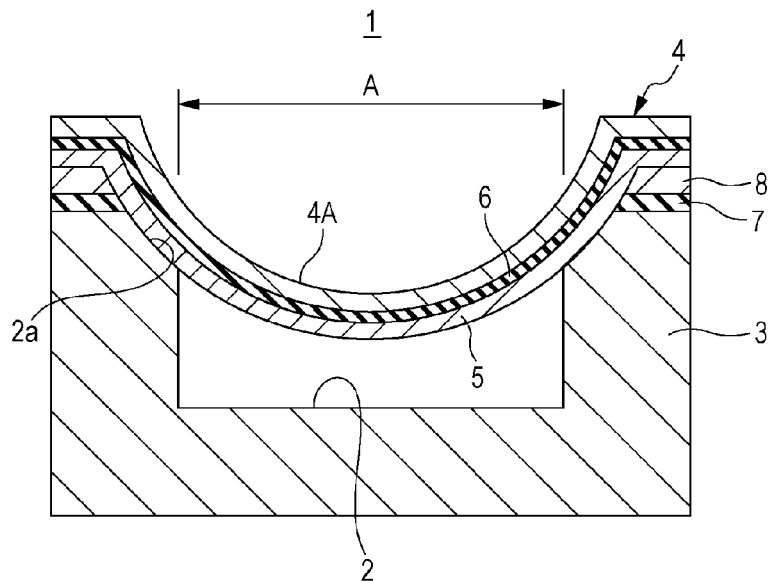
FIG. 1 is a schematic configuration diagram illustrating a first embodiment of a solid-state imaging device according to the present disclosure.

FIG. 1 illustrates a first embodiment of a solid-state imaging device according to the present disclosure. The present embodiment is a case which is applied to a backside-illumination type CMOS solid-state imaging device. The solid-state imaging device 1 according to the first embodiment includes a supporting substrate 3 including a concave portion 2, a backside-illumination type solid-state imaging chip 4 which is bonded on the supporting substrate 3 so as to seal the concave portion 2 in a view-angle region, and a stress film 5 which is formed on the surface of the solid-state imaging chip 4.

For example, the supporting substrate 3 can be formed of a silicon substrate, a glass substrate, or the like so as to be not deformed. In the present embodiment, the supporting substrate 3 is formed of a silicon substrate. The concave portion 2 of the supporting substrate 3 is formed so as to correspond to a view-angle region corresponding to a view-angle region in which a light receiving pixel of the solid-state imaging chip 4 is arranged. The upper edge 2a of the concave portion 2 is formed so that the opening is gradually widened when going toward the upper side. The shape of the upper edge 2a is formed so that the solid-state imaging chip 4 described hereinafter is curved at a desired curvature. In FIG. 1, the shape of the upper edge 2a is formed on the inclination surface. Except for that, the shape of the upper edge 2a may be formed so as to have a desired radius (R). The solid-state imaging chip 4 is bonded on the supporting substrate 3 with the light incident surface side as the upper side.

The stress film 5 is formed on a surface side opposite to the light incident surface side of the backside-illumination type solid-state imaging chip 4 by a film having a stress. For example, the stress film 5 may be formed of a plasma silicon nitride (SiN) film. The plasma silicon nitride film may be formed by controlling the included stress. The silicon nitride film constituting the stress film 5 is formed via a silicon oxide film 6. A plasma silicon nitride (SiN) film constituting a hard mask 8 is formed on the upper surface of the supporting substrate 3 via a silicon oxide film 7.

In addition, in the present embodiment, the thinned solid-state imaging chip 4 is constituted so as to be curved to the concave portion 2 side by the stress of the stress film 5. That is, the solid-state imaging chip 4 is curved along the shape of the upper edge 2a of the concave portion 2. By the curving, an imaging surface 4A at the view-angle region A is formed in a curved surface corresponding to a field curvature which is generated by an imaging lens aberration.

Particularly, in the present embodiment, each view-angle region is curved in a state where a semiconductor wafer including a plurality of solid-state imaging portions corresponding to each chip region is bonded on the supporting substrate 3. Thereafter, the semiconductor wafer is divided into each solid-state imaging chip 4 along with the supporting substrate 3, and the divided configuration is like as a configuration illustrated in FIG. 1.

Here, in the semiconductor wafer, a plurality of pixels, which is constituted by photodiodes used as a photoelectric conversion portion and a plurality of pixel transistors, are arranged. In addition, a multilayer wiring layer, in which wirings in a plurality of layers are disposed on a surface side opposite to a rear surface to which light illuminates, is formed. The stress film 5 is formed on the surface of the multilayer wiring layer side of the semiconductor wafer. The bonding between the semiconductor wafer and the supporting substrate is performed by abutting the stress film 5 and the hard mask 8 (between the silicon nitride films) and for example, by performing a room temperature plasma bonding. After the view-angle region in each solid-state imaging portion is curved, the supporting substrate 3 and the semiconductor wafer are divided for each solid-state imaging chip 4, and the solid-state imaging device 1 of the present embodiment is obtained.

In the solid-state imaging chip, that is, in the state of the semiconductor wafer, after it is bonded to the supporting substrate 3, the solid-state imaging chip may be thinned by grinding or etching of the rear surface of the silicon substrate which is performed through the manufacturing of a general backside-illumination type. Alternatively, a stress film may be formed and a thinned semiconductor wafer may be bonded on the supporting substrate.

Figure 2:
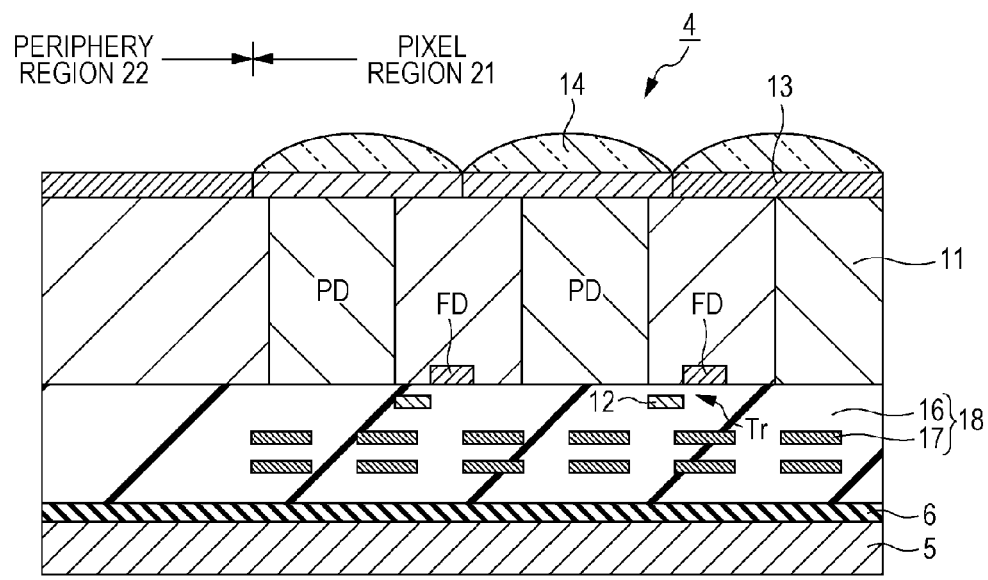
FIG. 2 is a schematic configuration diagram illustrating a main portion of a backside-illumination type CMOS solid-state imaging chip.

FIG. 2 illustrates a schematic configuration (a main portion) of an example of the backside-illumination type solid-state imaging chip 4. In the solid-state imaging chip 4, photodiodes PD used as the photoelectric conversion portion and a plurality of pixels constituted by a plurality of pixel transistors Tr are two-dimensionally arranged on a thinned silicon substrate 11. For example, a plurality of pixel transistors is constituted by three transistors of a transfer transistor, a reset transistor, an amplification transistor, or by four transistors adding a selection transistor to the three transistors. In FIG. 2, a plurality of pixel transistors Tr is represented by the transfer transistor including a floating diffusion FD and a transfer gate electrode 12. A color filter 13 and an on-chip lens 14 are formed on the rear surface side of the silicon substrate 11. A multilayer wiring layer 18, in which wirings 17 in a plurality of layer are disposed, is formed via interlayer insulating film 16 on the front surface side in which light is not incident to the silicon substrate 11. The region in which the on-chip lens 14 is formed is a pixel region 21, and an effective pixel region forming the view-angle region is formed at the inner side of the pixel region. Although not illustrated, a peripheral circuit portion 22 constituted by a logic circuit or the like is formed on the silicon substrate region of the outside of the pixel region 21.

In the present embodiment, the stress film 5, which is constituted by a silicon nitride film including stress, is formed via the silicon oxide film 6 on the multilayer wiring layer 18 of the solid-state imaging chip 4.

Figure 38:
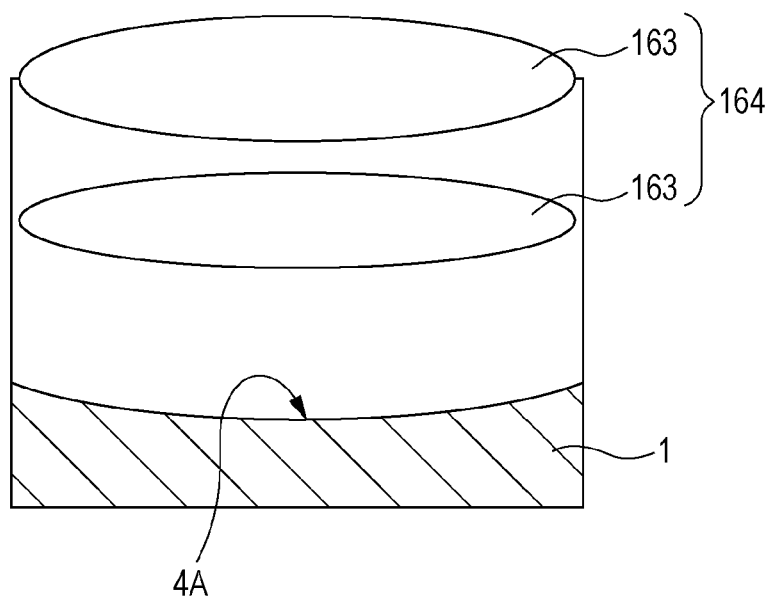
FIG. 38 is a schematic configuration diagram illustrating an imaging lens system when using a solid-state imaging device including a curved imaging surface according to an embodiment of the present disclosure.
Figure 39:
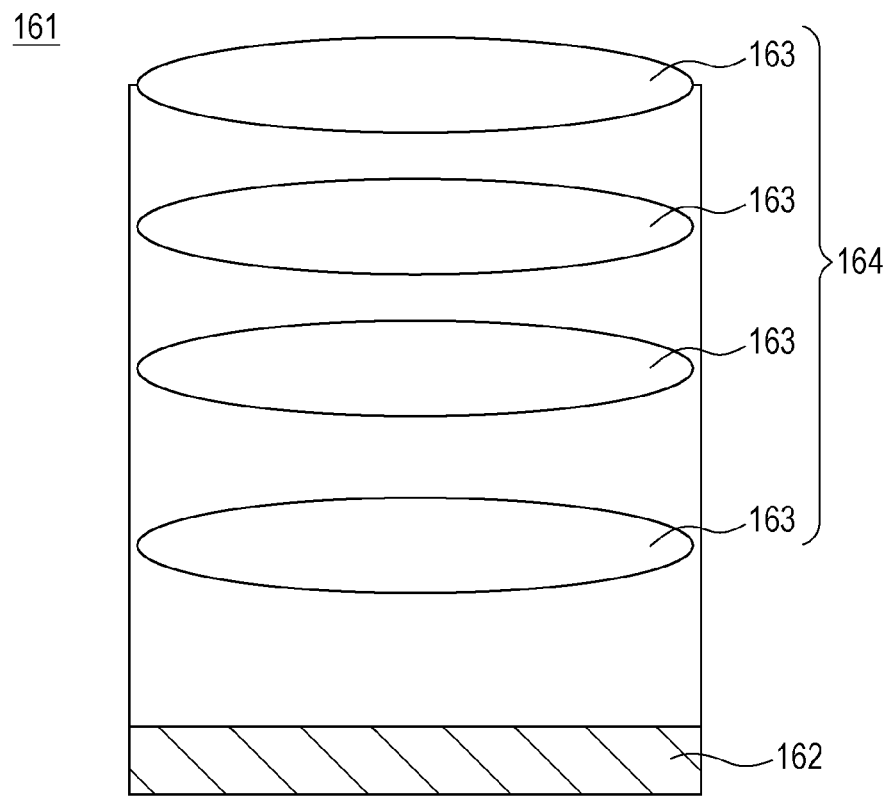
FIG. 39 is a schematic configuration diagram illustrating an imaging lens system when using a solid-state imaging device including a flat imaging surface according to the related art.
Figure 40A:
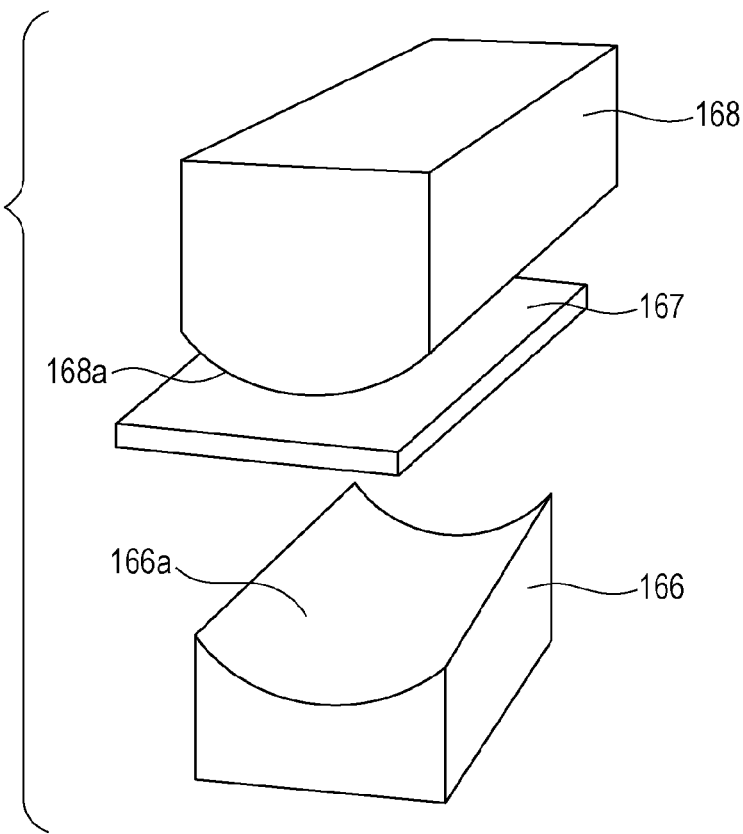
FIGS. 40A and 40B are diagrams illustrating an example of a manufacturing method of a solid-state imaging device including a curved imaging surface of the related art.
Figure 40B:
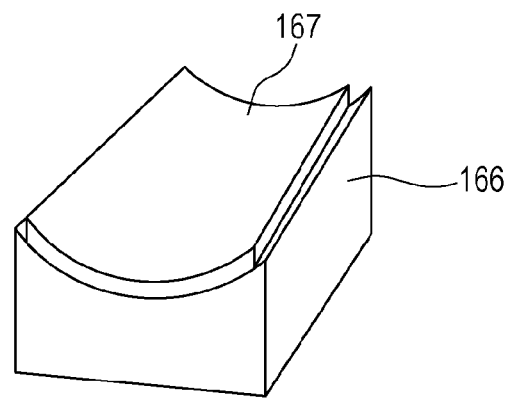
Figure 41:
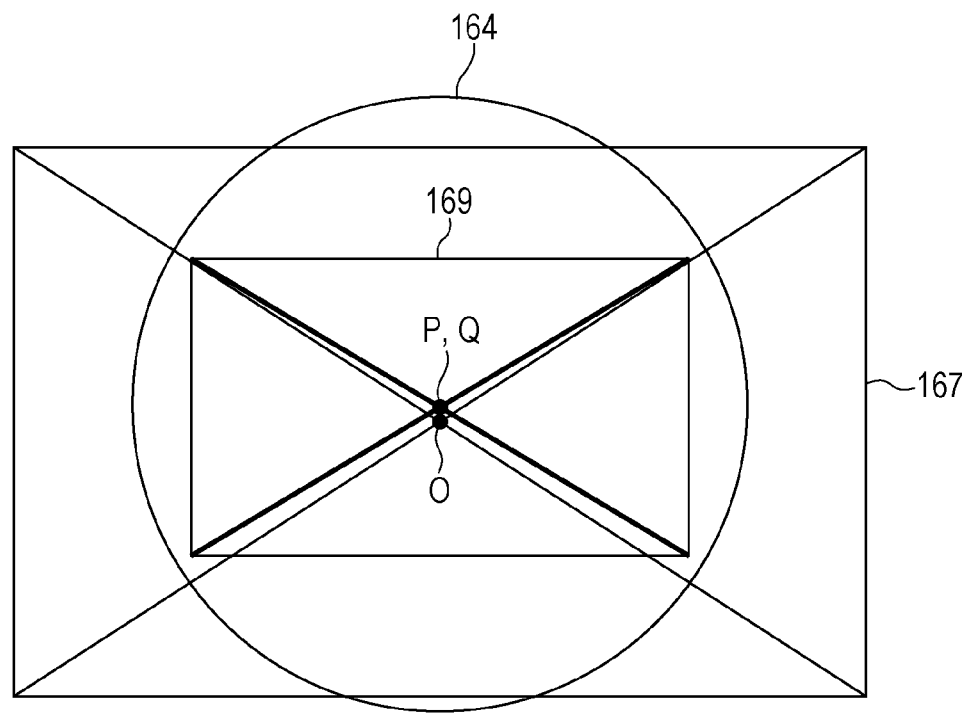
FIG. 41 is explanatory diagram illustrating a relationship between a center of a view-angle region and an optical center of an imaging lens system in the solid-state imaging device obtained by the manufacturing method of FIGS. 40A and 40B.

According to the solid-state imaging device 1 of the first embodiment, the stress film 5 is formed on the surface of the supporting substrate 3 side of the solid-state imaging chip 4, and the view-angle region of the solid-state imaging chip 4 is curved to the concave portion 2 side by using the stress of the stress film 5. Therefore, an imaging surface of a curved surface having a desired curvature is formed. The curved surface having a desired curvature means a curved surface having an imagined curve shape. Since the curved surface corresponds to the field curvature which is generated by the imaging lens aberration, it is possible to suppress the imaging lens aberration at the solid-state imaging chip 4, and the number of lenses 163 of an imaging lens system 164 can be reduced. That is, as illustrated in FIG. 38, in the solid-state imaging device 1 of the present embodiment having the curved imaging surface 4A, the number of the lenses 163 of the imaging lens system 164 is further reduced compared to the number of the lenses of the related art illustrated in FIG. 39. The configuration of FIG. 38 is applied in common to each embodiment below.

Since only the view-angle region is curved, the center of the curved view-angle region and the center of the concave portion 2 can be matched to each other. Moreover, since the semiconductor wafer is bonded on the supporting substrate 3 at the state of the semiconductor wafer, the view-angle region in each solid-state imaging portion of the semiconductor wafer and each concave portion 2 of the supporting substrate 3 can be matched to each other with high accuracy. Since the center of the concave portion 2 and the optical center can be matched to each other with high accuracy, the center of the view-angle region and the optical center of the imaging lens system can be matched to each other with high accuracy. Therefore, an image having a high quality is obtained.

In the present embodiment, an ultra wide-angle imaging can be performed by a lower number of lenses. The volume of the imaging lens module can be about ¼ compared to that of the case where the imaging chip is not curved.

Example of Manufacturing Method of Solid-State Imaging Device

Figure 3A:
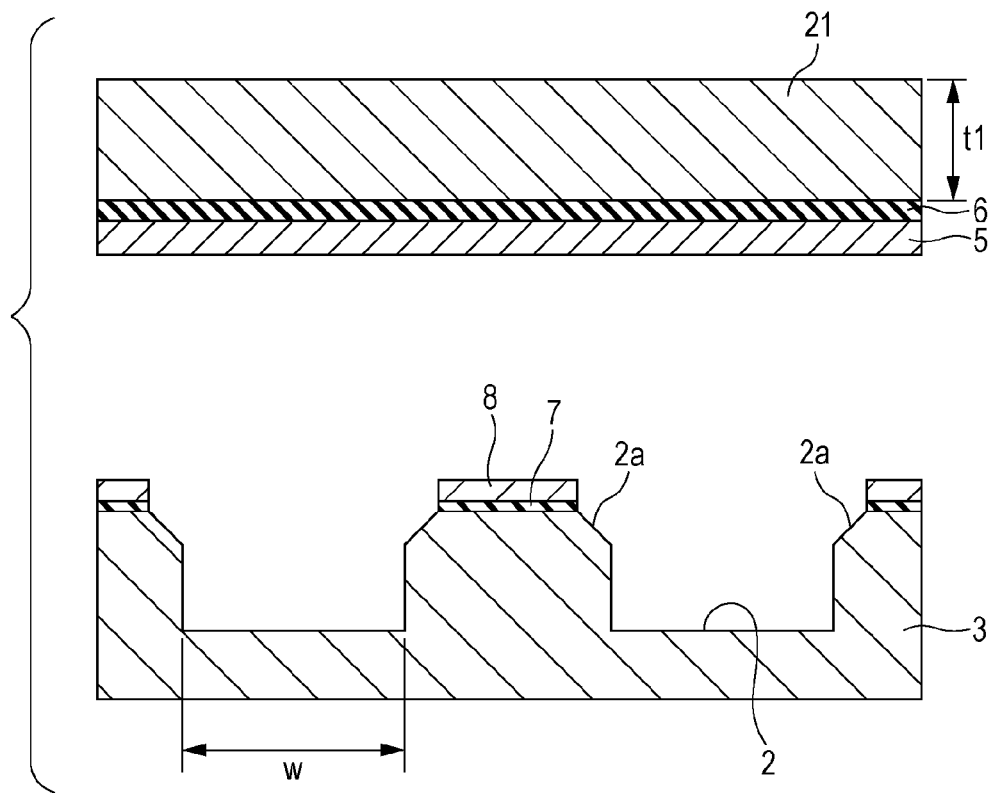
FIGS. 3A and 3B are manufacturing process diagrams (the first) illustrating an example of a manufacturing method of the solid-state imaging device according to the first embodiment.

FIGS. 3A to 4C illustrate an example of the manufacturing method of the solid-state imaging device 1 according to the first embodiment. First, as illustrated in FIG. 3A, the supporting substrate 3 and the semiconductor wafer 21 formed of silicon are prepared. For example, the supporting substrate 3 is formed of a silicon substrate. The concave portion 2 having a width W corresponding to the view-angle region in each solid-state imaging portion of the semiconductor wafer 21 side is formed on the supporting substrate 3. The upper edge 2a of the concave portion 2 is formed so as to be gradually widened in the opening width when going toward the upper side. The formation of the concave portion 2 will be described in FIGS. 5A to 5B below. The plasma silicon nitride film constituting the hard mask 8 is formed via the silicon oxide film 7 on the upper surface of the substrate 3 excluding the concave portion 2.

On the other hand, the pixel region which a plurality of pixels including the photodiodes PD and a plurality of pixel transistors is arranged, the periphery circuit portion, and a plurality of solid-state imaging portions which are constituted by multilayer wiring layers are formed on the surface side of the silicon substrate of the semiconductor wafer 21 in advance. Each solid-state imaging portion corresponds to the solid-state imaging chip which is finally divided. For example, the thickness t1 of the silicon substrate is about 720 μm. The stress film 5 constituted by the plasma silicon nitride film having a stress is formed on the surface side of the semiconductor wafer 21 via the silicon oxide film 6.

Figure 3B:
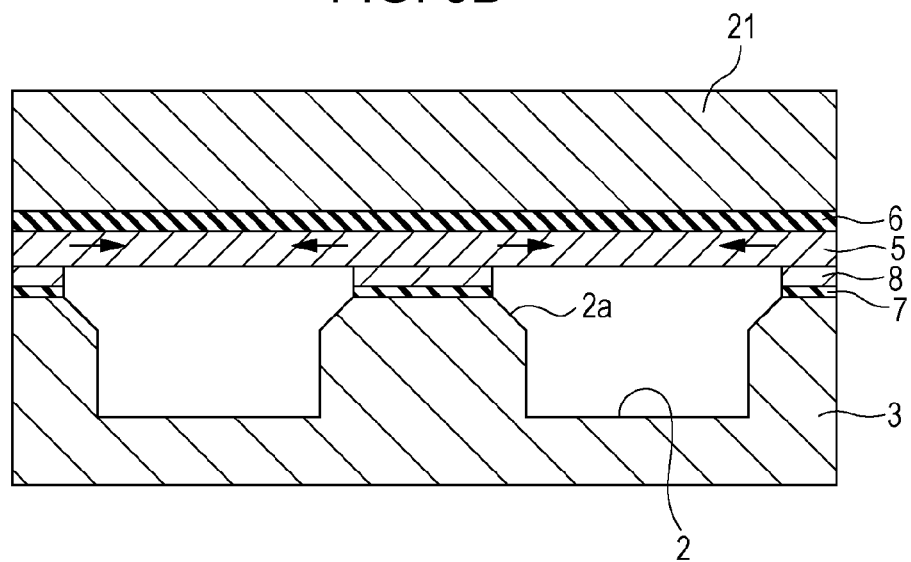

Next, as illustrated in FIG. 3B, the semiconductor wafer 21 is bonded on the supporting substrate 3 in the state where the stress film 5 and the hard mask 8 are abutted so that the rear surface side of the semiconductor wafer 21 is toward the upper side. For example, the bonding between the supporting substrate 3 and the semiconductor wafer 21 is performed by a room temperature plasma bonding method. When the bonding is performed, the supporting substrate 3 and the semiconductor wafer 21 are bonded to each other so that each concave portion 2 of the supporting substrate 3 is sealed by the view-angle region in each solid-state imaging portion of the semiconductor wafer 21 side. At this time, the concave portion 2 and the semiconductor wafer 21 are bonded to be positioned so that the center of the view-angle region of each solid-state imaging portion of the semiconductor wafer 21 and the center of concave portion 2 coincide.

Figure 4A:
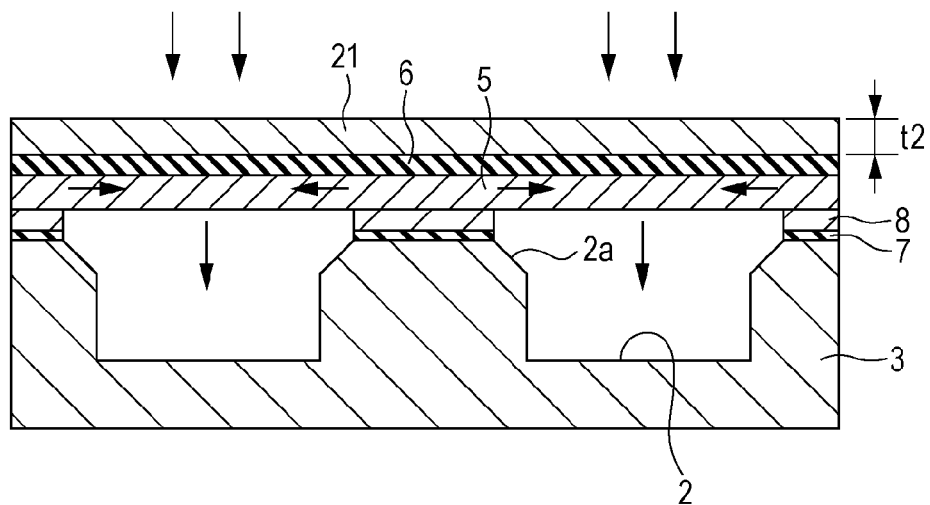
FIGS. 4A to 4C are manufacturing process diagrams (the second) illustrating an example of a manufacturing method of the solid-state imaging device according to the first embodiment.

Next, as illustrated in FIG. 4A, the semiconductor wafer 21 is ground from the rear surface, and thinned by wet etching. For example, the semiconductor wafer 21 is thinned to be a desired thickness t2, and the desired thickness t2 may be about 3 μm.

Figure 4B:
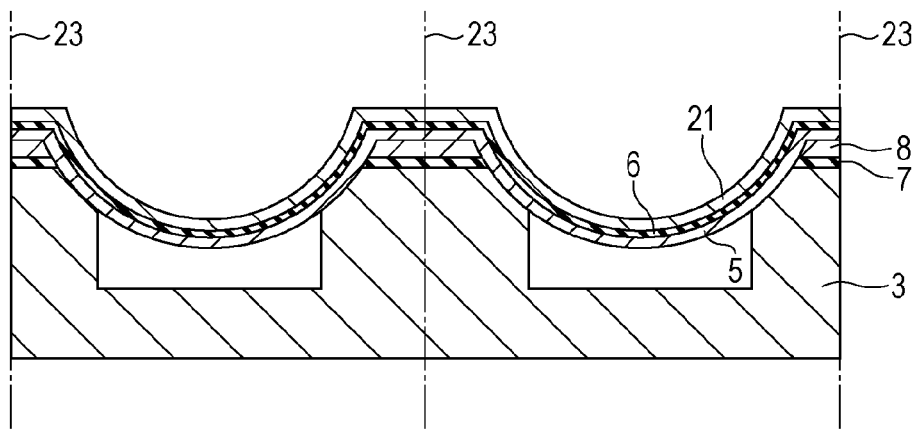

If the thinning of the semiconductor wafer 21 proceeds, as illustrated in FIG. 4B, the view-angle region in each solid-state imaging portion of the semiconductor wafer 21 is curved to the concave portion 2 side by effects of the stress (shrinkage force) of the stress film 5. For example, the curve may be a hemispherical shaped curve. By the curving of the view-angle region, the imaging surface is formed in the curved surface corresponding to the field curvature which is generated by the imaging lens aberration.

Next, although not illustrated, the color filter and the on-chip lens are formed on the rear surface of the semiconductor wafer 21.

Figure 4C:
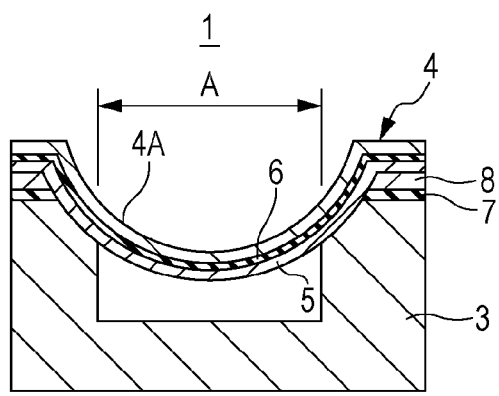

Next, the semiconductor wafer 21 and the supporting substrate 3 are divided along a scribe line which is illustrated as a dashed line 23 in FIG. 4B, and an intended backside-illumination type CMOS solid-state imaging device 1 in which the imaging surface is curved is obtained as illustrated in FIG. 4C.

Figure 5A:
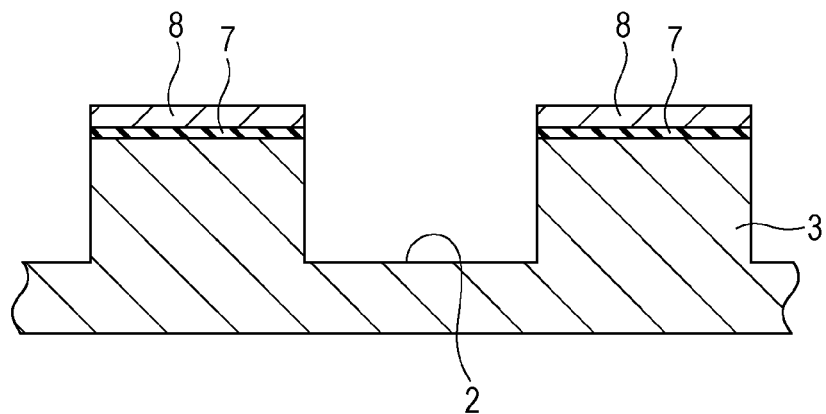
FIGS. 5A to 5C are process diagrams illustrating a method for forming a supporting substrate according to the present disclosure.
Figure 5B:
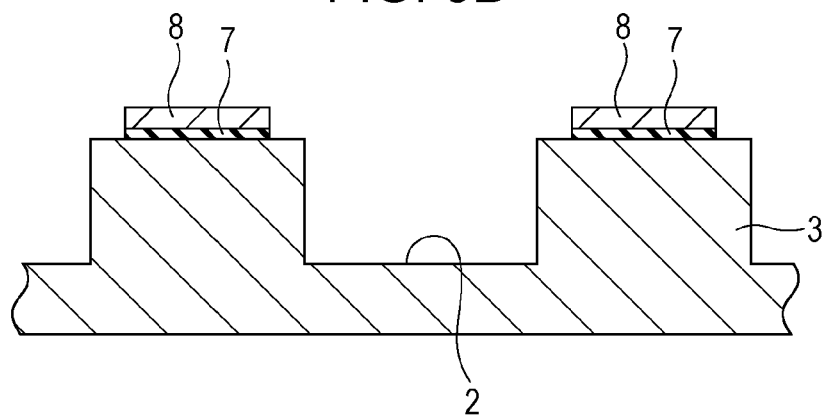
Figure 5C:
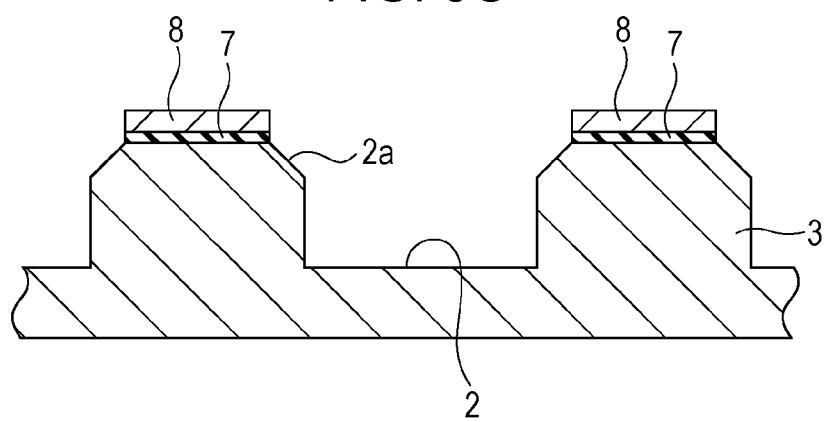

FIGS. 5A to 5C illustrate an example of a method for forming the supporting substrate 3 including the concave portion 2. As illustrated in FIG. 5A, the hard mask 8 is formed by a silicon nitride film on the surface of the silicon supporting substrate 3 via a silicon oxide film 7 in a reticular pattern. In addition, the concave portion 2 is formed by anisotropic etching (for example, dry etching) via the hard mask 8.

Next, as illustrated in FIG. 5B, the hard mask 8 is slightly removed by etching and the width becomes narrow.

Next, as illustrated in FIG. 5C, the supporting substrate 3 is subjected to isotropic etching (for example, dry etching) via the narrowed hard mask 8, and the upper edge 2a of the concave portion 2 is formed so as to be gradually widened in the opening width when going toward the upper side. Thereby, the intended supporting substrate 3 including the concave portion 2 is obtained.

According to the manufacturing method of the solid-state imaging device of the first embodiment, after each view-angle region of each solid-state imaging portion in the state of the semiconductor wafer 21 is bonded on the supporting substrate 3 so as to seal the concave portion 2, the semiconductor wafer 21 is thinned. In addition, by the thinning, the view-angle region of each solid-state imaging portion is curved to the concave portion 2 side through the stress of the stress film 5 formed on the surface of the semiconductor wafer 21. Since the semiconductor wafer 21 is bonded on the supporting substrate 3 as it is, matching of the position between the semiconductor wafer 21 and the supporting substrate 3 can be performed with high accuracy, and therefore, the matching of the position between the view-angle region in each solid-state imaging portion and each concave portion 2 of the supporting substrate 3 can be performed with high accuracy. In addition, since only the view-angle region is curved to the concave portion 2 side by the stress of the stress film 5, the center of the view-angle region and the center of the concave portion can be matched to each other with high accuracy. Moreover, since the semiconductor wafer 21 and the supporting substrate 3 are divided into the solid-state imaging portion constituting the solid-state imaging chip, the solid-state imaging device in which the center of the view-angle region and the optical center of the imaging lens system are matched to each other with high accuracy can be manufactured. Therefore, a plurality of this kind of solid-state imaging devices 1 can be effectively manufactured simultaneously.

Accordingly, the matching accuracy of the center of the view-angle region and the optical center of the imaging lens system is improved, and the solid-state imaging device 1 in which the imaging surface is curved and the lens aberration is suppressed can be manufactured. In addition, the deviation between the center of the view-angle region and the optical center, that is, the optical axis deviation is about 50 μm when the solid-state imaging chip itself is curved by the assembly method of the related art. On the other hand, in the present embodiment, since the semiconductor wafer 21 is curved and bonded on the supporting substrate 3 as it is and only the view-angle region is curved, the optical axis deviation can be 1 μm or less.

Modification

In the above example, after the semiconductor wafer 21 is bonded, the semiconductor wafer 21 is thinned in the process of FIG. 4A. Instead of this, the semiconductor wafer is thinned, and the thinned semiconductor wafer 21 may be bonded on the supporting substrate 3 (becomes the state of FIG. 4A). Due to the fact that the thinned semiconductor wafer 21 is bonded on the supporting substrate 3, the view-angle region is curved by the stress due to the stress film 5. Also by this manufacturing method, the solid-state imaging device 1 of the first embodiment can be manufactured.

2. Second Embodiment

Configuration Example of Solid-State Imaging Device

Figure 6:
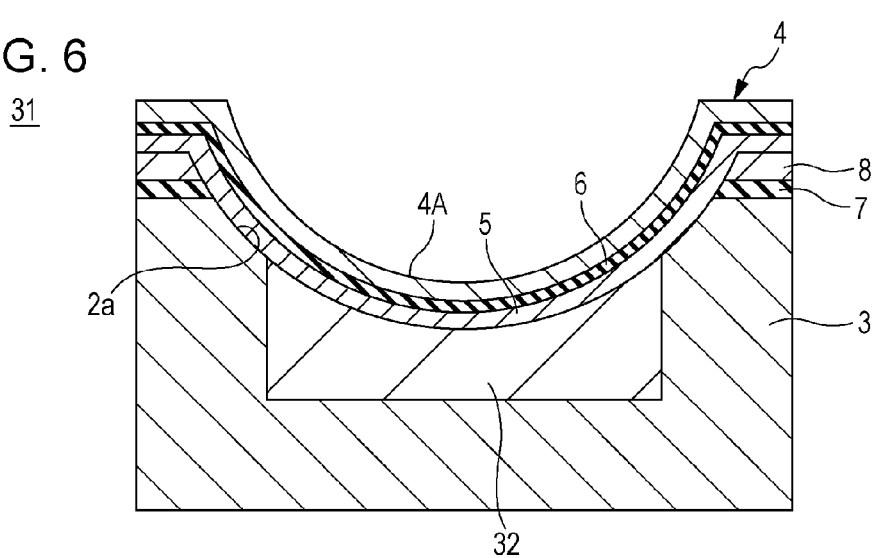
FIG. 6 is a schematic configuration diagram illustrating a second embodiment of a solid-state imaging device according to the present disclosure.

FIG. 6 illustrates a second embodiment of a solid-state imaging device according to the present disclosure. The present embodiment is a case which is applied to the backside-illumination type CMOS solid-state imaging device. The solid-state imaging device 31 according to the second embodiment includes the supporting substrate 3 including the concave portion 2, and the backside-illumination type solid-state imaging chip 4 which is bonded on the supporting substrate 3 so as to seal the concave portion 2 by a view-angle region. The present embodiment further includes the stress film 5 which is formed on the surface of the solid-state imaging chip 4, and an adhesive agent 32 which is filled in the concave portion 2 and has volumetric shrinkage.

The supporting substrate 3 including the concave portion 2 is constituted similarly to that of the above-described first embodiment. In addition, similarly to the first embodiment, the stress film 5 also is formed of a plasma silicon nitride film having a stress on the surface opposite to the light incident surface side of the solid-state imaging chip 4.

For example, as the adhesive agent 32 which is filled in the concave portion, adhesive agent which is volumetrically shrunk by light irradiation such as ultraviolet light or heating is used. The adhesive agent 32 has adhesiveness even without being subjected to the light irradiation or heating. Before the solid-state imaging chip 4 is bonded on the supporting substrate 3, the adhesive agent 32 is filled in the concave portion 2 so as to be flush with the upper surface of the supporting substrate 3.

Similarly to the first embodiment, in the present embodiment, for example, the solid-state imaging chip 4 and the supporting substrate 3 are bonded to each other by a room temperature plasma bonding method, and simultaneously, the solid-state imaging chip 4 is adhered to the adhesive agent 32. In addition, after the solid-state imaging chip 4 is thinned, the adhesive agent 32 is volumetrically shrunk by light irradiation or heating. Therefore, the thinned solid-state imaging chip 4 is curved to the concave portion 2 side by the volumetric shrinkage and the stress of the stress film 5.

Since the other configurations are similar to those of the above-described first embodiment, the corresponding portions are denoted by the same reference numbers and the duplicate description is omitted.

According to the solid-state imaging device 31 of the second embodiment, the entire surface of the view-angle region is evenly pulled by the volumetric shrinkage of the adhesive agent 32 in addition to the stress of the stress film 5. Therefore, the entire view-angle region can be more evenly curved to the hemispherical shape. By controlling the stress of the stress film 5 and the volumetric shrinkage of the adhesive agent 32, the curved surface shape of the view-angle region can be a more desired (imagined) curved shape. Accordingly, the matching accuracy of the center of the view-angle region and the optical center of the imaging lens system is improved, and suppression with respect to the lens aberration can be improved by curving the imaging surface. The imaging lens aberration can be suppressed at the solid-state imaging chip 4 side, and the number of the lenses of the imaging lens system can be reduced. Except for that, effects similar to those described in the first embodiment can be accomplished.

Example of Manufacturing Method of Solid-State Imaging Device

FIGS. 7A to 8B illustrate an example of the manufacturing method of the solid-state imaging device 31 according to the second embodiment. Similarly to FIGS. 3A and 3B described above, the supporting substrate 3 including the concave portion 2 and the semiconductor wafer 21 are prepared. A plurality of the backside-illumination type solid-state imaging portions (corresponding to the solid-state imaging chip), which is constituted by the pixel region which arranges a plurality of pixels, the periphery circuit portion, and the multilayer wiring layers, are formed on the semiconductor wafer 21. The stress film 5 constituted by a plasma silicon nitride film having a stress is formed on the surface side of the semiconductor wafer 32 via a silicon oxide film 6. The hard mask 8 constituted by a plasma silicon nitride film is formed on the surface excluding the concave portion 2 of the supporting substrate 3 via the silicon oxide film 7.

Figure 7A:
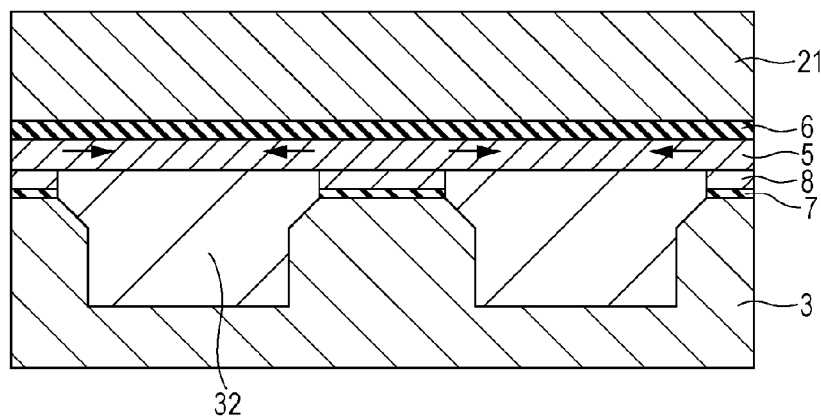
FIGS. 7A and 7B are manufacturing process diagrams (the first) illustrating an example of a manufacturing method of the solid-state imaging device according to the second embodiment.

In the present embodiment, as illustrated in FIG. 7A, the adhesive agent 32 having volumetric shrinkage is filled so that the surface in the concave portion 2 of the supporting substrate 3 is flush with the surface of the supporting substrate 3, and the semiconductor wafer 21 is bonded to the supporting substrate 3. In the bonding, for example, the stress film 5 of the surface side of the semiconductor wafer 21 and the upper surface of the supporting substrate 3 are bonded to each other by a room temperature plasma bonding method, and the semiconductor wafer 21 and the adhesive agent 32 in the concave portion 2 of the supporting substrate 3 are adhered to each other.

When the bonding is performed, each concave portion 2 of the supporting substrate 3 and the semiconductor wafer 21 are bonded to each other so that each concave portion 2 of the supporting substrate 3 is sealed by the view-angle region of each solid-state imaging portion of the semiconductor wafer 21 side. At this time, the center of the view-angle region of each solid-state imaging portion of the semiconductor wafer 21 and the center of the concave portion 2 are positioned and bonded so as to coincide with each other. The adhesive agent 32 is formed as material which is volumetrically shrunk by heat treatment or light irradiation such as ultraviolet light irradiation.

Figure 7B:
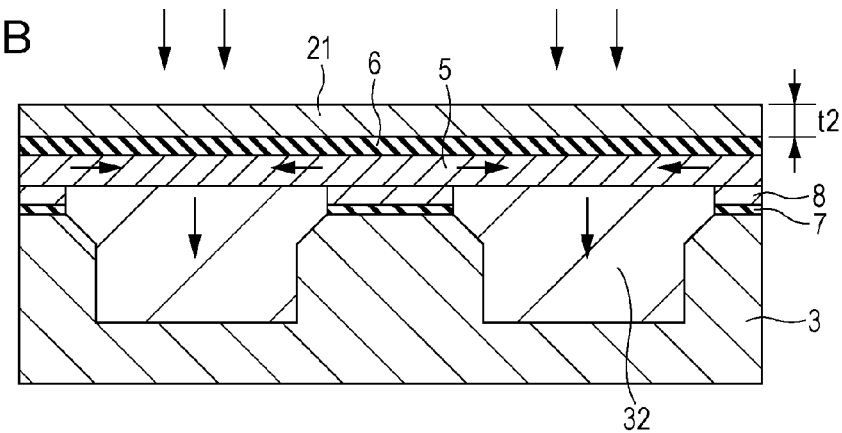

Next, as illustrated in FIG. 7B, the semiconductor wafer 21 is ground from the rear surface and thinned by wet etching. For example, the semiconductor wafer 21 is thinned to be a desired thickness t2, and the desired thickness t2 may be about 3 μm. Subsequently, heat treatment or light irradiation such as ultraviolet light is performed with respect to the adhesive agent 32.

Figure 8A:
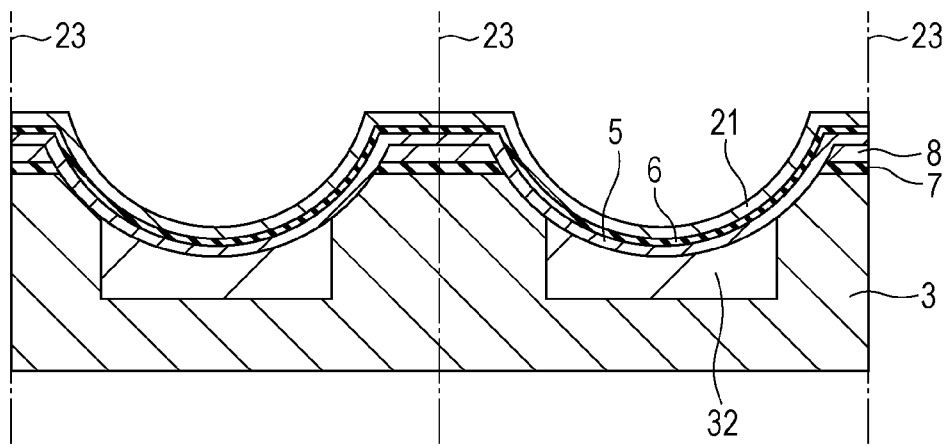
FIGS. 8A and 8B are manufacturing process diagrams (the second) illustrating an example of a manufacturing method of the solid-state imaging device according to the second embodiment.

In the semiconductor wafer 21, through a combination between the effect of the stress of the stress film 5 according to the thinning of the semiconductor wafer 21 and the shrinkage effect of the adhesive agent 32 due to heat treatment or light irradiation, as illustrated in FIG. 8A, the view-angle region in each solid-state imaging portion of the semiconductor wafer 21 is curved to the concave portion 2 side. For example, the curve may be a hemispherical shaped curve. By the curving of the view-angle region, the imaging surface is formed in the curved surface corresponding to the field curvature which is generated by the imaging lens aberration.

Next, although not illustrated, the color filter and the on-chip lens are formed on the rear surface of the semiconductor wafer 21.

Figure 8B:
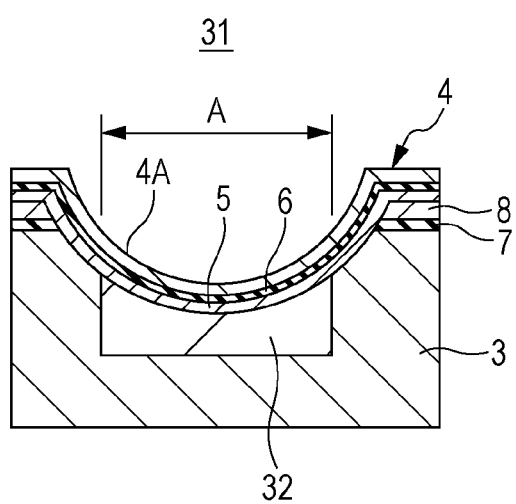

Next, the semiconductor wafer 21 and the supporting substrate 3 are divided along a scribe line which is illustrated as the dashed line 23 in FIG. 8A, and the intended backside-illumination type CMOS solid-state imaging device 31 in which the imaging surface is curved is obtained as illustrated in FIG. 8B.

According to the manufacturing method of the solid-state imaging device of the second embodiment, after the semiconductor wafer 21 is bonded on the supporting substrate 3 as it is, the thinning of the semiconductor wafer 21 and the heat treatment or the light irradiation with respect to the adhesive agent 32 are performed. The stress due to the stress film 5 is applied to the thinned semiconductor wafer 21, and simultaneously, a pulling force due to the adhesive agent 32 which is volumetrically shrunk is applied to the concave portion 2 side. The pulling force due to the adhesive agent 32 is evenly applied to the entire adhered view-angle region. By both effects, the view-angle region of each solid-state imaging portion of the semiconductor wafer 21 can be evenly curved to the concave portion 2 side. By controlling the stress of the stress film 5 and the volumetric shrinkage of the adhesive agent 32 together, the curvature of the view-angle region which is curved can be more appropriately controlled. Therefore, similarly to those described in the first embodiment, the matching accuracy of the center of the view-angle region and the optical center of the imaging lens system is improved, and the solid-state imaging device 31 in which the imaging surface is curved and the lens aberration is suppressed can be manufactured. Except for that, effects similar to those of the first embodiment described above are accomplished.

Modification

In the second embodiment, after the semiconductor wafer 21 is bonded, the semiconductor wafer 21 is thinned during the process of FIG. 7B. Instead of this, the semiconductor wafer is thinned, and the thinned semiconductor wafer 21 may be bonded on the supporting substrate 3 (becomes the state of FIG. 7B). Due to the fact that the thinned semiconductor wafer 21 is bonded on the supporting substrate 3, the view-angle region is curved by the stress due to the stress film 5 and the volumetric shrinkage of the adhesive agent 32. Also by this manufacturing method, the solid-state imaging device 31 of the second embodiment can be manufactured.

3. Third Embodiment

Configuration Example of Solid-State Imaging Device

Figure 9:
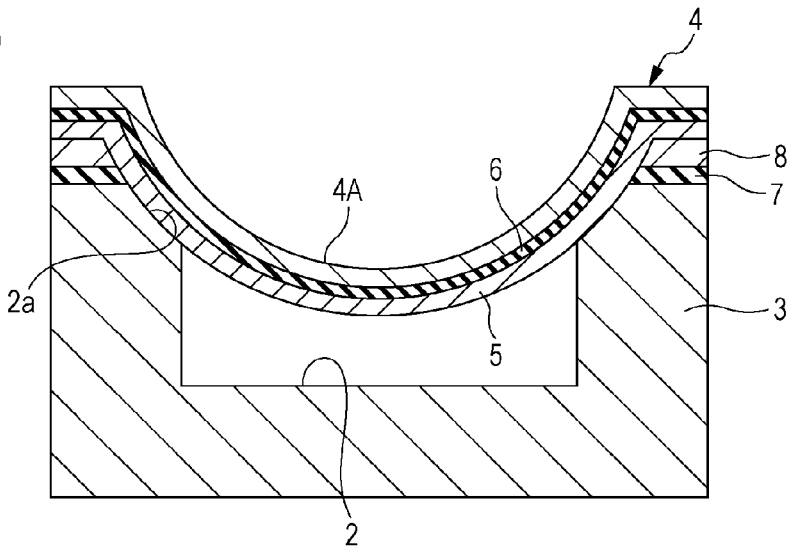
FIG. 9 is a schematic configuration diagram illustrating a third embodiment of a solid-state imaging device according to the present disclosure.

FIG. 9 illustrates a third embodiment of a solid-state imaging device according to the present disclosure. The present embodiment is a case which is applied to the backside-illumination type CMOS solid-state imaging device. The solid-state imaging device 35 according to the third embodiment includes the supporting substrate 3 including the concave portion 2, and the backside-illumination type solid-state imaging chip 4 which is bonded on the supporting substrate 3 so as to airtightly seal the concave portion 2 in a vacuum state by the view-angle region. The present embodiment further includes the stress film 5 which is formed on the surface of the solid-state imaging chip 4, and is constituted so that the inner portion of the concave portion 2 is maintained in a vacuum state.

The supporting substrate 3 including the concave portion 2 is constituted similarly to those of the above-described embodiments and modifications. In addition, similarly to the embodiments and modifications, the stress film 5 also is formed of a plasma silicon nitride film having a stress on the surface opposite to the light incident surface side of the solid-state imaging chip 4.

In the present embodiment, when the solid-state imaging chip 4 is thinned, the thinned solid-state imaging chip 4 is curved to the concave portion 2 side by both effects of the stress of the stress film 5 and differential pressure between the concave portion 2 in a vacuum state and the atmospheric pressure. Since the other configurations are similar to those of the above-described first embodiment, the corresponding portions are denoted by the same reference numbers and the duplicate description is omitted.

According to the solid-state imaging device 35 of the third embodiment, the entire surface of the view-angle region is evenly pulled by the differential pressure between the inner surface and the outer surface of the solid-state imaging chip 4 in addition to the stress of the stress film 5. Therefore, the entire view-angle region can be more evenly curved to the hemispherical shape. By controlling the stress of the stress film 5 and the degree of vacuum of the concave portion 2, the curved shape of the view-angle region can be a more desired (imagined) curved shape. Accordingly, the matching accuracy of the center of the view-angle region and the optical center of the imaging lens system is improved, and suppression with respect to the lens aberration can be improved by curving the imaging surface. The imaging lens aberration can be suppressed at the solid-state imaging chip 4 side, and the number of the lenses of the imaging lens system can be reduced. Except for that, effects similar to those of the first embodiment described above are accomplished.

Example of Manufacturing Method of Solid-State Imaging Device

FIGS. 10A to 11B illustrate an example of the manufacturing method of the solid-state imaging device 35 according to the third embodiment. Similarly to FIGS. 3A and 3B described above, the supporting substrate 3 including the concave portion 2 and the semiconductor wafer 21 are prepared. A plurality of the backside-illumination type solid-state imaging portions (corresponding to the solid-state imaging chip), which is constituted by the pixel region which arranges a plurality of pixels, the periphery circuit portion, and the multilayer wiring layers, are formed on the semiconductor wafer 21. The stress film 5 constituted by a plasma silicon nitride film having a stress is formed on the surface side of the semiconductor wafer 32 via a silicon oxide film 6. The hard mask 8 constituted by a plasma silicon nitride film is formed on the surface excluding the concave portion 2 of the supporting substrate 3 via the silicon oxide film.

Figure 10A:
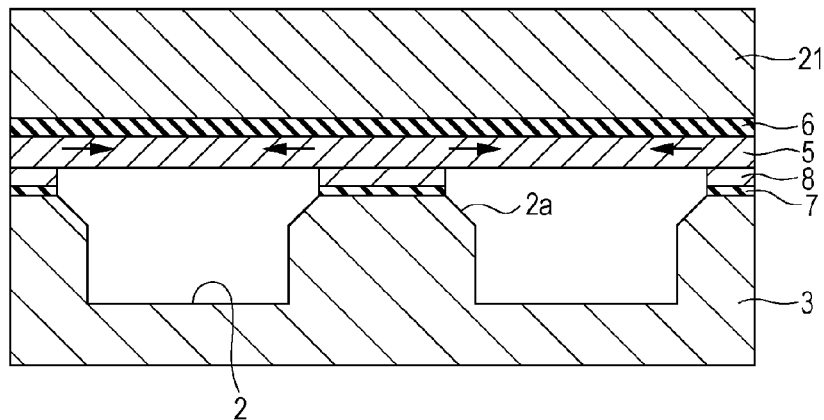
FIGS. 10A and 10B are manufacturing process diagrams (the first) illustrating an example of a manufacturing method of the solid-state imaging device according to the third embodiment.

In the present embodiment, as illustrated in FIG. 10A, first, the semiconductor wafer 21 and the supporting substrate 3 are bonded to each other in a vacuum chamber having a desired degree of vacuum by a vacuum plasma bonding method. When the bonding is performed, the supporting substrate 3 and the semiconductor wafer 21 are bonded to each other so that each concave portion 2 of the supporting substrate 3 is sealed by the view-angle region in each solid-state imaging portion of the semiconductor wafer 21 side. At this time, the concave portion 2 and the semiconductor wafer 21 are bonded to be positioned so that the center of the view-angle region of each solid-state imaging portion of the semiconductor wafer 21 and the center of concave portion 2 coincide. After the bonding, an atmosphere in the chamber returns to atmospheric pressure, and the bonded semiconductor wafer 21 and the supporting substrate 3 are extracted from the chamber to the outside atmospheric pressure atmosphere.

Figure 10B:
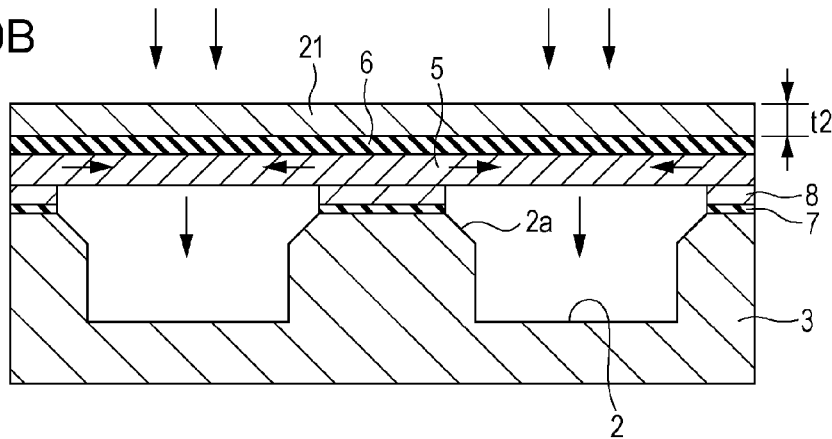

Next, as illustrated in FIG. 10B, the semiconductor wafer 21 is ground from the rear surface, and thinned by wet etching. For example, the semiconductor wafer 21 is thinned to be a desired thickness t2, and the desired thickness t2 may be about 3 μm.

Figure 11A:
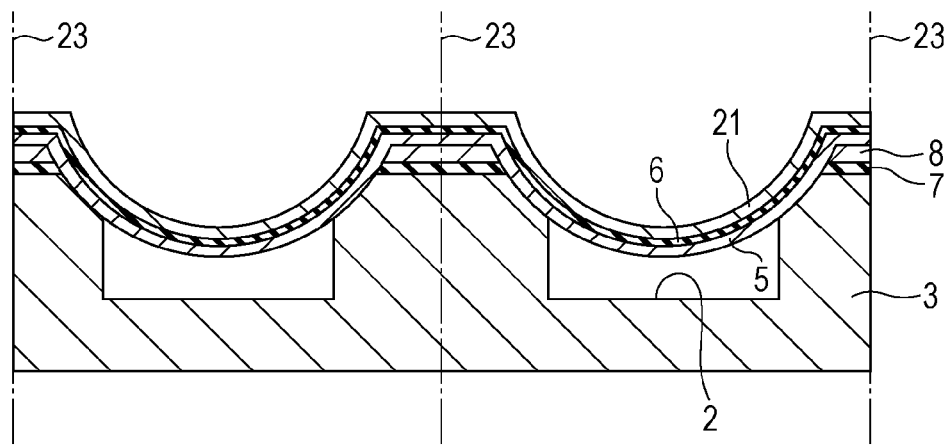
FIGS. 11A and 11B are manufacturing process diagrams (the second) illustrating an example of a manufacturing method of the solid-state imaging device according to the third embodiment.

In the semiconductor wafer 21, through a combination between the effect of the stress of the stress film 5 according to the thinning of the semiconductor wafer 21 and the effect due to the differential pressure between a vacuum and the atmospheric pressure, as illustrated in FIG. 11A, the view-angle region in each solid-state imaging portion of the semiconductor wafer 21 is curved to the concave portion 2 side. For example, the curve may be a spherical shaped curve. By the curving of the view-angle region, the imaging surface is formed in the curved surface corresponding to the field curvature which is generated by the imaging lens aberration.

Next, although not illustrated, the color filter and the on-chip lens are formed on the rear surface of the semiconductor wafer 21.

Figure 11B:
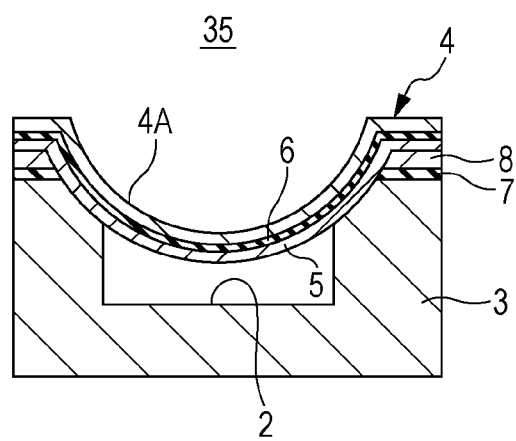

Next, the semiconductor wafer 21 and the supporting substrate 3 are divided along a scribe line which is illustrated as the dashed line 23 in FIG. 11A, and the intended backside-illumination type CMOS solid-state imaging device 35 in which the imaging surface is curved is obtained as illustrated in FIG. 11B.

According to the manufacturing method of the solid-state imaging device of the third embodiment, after the semiconductor wafer 21 and the supporting substrate 3 are bonded in the vacuum chamber, the bonded semiconductor wafer 21 and the supporting substrate 3 are extracted to the state of the atmospheric pressure, and the semiconductor wafer 21 is thinned. According to the thinning of the semiconductor wafer 21, the stress due to the stress film 5 applied to the semiconductor wafer 21, and simultaneously, pulling force due to the differential pressure between a vacuum in the concave portion 2 and the atmospheric pressure of the outer surface side of the semiconductor wafer is applied to the concave portion 2 side. The pulling force due to the differential pressure is applied evenly to the entire view-angle region. By both effects, the view-angle region of each solid-state imaging portion of the semiconductor wafer 21 can be evenly curved to the concave portion 2 side. By controlling the stress of the stress film 5 and the degree of vacuum in the concave portion 2 together, the curvature of the view-angle region which is curved can be more appropriately controlled. Therefore, similarly to those described in the first embodiment, the matching accuracy of the center of the view-angle region and the optical center of the imaging lens system is improved, and the solid-state imaging device 35 in which the imaging surface is curved and the lens aberration is suppressed can be manufactured. Except for that, effects similar to those of the first embodiment described above are accomplished.

Modification

In the third embodiment, after the semiconductor wafer 21 is bonded, the semiconductor wafer 21 is thinned during the process of FIG. 10B. Instead of this, the semiconductor wafer 21 may be thinned, and the thinned semiconductor wafer 21 may be bonded on the supporting substrate 3 (becoming the state of FIG. 10B) in the vacuum chamber. After the semiconductor wafer 21 is bonded on the supporting substrate 3, due to the fact that the semiconductor wafer 21 and the supporting substrate 3 are extracted to the state of the atmospheric pressure, the view-angle region is curved by the pressure due to the stress film 5 and the differential pressure. Also by this manufacturing method, the solid-state imaging device 35 of the third embodiment can be manufactured.

4. Fourth Embodiment

Configuration Example and Example of Manufacturing Method of Solid-State Imaging Device FIGS. 12 to 15 illustrate a fourth embodiment of a solid-state imaging device according to the present disclosure. The present embodiment is applied to the case which controls the curve shape of the view-angle region in the first to the third embodiments described above.

Figure 12:
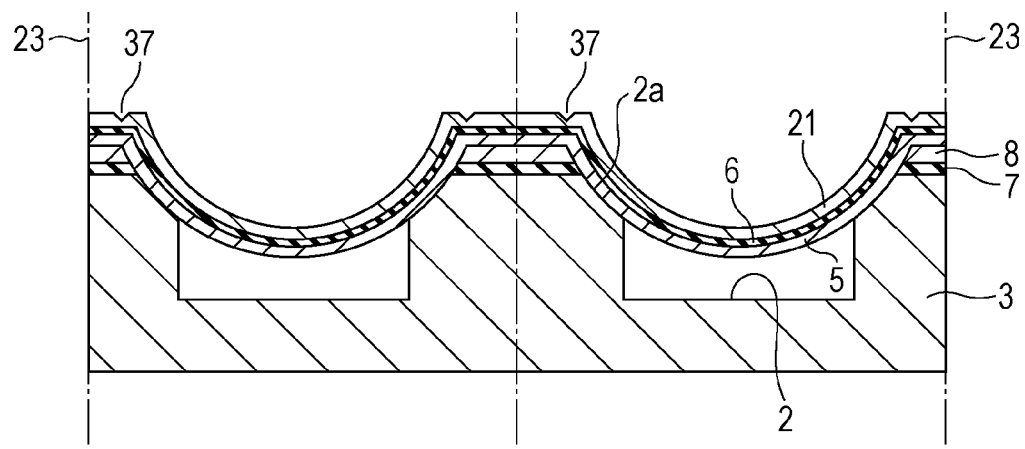
FIG. 12 is a schematic configuration diagram illustrating a first example of a fourth embodiment according to the present disclosure.

FIG. 12 illustrates the first example of the present embodiment. In the first example, notches 37 are formed at the outside of the view-angle region of each solid-state imaging portion of the semiconductor wafer 21. The notches 37 are formed at places where stress is concentrated when the view-angle region is curved. According to a degree of the stress concentration, the notches 37 can be formed at the middle of the thickness of the semiconductor wafer 21 or over the entire thickness thereof. In the first example, since the notches are formed at the places where stress is concentrated when the semiconductor wafer 21 is curved, the view-angle region can be easily curved when being curved, and the imagined curved shape can be achieved. After the semiconductor wafer 21 is curved, the semiconductor wafer 21 and the supporting substrate 3 are divided along a scribe line which is illustrated as the dashed line 23 in FIGS. 11A and 12, and the intended solid-state imaging device is constituted.

Figure 13:
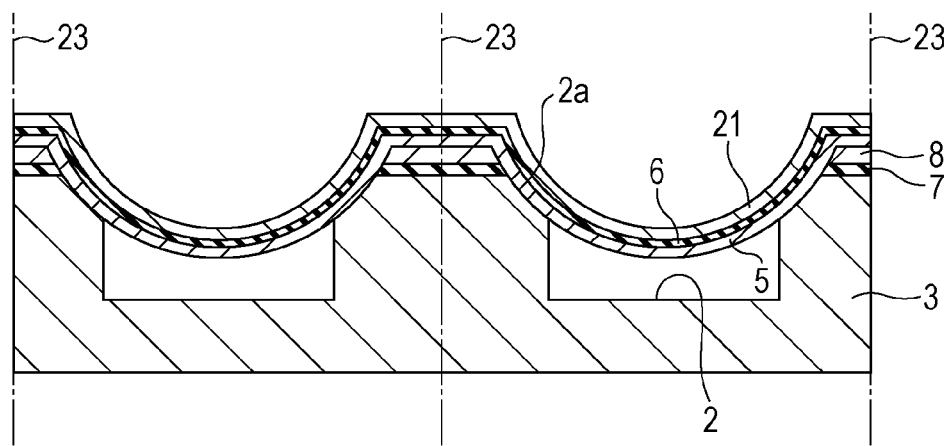
FIG. 13 is a schematic configuration diagram illustrating a second example of a fourth embodiment according to the present disclosure.

FIG. 13 illustrates the second example of the present embodiment. In the second example, the shape of the concave portion 2 side of the supporting substrate 3 is formed so as to conform to an imagined curve shape. That is, the example of FIG. 13 is formed to a shape of a radius (R) having a curvature in which the upper edge 2a of the concave portion 2 conforms to the imagined curve shape. In the second example, due to the fact that the shape of the upper edge 2a of the concave portion 2 is formed so as to conform to the curvature of the imagined curve shape, the view-angle region when curving the semiconductor wafer 21 is curved according to the curved surface of the upper edge 2a of the concave portion 2, and the imagined curve shape can be achieved. After the curving, the semiconductor wafer 21 and the supporting substrate 3 are divided along a scribe line which is illustrated as the dashed line 23 in FIG. 13, and the intended solid-state imaging device is constituted.

Figure 14A:
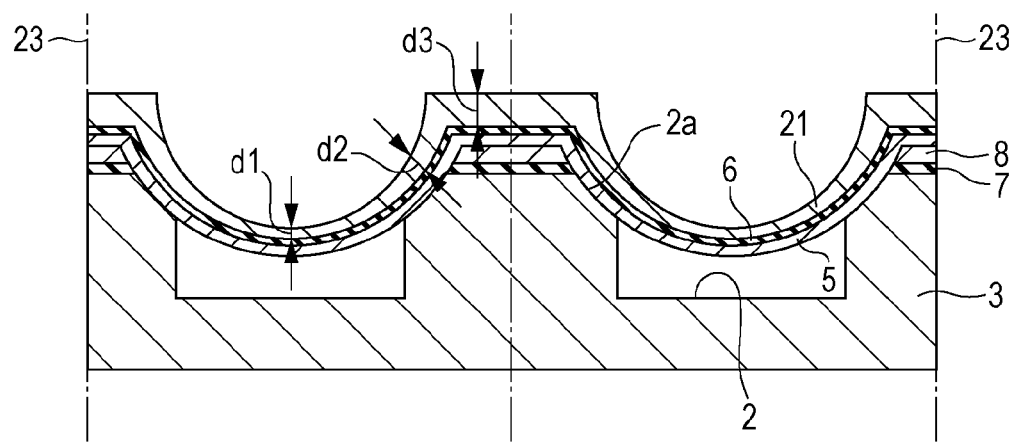
FIGS. 14A and 14B are schematic configuration diagrams illustrating a third example of a fourth embodiment according to the present disclosure.
Figure 14B:
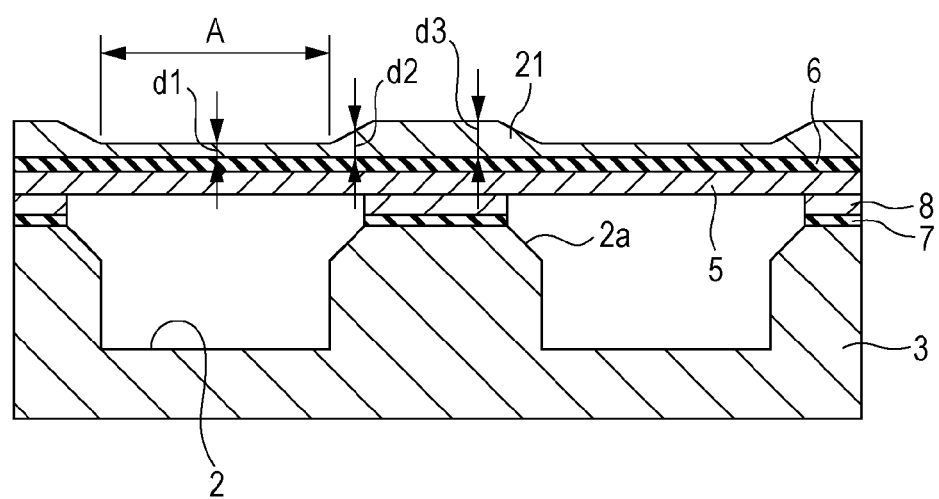

FIGS. 14A and 14B illustrate the third example. In the third example, in each solid-state imaging portion of the thinned semiconductor wafer 21, thickness of the film is controlled and constituted so as to control the curve shape. The thickness of the film of the solid-state imaging portion is varied in stages or continuously. Alternatively, the thickness of the film of the solid-state imaging portion may be constant over the entire as described above. In the example of FIG. 14A, the view-angle region A has the thinnest and even film thickness d1, the film thickness d2 is thickened in stages or continuously when going toward the periphery of the view-angle region A, and the most thickened film thickness d3 becomes a region which corresponds to the supporting substrate 3 of the periphery of the concave portion 2. In the third example, due to the fact that the film thickness of the semiconductor wafer 21 is varied, as illustrated in FIG. 14B, the semiconductor wafer 21 can be curved while having an imagined curve shape when the semiconductor wafer 21 is curved. After the semiconductor wafer 21 is curved, the semiconductor wafer 21 and the supporting substrate 3 are divided along a scribe line which is illustrated as the dashed line 23 in FIG. 13, and the intended solid-state imaging device is constituted.

Figure 15:
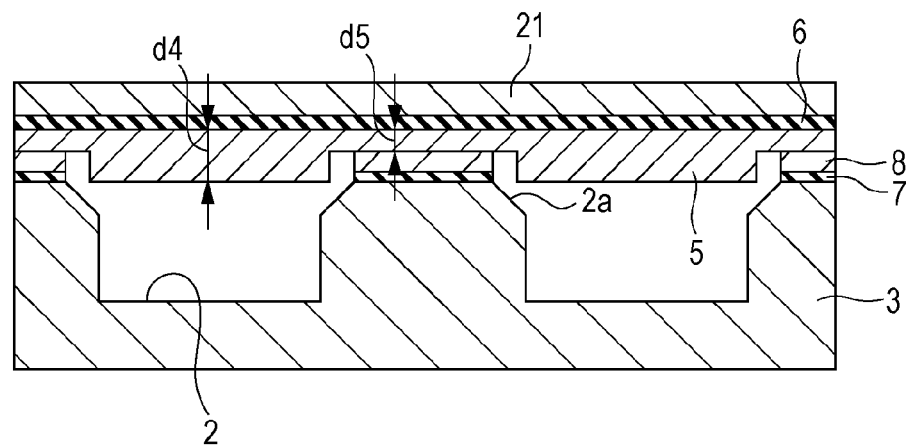
FIG. 15 is a schematic configuration diagram illustrating a fourth example of a fourth embodiment according to the present disclosure.

FIG. 15 illustrates the fourth example. In the fourth example, the film thickness of the stress film 5, which is formed on the surface side of the semiconductor wafer 21 and has a stress, is constituted so as to be varied according to the places. That is, the film thickness d4 of the stress film 5 in the portion corresponding to the view-angle region of the solid-state imaging portion is thicker than the film thickness d5 of the stress film 5 of the other portions, and the stress of the stress film 5 at the view-angle region is great.

In the fourth example, after the semiconductor wafer 21 of FIG. 15 is thinned, the view-angle region is curved by the stress of the stress film 5. However, since the film thickness d4 of the stress film 5 at the view-angle region is thicker than the other portion, the semiconductor wafer 21 is easily curved and can be curved to the imagined curve shape. After the semiconductor wafer 21 is curved, similarly to those described above, the semiconductor wafer 21 and the supporting substrate 3 are divided along the scribe and the intended solid-state imaging device is constituted.

The first to fourth examples of the fourth embodiment illustrated in FIGS. 12 to 15 are applied to the solid-state imaging device described in the first embodiment. Except for that, if the adhesive agent which is volumetrically shrunk by heat treatment or light irradiation is filled in the concave portion 2 of the supporting substrate 3, the first to fourth examples can be applied to the solid-state imaging device which is described in the second embodiment. In addition, if the concave portion 2 of the supporting substrate 3 is a vacuum state, the first to fourth examples can be applied to the solid-state imaging device described in the third embodiment.

5. Fifth Embodiment

Example of Solid-State Imaging Device

Figure 16:
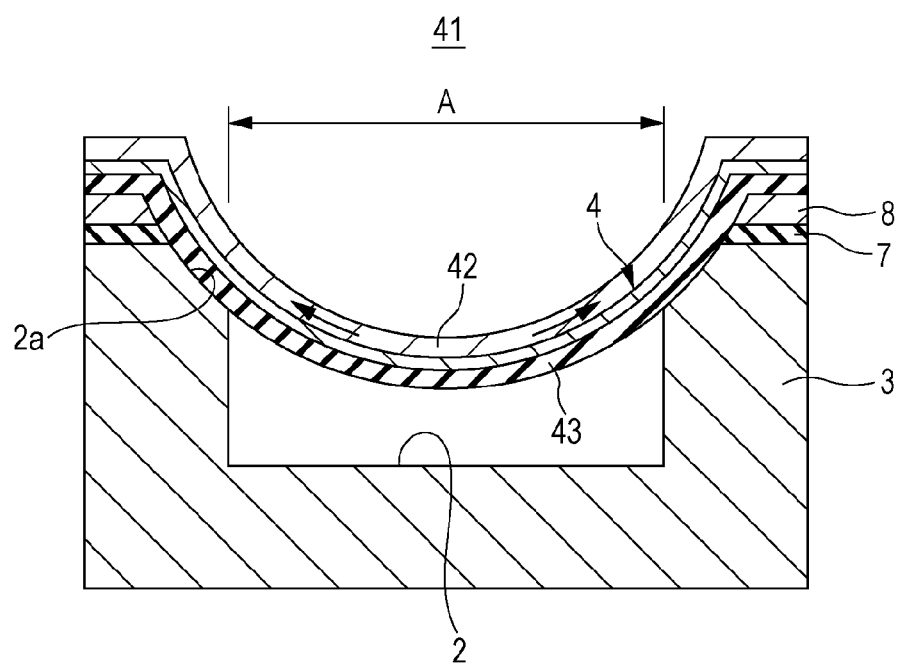
FIG. 16 is a schematic configuration diagram illustrating a fifth embodiment of a solid-state imaging device according to the present disclosure.

FIG. 16 illustrates a fifth embodiment of a solid-state imaging device according to the present disclosure. The present embodiment is a case which is applied to the backside-illumination type CMOS solid-state imaging device. The solid-state imaging device 41 according to the fifth embodiment includes the supporting substrate 3 including the concave portion 2, and the backside-illumination type solid-state imaging chip 4 which is bonded on the supporting substrate 3 so as to seal the concave portion 2 by the view-angle region. In addition, a stress film 42 having a stress is formed on the surface of the light incident side of the solid-state imaging chip 4. As the stress film 42 having the stress, a plasma silicon nitride film or a plasma silicon oxide film can be used. An insulating film 43 which does not substantially influence the solid-state imaging chip 4 is formed on the surface opposite to the light incident side of the solid-state imaging chip 4.

In the present embodiment, similarly to those described above, for example, the solid-state imaging chip 4 and the supporting substrate 3 are bonded to each other by a room temperature plasma bonding method. In addition, after the solid-state imaging chip 4 is thinned, the stress film 42 having the stress is formed on the surface of the light incident side of the solid-state imaging chip 4. The view-angle region of the thinned solid-state imaging chip 4 is curved to the concave portion 2 side by the stress of the stress film 42. The color filter and the on-chip lens may be formed on the stress film 42, or the stress film 42 may be formed on the surface including the on-chip lens after the color filter and the on-chip lens are formed on the thinned solid-state imaging chip.

Similarly to those described above, also in the present embodiment, each view-angle region is curved in a state where the semiconductor wafer including a plurality of solid-state imaging portions corresponding to each chip region is bonded on the supporting substrate 3. Thereafter, the semiconductor wafer and the supporting substrate 3 are divided into each solid-state imaging chip 4, and the divided configuration becomes a configuration illustrated in FIG. 16.

Since the other configurations are similar to those of the above-described first embodiment, the corresponding portions are denoted by the same reference numbers and the duplicate description is omitted.

According to the solid-state imaging device 41 of the fifth embodiment, the stress film 42 is formed on the surface of the light incident side of the solid-state imaging chip 4, the view-angle region of the solid-state imaging chip 4 is curved to the concave portion 2 side by using the stress of the stress film 42, and the imaging surface of the curved surface is formed. In the present embodiment, the semiconductor wafer 21 is bonded on the supporting substrate as it is, and only the view-angle region is curved. Accordingly, matching accuracy between a center of a view-angle region and an optical center of an imaging lens system is improved, and the lens aberration can be suppressed by curving the imaging surface. The imaging lens aberration can be suppressed at the solid-state imaging chip 4 side, and the number of the lenses of the imaging lens system can be reduced. Except for that, effects similar to those described in the first embodiment can be accomplished.

Example of Manufacturing Method of Solid-State Imaging Device

Figure 17A:
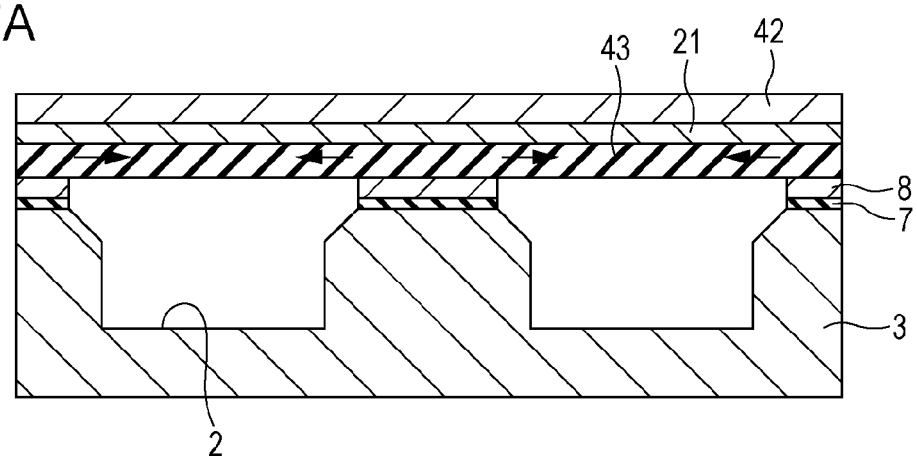
FIGS. 17A and 17B are manufacturing process diagrams illustrating an example of a manufacturing method of the solid-state imaging device according to the fifth embodiment.
Figure 17B:
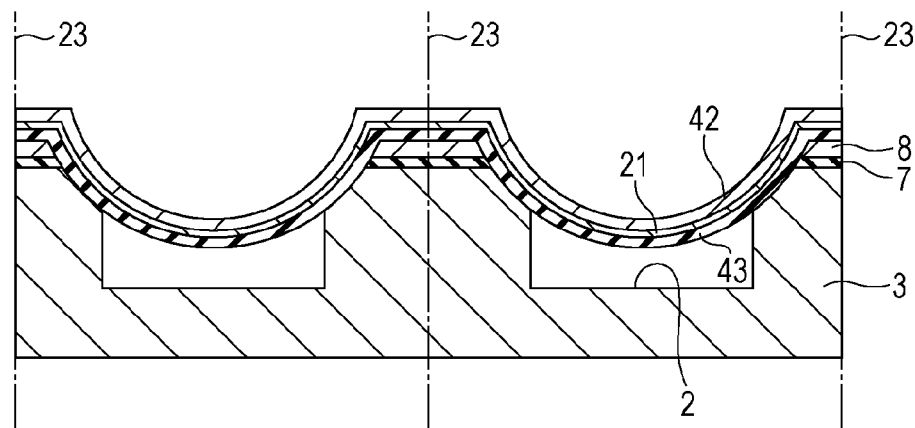

FIGS. 17A and 17B illustrate an example of the manufacturing method of the solid-state imaging device 41 according to the fifth embodiment. Also in the present embodiment, the supporting substrate 3 including the concave portion 2 and the semiconductor wafer 21 are prepared. A plurality of the backside-illumination type solid-state imaging portions (corresponding to the solid-state imaging chip), which is constituted by the pixel region which arranges a plurality of pixels, the periphery circuit portion, and the multilayer wiring layers, are formed on the semiconductor wafer 21. The insulating film 43 is formed on the surface side of the semiconductor wafer 32. For example, the hard mask 8 constituted by a plasma silicon nitride film is formed on the surface excluding the concave portion 2 of the supporting substrate 3 via the silicon oxide film 7.

As illustrated in FIG. 17A, in the present embodiment, the semiconductor wafer 21 and the supporting substrate 3 are bonded to each other. When the bonding is performed, similarly to those described above, for example, each concave portion 2 of the supporting substrate 3 and the semiconductor wafer 21 are bonded to each other by a room temperature plasma bonding method so that each concave portion 2 of the supporting substrate 3 is sealed by the view-angle region of each solid-state imaging portion of the semiconductor wafer 21 side. Subsequently, the semiconductor wafer 21 is thinned. The stress film 42 having a stress is formed on the surface (a so-called rear surface) of the light incident side of the thinned semiconductor wafer 21. As the stress film 42, for example, a plasma silicon nitride film or a plasma silicon oxide film and the like can be used.

The view-angle region of each solid-state imaging portion of the thinned semiconductor wafer 21 is curved to the concave portion 2 side by the stress of the stress film 42. For example, the curve may be a spherical shaped curve. By the curving of the view-angle region, the imaging surface is formed in the curved surface corresponding to the field curvature which is generated by the imaging lens aberration.

Next, the color filter and the on-chip lens are formed on the stress film 42. Next, the semiconductor wafer 21 and the supporting substrate 3 are divided along the scribe line which is illustrated as the dashed line 23 in FIG. 17B, and the intended backside-illumination type CMOS solid-state imaging device 41 in which the imaging surface is curved is obtained as illustrated in FIG. 16.

In addition, the stress film 42 may be formed on the entire surface including on the on-chip lens after the on-chip lens is formed.

According to the manufacturing method of the solid-state imaging device 41 of the fifth embodiment, due to the fact that the stress film 42 having a stress is formed on the surface of the thinned semiconductor wafer 21, the view-angle region of each solid-state imaging portion is curved to the concave portion 2 side, and the imaging surface having the imagined curve shape is formed. Therefore, similarly to those described in the first embodiment, the matching accuracy of the center of the view-angle region and the optical center of the imaging lens system is improved, and the solid-state imaging device 31 in which the imaging surface is curved and the lens aberration is suppressed can be manufactured. Except for that, effects similar to those of the first embodiment described above are accomplished.

6. Sixth Embodiment

Configuration Example of Solid-State Imaging Device

Figure 18:
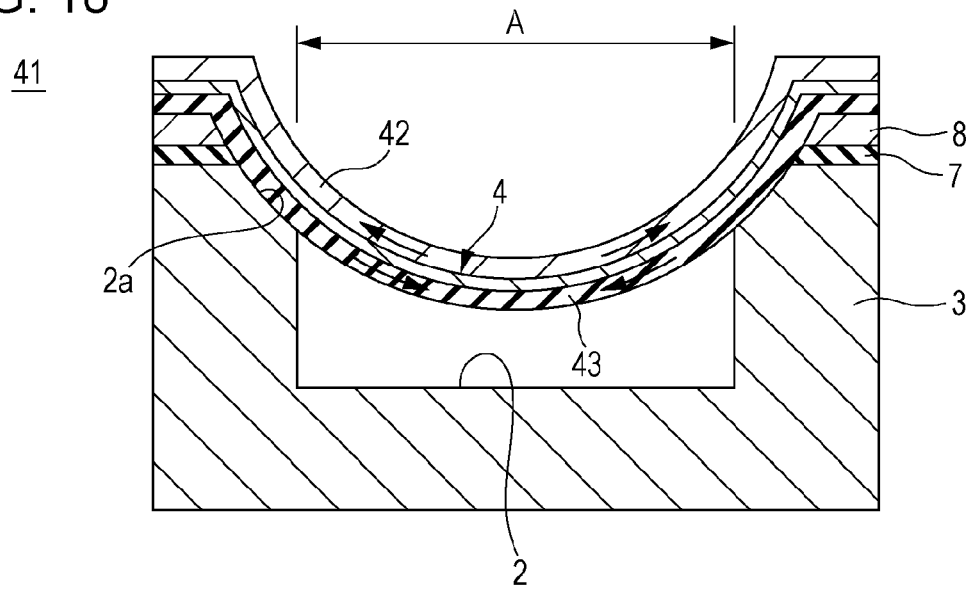
FIG. 18 is a schematic configuration diagram illustrating a sixth embodiment of a solid-state imaging device according to the present disclosure.

FIG. 18 illustrates a sixth embodiment of a solid-state imaging device of the present disclosure. The present embodiment is a case which is applied to the backside-illumination type CMOS solid-state imaging device. The solid-state imaging device 44 according to the sixth embodiment includes the supporting substrate 3 including the concave portion 2, and the backside-illumination type solid-state imaging chip 4 which is bonded on the supporting substrate 3 so as to seal the concave portion 2 by the view-angle region. In addition, the stress film 5 having a stress is formed at the surface of the side opposite to the light incident side of the solid-state imaging chip 4, and the stress film 42 having a tensile stress is formed on the surface of the light incident side.

In the present embodiment, similarly to those described above, for example, the solid-state imaging chip 4 and the supporting substrate 3 are bonded to each other by a room temperature plasma bonding method in the state where the stress film 5 having a stress is formed on the solid-state imaging chip 4. In addition, after the solid-state imaging chip 4 is thinned, the stress film 42 having the stress is formed on the surface of the light incident side of the solid-state imaging chip 4. The view-angle region of the thinned solid-state imaging chip 4 is curved to the concave portion 2 side by the stress of the stress film 5 and the stress of the stress film 42. The color filter and the on-chip lens may be formed on the stress film 42, or the stress film 42 may be formed on the surface including the on-chip lens after the color filter and the on-chip lens are formed on the thinned solid-state imaging chip.

Similarly to those described above, also in the present embodiment, the view-angle region is curved in a state where the semiconductor wafer including a plurality of solid-state imaging portions corresponding to each chip region is bonded on the supporting substrate 3. Thereafter, the semiconductor wafer and the supporting substrate 3 are divided into each solid-state imaging chip 4, and the divided configuration becomes a configuration illustrated in FIG. 18.

Since the other configurations are similar to those of the above-described first embodiment, the corresponding portions are denoted by the same reference numbers and the duplicate description is omitted.

According to the solid-state imaging device 44 of the sixth embodiment, the stress films 5 and 42 having the reverse-side stress to each other are formed on the both surfaces of the solid-state imaging chip 4, the view-angle region is curved to the concave portion 2 side by using the stress of the stress film 5 and the stress of the stress film 42, and the imaging surface of the curved surface is formed. By controlling the stress and the stress respectively, a more desired (imagined) curved shape is obtained. In the present embodiment, the semiconductor wafer is bonded on the supporting substrate as it is, and only the view-angle region is curved. Accordingly, matching accuracy between a center of a view-angle region and an optical center of an imaging lens system is improved, and the lens aberration can be suppressed by curving the imaging surface. The imaging lens aberration can be suppressed at the solid-state imaging chip 4 side, and the number of the lenses of the imaging lens system can be reduced. Except for that, effects similar to those described in the first embodiment can be accomplished.

Example of Manufacturing Method of Solid-State Imaging Device

Figure 19A:
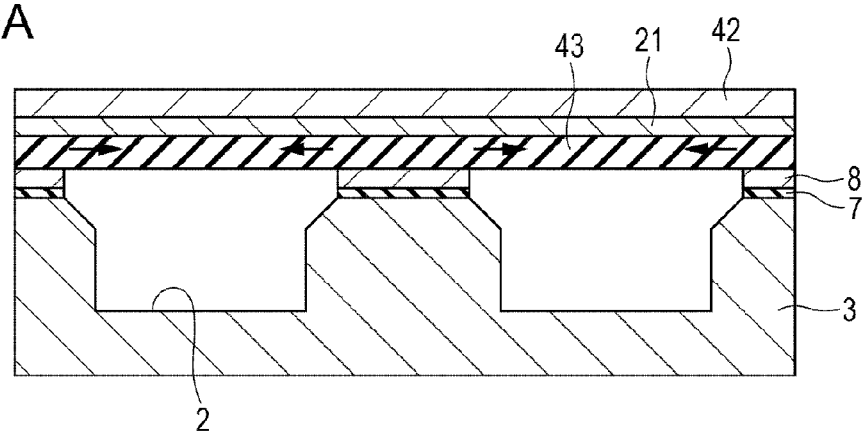
FIGS. 19A and 19B are manufacturing process diagrams illustrating an example of a manufacturing method of the solid-state imaging device according to the sixth embodiment.
Figure 19B:
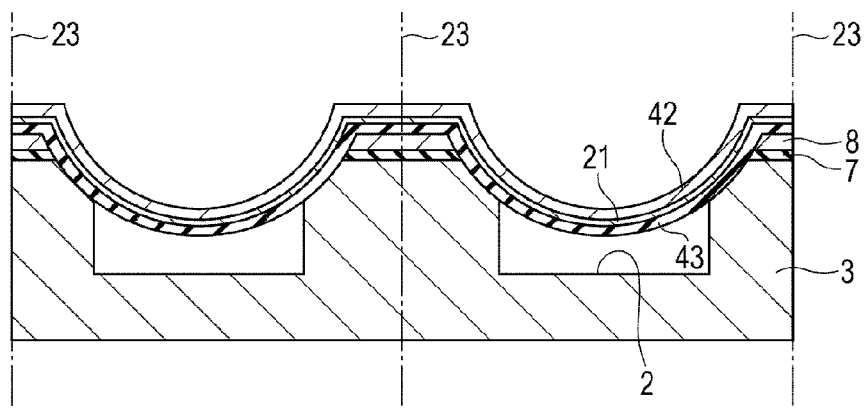

FIGS. 19A and 19B illustrate an example of the manufacturing method of the solid-state imaging device 44 according to the sixth embodiment. Also in the present embodiment, the supporting substrate 3 including the concave portion 2 and the semiconductor wafer 21 are prepared. A plurality of the backside-illumination type solid-state imaging portions (corresponding to the solid-state imaging chip), which is constituted by the pixel region which arranges a plurality of pixels, the periphery circuit portion, and the multilayer wiring layers, are formed on the semiconductor wafer 21. The stress film 5 having the stress is formed on the surface side opposite to the light incident side of the semiconductor wafer 32. Here, a plasma silicon nitride film constituting the stress film 5 is formed via the silicon oxide film 6. For example, the hard mask 8 constituted by a plasma silicon nitride film is formed on the surface excluding the concave portion 2 of the supporting substrate 3 via the silicon oxide film 7.

As illustrated in FIG. 19A, in the present embodiment, the semiconductor wafer 21 and the supporting substrate 3 are bonded so that the stress film 5 and the hard mask 8 contact each other. When the bonding is performed, similarly to those described above, for example, each concave portion 2 of the supporting substrate 3 and the semiconductor wafer 21 are bonded to each other by a room temperature plasma bonding method so that each concave portion 2 of the supporting substrate 3 is sealed by the view-angle region of each solid-state imaging portion of the semiconductor wafer 21 side. Subsequently, the semiconductor wafer 21 is thinned. The stress film 42 having a stress is formed on the surface (a so-called rear surface) of the light incident side of the thinned semiconductor wafer 21. As the stress film 42, for example, a plasma silicon nitride film or a plasma silicon oxide film and the like can be used.

By the stress films 5 and 42 having the stress and the stress, that is, the stresses being a reverse direction to each other, the view-angle region of each solid-state imaging portion of the thinned semiconductor wafer 21 is curved to the concave portion 2 side. For example, the curve may be a hemispherical shaped curve. By the curving of the view-angle region, the imaging surface is formed in the curved surface corresponding to the field curvature which is generated by the imaging lens aberration.

Next, the color filter and the on-chip lens are formed on the stress film 42. Next, the semiconductor wafer 21 and the supporting substrate 3 are divided along the scribe line which is illustrated as the dashed line 23 in FIG. 19B, and the intended backside-illumination type CMOS solid-state imaging device 44 in which the imaging surface is curved is obtained as illustrated in FIG. 18.

In addition, the stress film 42 may be formed on the entire surface including on the on-chip lens after the on-chip lens is formed.

According to the manufacturing method of the solid-state imaging device 44 of the sixth embodiment, due to the fact that the stress films 5 and 42 having stresses in the reverse direction to each other are formed on both surfaces of the thinned semiconductor wafer 21, only the view-angle region is curved to the concave portion 2 side, and the imaging surface having the imagined curve shape is formed.

Therefore, similarly to those described in the first embodiment, the matching accuracy of the center of the view-angle region and the optical center of the imaging lens system is improved, and the solid-state imaging device 31 in which the imaging surface is curved and the lens aberration is suppressed can be manufactured. Except for that, effects similar to those of the first embodiment described above are accomplished.

7. Seventh Embodiment

Configuration Example of Solid-State Imaging Device

Figure 20:
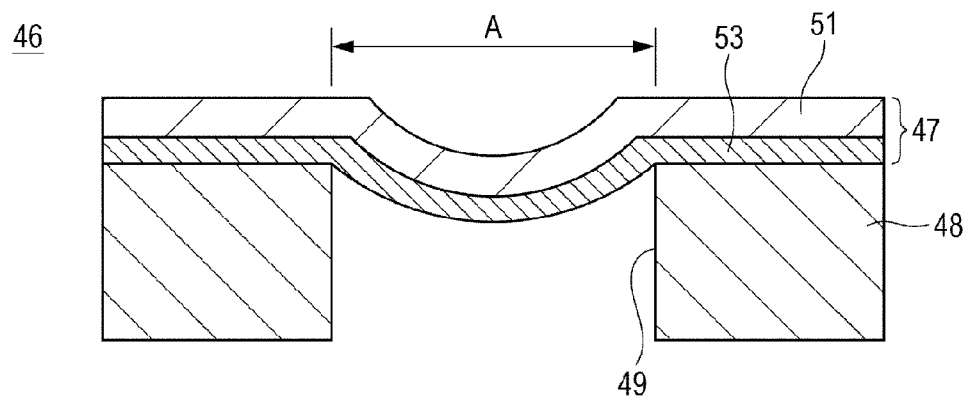
FIG. 20 is a schematic configuration diagram illustrating a seventh embodiment of a solid-state imaging device according to the present disclosure.

FIG. 20 illustrates a seventh embodiment of a solid-state imaging device of the present disclosure. The present embodiment is a case which is applied to the backside-illumination type CMOS solid-state imaging device. The solid-state imaging device 46 according to the seventh embodiment includes a solid-state imaging substrate 47 in which the backside-illumination type solid-state imaging portion is formed and thinned, and the supporting substrate 48 which is bonded on the solid-state imaging substrate 47. In addition, the solid-state imaging device 46 is constituted by curving the thinned view-angle region A to the concave portion 49 side in which a portion of the supporting substrate 48 is removed. The solid-state imaging device 46 corresponds to a so-called solid-state imaging chip.

In the solid-state imaging substrate 47, a pixel region in which a plurality of pixels are arranged on a silicon substrate 51 and the peripheral circuit portion are formed, the color filter and the on-chip lens are formed on the rear surface of the light incident side of the substrate 51, and the multilayer wiring layer 53 is formed on the surface opposite to the light incident side of the substrate 51 (refer to FIG. 2). After the solid-state imaging substrate 47 is bonded on the supporting substrate 48 at the multilayer wiring layer side, the solid-state imaging substrate 47 is thinned, and the color filter and the on-chip lens are formed. For example, the supporting substrate 48 can be constituted by a silicon substrate.

In the present embodiment, the stress film having the stress is formed on the multilayer wiring layer 53 of the solid-state imaging substrate 47, or the interlayer insulating film of the multilayer wiring layer 53 is formed by the film (corresponding to the stress film) having the stress. In addition, a portion of the portion corresponding to the view-angle region A of the supporting substrate 48 is removed by etching and the concave portion 49 is formed in the state where the solid-state imaging substrate 47 is bonded on the supporting substrate 48. Due to the fact that the concave portion 49 is formed, the view-angle region A in the thinned film state is curved to the concave portion 49 side by the stress of the stress film.

Example of Manufacturing Method of Solid-State Imaging Device

Figure 21A:
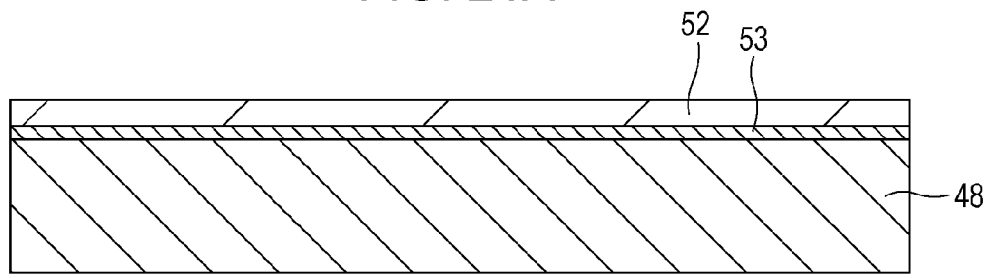
FIGS. 21A to 21C are manufacturing process diagrams illustrating an example of a manufacturing method of the solid-state imaging device according to the seventh embodiment.
Figure 21B:
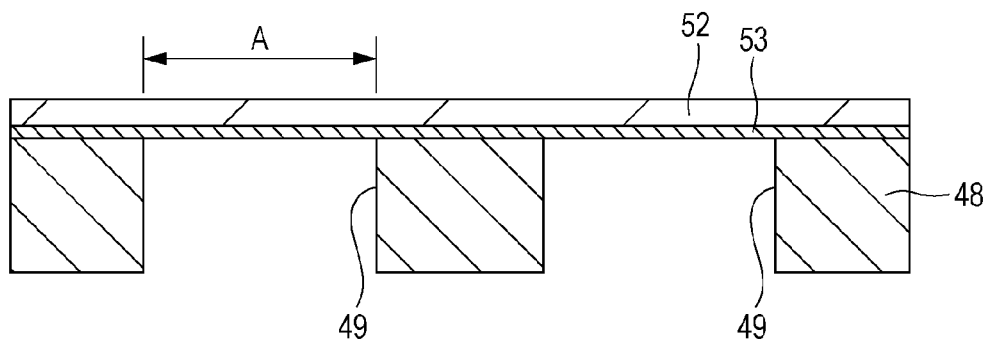
Figure 21C:
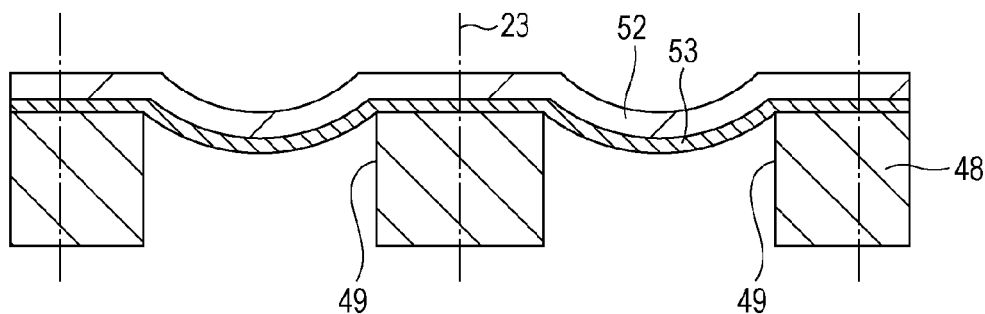

FIGS. 21A to 21C illustrate an example of the manufacturing method of the solid-state imaging device 46 according to the seventh embodiment. First, in a process of FIG. 21A, a semiconductor wafer 52 formed of silicon is prepared, a plurality of solid-state imaging portions constituted by the pixel region and the peripheral circuit is formed on the semiconductor wafer 52, and the multilayer wiring layer 53 having wirings in a plurality of layers is formed on the surface of the semiconductor wafer 52 via the interlayer insulating film. Here, the interlayer insulating film of the multilayer wiring layer 53 is formed by the film having the stress. In addition, the stress film having the stress may be formed on the multilayer wiring layer. Subsequently, the semiconductor wafer 52 is thinned after the semiconductor wafer 52 is bonded on the supporting substrate 48 in the multilayer wiring layer 53 side. After the thinning, the color filter and the on-chip lens are formed on the semiconductor wafer 52.

Next, as illustrated in FIG. 21B, a portion of the supporting substrate 48, that is, the portion corresponding to the view-angle region A in each solid-state imaging portion of the semiconductor wafer 52 side is selectively removed by etching, and the concave portion 49 is formed. The view-angle region A becomes the thinned film state.

As illustrated in FIG. 21C, due to the fact that the portion corresponding to the view-angle region of the supporting substrate 48 is removed and the view-angle region A is thinned, only the region corresponding to the view-angle region A is curved by the effect of the stress of the interlayer insulating film, and the imaging region having a desired curved surface is formed. Next, the semiconductor wafer 52 and the supporting substrate 48 are divided along the scribe line which is illustrated as the dashed line 23 in FIG. 21C, and the intended backside-illumination type CMOS solid-state imaging device 46 in which the imaging surface is curved is obtained as illustrated in FIGS. 20A to 20C.

According to the solid-state imaging device 46 and the manufacturing method thereof according to the seventh embodiment, due to the fact that a normal supporting substrate 48 which is bonded for thinning the semiconductor wafer 52 is locally removed, the view-angle region is curved by using the stress of the interlayer insulating film or the stress film. Accordingly, the matching accuracy of the center of the view-angle region and the optical center of the imaging lens system is improved, and suppression with respect to the lens aberration can be improved by curving the imaging surface. The imaging lens aberration can be suppressed at the solid-state imaging chip 4 side, and the number of the lenses of the imaging lens system can be reduced. In the present embodiment, since it is not necessary to separately prepare the supporting substrate 4 having the concave portion 2 which is matched to the curved shape in the above-described embodiments and modifications, the number of the manufacturing processes can be reduced, and the present embodiment can be easily manufactured. Except for that, effects similar to those described in the first embodiment can be accomplished.

8. Eighth Embodiment

Configuration Example of Solid-State Imaging Device

Figure 22:
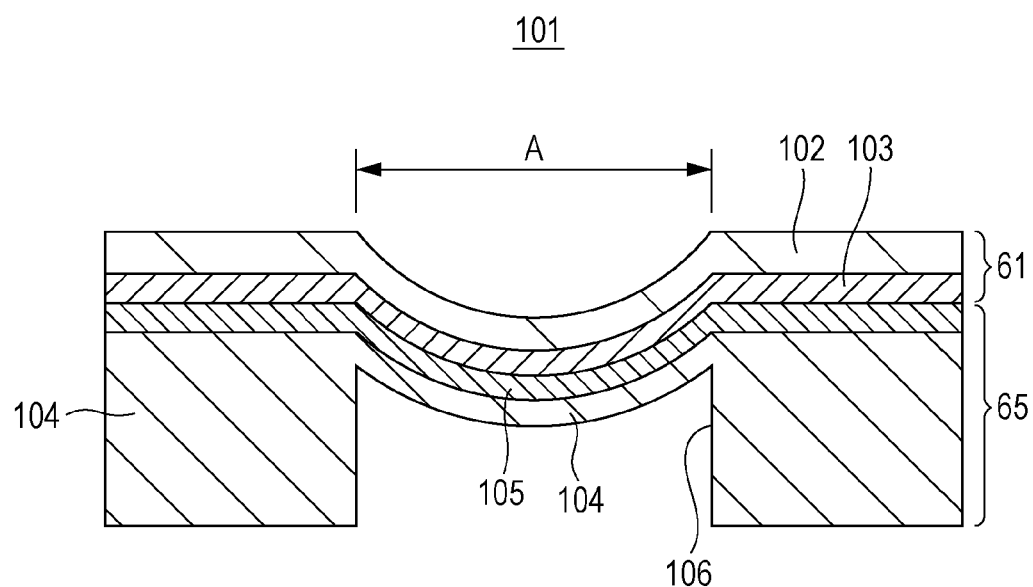
FIG. 22 is a schematic configuration diagram illustrating an eighth embodiment of a solid-state imaging device according to the present disclosure.
Figure 25A:
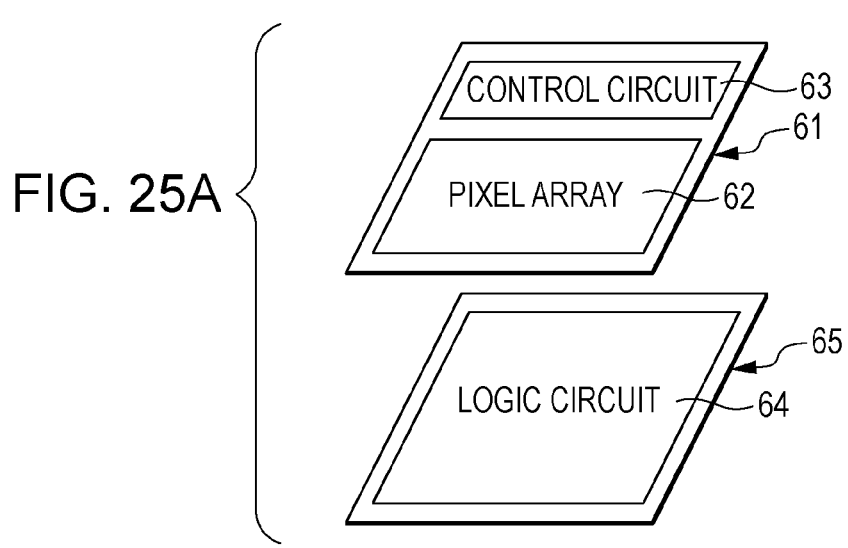
FIGS. 25A and 25B are schematic diagrams illustrating an example of a basic schematic configuration of the solid-state imaging device applied to the eighth embodiment.
Figure 25B:
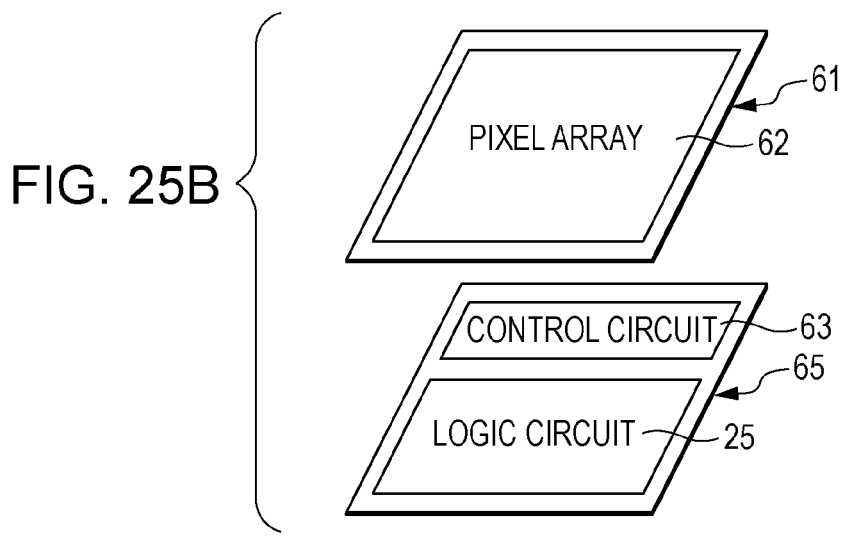

FIG. 22 illustrates an eighth embodiment of a solid-state imaging device of the present disclosure. The present embodiment is a case which is applied to the backside-illumination type CMOS solid-state imaging device. First, a basic schematic configuration, which is applied to the solid-state imaging device according the eighth embodiment, will be described with reference to FIGS. 25A and 25B. As illustrated in FIG. 25A, in an example of the solid-state imaging device which is applied to the eighth embodiment, a pixel array (pixel region) 62 and a control circuit 63 are mounted on a first semiconductor chip portion 61, and a logic circuit 64 which includes a signal processing circuit for processing a signal is mounted on a second semiconductor chip portion 65. The first and the second semiconductor chip portions 61 and 65 are electrically connected to each other and the backside-illumination type CMOS solid-state imaging device is constituted as a single semiconductor chip. In the other example of the solid-state imaging device to which the eighth embodiment is applied, as illustrated in FIG. 25B, the pixel array 62 is mounted on the first semiconductor chip portion 61, and the control circuit 63 and the logic circuit 64 which include a signal processing circuit are mounted on the second semiconductor chip portion 65. The first and the second semiconductor chip portions 61 and 65 are electrically connected to each other and the backside-illumination type CMOS solid-state imaging device is constituted as a single semiconductor chip.

Figure 26:
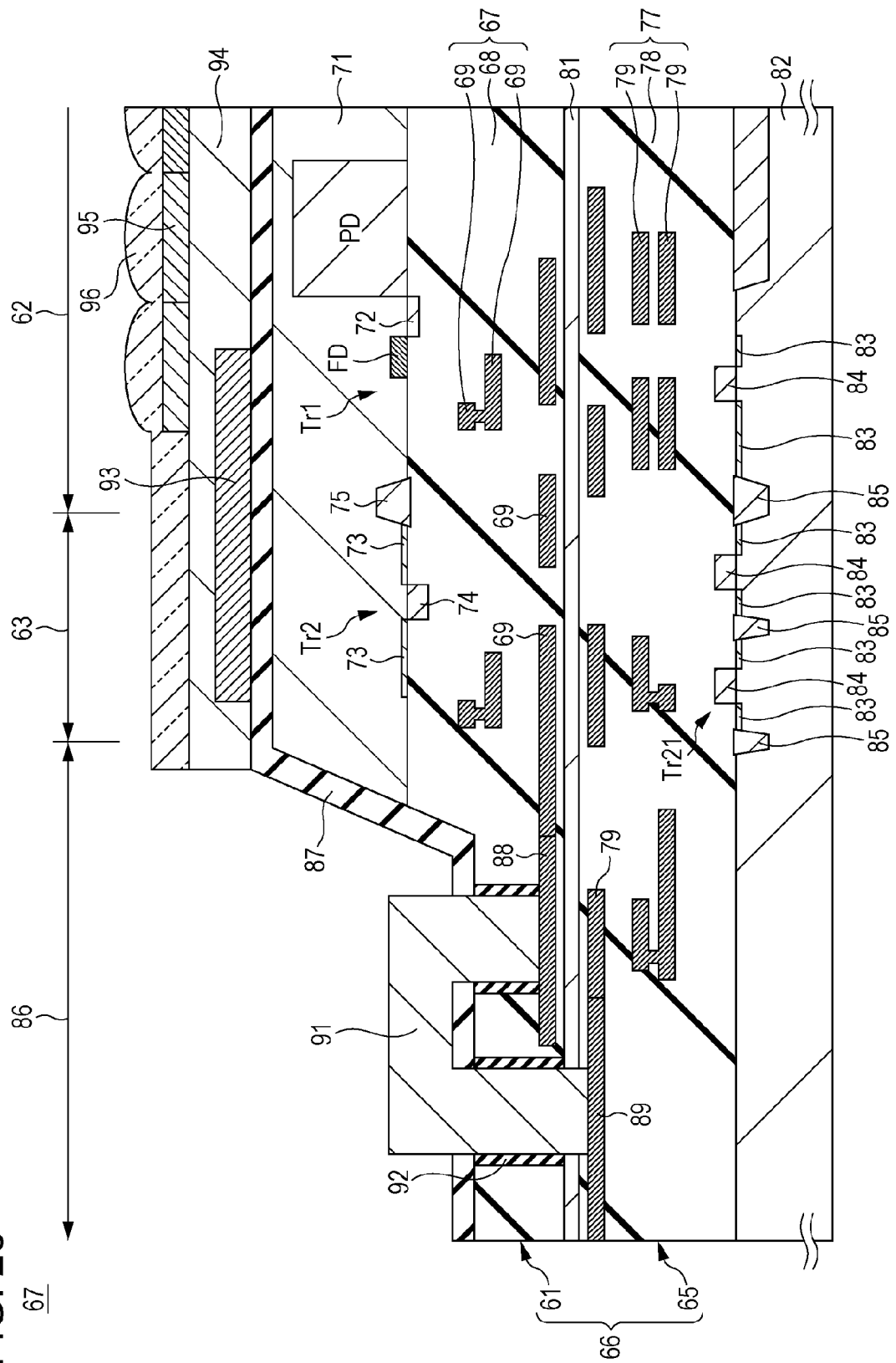
FIG. 26 is a configuration diagram of a main portion of a backside-illumination type CMOS solid-state imaging device illustrating a specified example of the solid-state imaging device illustrated in FIG. 25A.

FIG. 26 illustrates a specified example of the solid-state imaging device of FIG. 25A. The backside-illumination type CMOS solid-state imaging device 67 is constituted so as to include the first semiconductor chip portion 61 in which the pixel array 62 and the control circuit 63 are formed and a laminated semiconductor chip 66 to which the second semiconductor chip portion 65 having the logic circuit 64 formed is bonded. The first semiconductor chip portion 61 and the second semiconductor chip portion 65 are bonded to each other so that the multilayer wiring layers 67 and 77 face each other. In the present example, the first semiconductor chip portion 61 and the second semiconductor chip portion 65 are bonded to each other by an adhesive layer 81. However, except for that, the first and second semiconductor chip portions 61 and 65 may be bonded by plasma bonding. The multilayer wiring layer 67 is formed by disposing wirings 69 of a plurality of layers via the interlayer insulating film 68. The multilayer wiring layer 77 is formed by disposing wirings 79 of a plurality of layers via the interlayer insulating film 78.

In the first semiconductor substrate 71 constituted by silicon of the first semiconductor chip portion 61, pixel arrays (pixel region) in which photodiodes PD used as the photoelectric conversion portion and a plurality of pixels constituted by a plurality of pixel transistors are two-dimensionally arranged are formed. For example, a plurality of pixel transistors is constituted by three transistors of a transfer transistor, a reset transistor, an amplification transistor, or by four transistors adding a selection transistor to the three transistors. In FIG. 26, a plurality of pixel transistors is represented by the transfer transistor Tr1 including a floating diffusion FD and a transfer gate electrode 72. In addition, a control circuit is formed of a plurality of MOS transistors Tr12 constituted by a pair of source and drain regions 73 and a gate electrode 74 in the first semiconductor substrate 71. A reference number 75 indicates an element separating region.

In addition, a logic circuit is formed of a plurality of MOS transistors Tr21 constituted by a pair of source and drain regions 83 and a gate electrode 84 in the second semiconductor substrate 82 constituted by silicon of the second semiconductor chip portion 65. A reference number 85 indicates an element separating region.

After the first and second semiconductor chip portions 61 and 65 are bonded to each other, the first semiconductor substrate 71 in which the pixel array is formed is thinned while having the second semiconductor chip portion 65 as the base substrate, and thereafter, a portion of the semiconductor portion is entirely removed. An insulating film 87 coats the entire rear surface of the first semiconductor substrate including the semiconductor removed region 86 portion. In the semiconductor removed region 86, a connection pad 88 integrally formed with the wiring 69 of the first semiconductor chip portion 61 side and a connection pad 89 integrally formed with the wiring 79 of the second semiconductor chip 65 side are electrically connected to each other via a penetration electrode 91. The periphery of the penetration electrode 91 is insulated by an insulating film 92. After the first semiconductor substrate 71 is thinned, the color filter 95 and the on-chip lens 96 are formed via a light shield layer 93 and a planarized film 94, and a laminated chip type backside-illuminated CMOS solid-state imaging device 67 is constituted.

As illustrated in FIG. 22, the solid-state imaging device 101 according to the eighth embodiment is constituted so that the first semiconductor chip portion 61 and the second semiconductor chip portion 65 are bonded to each other. As illustrated in FIGS. 25A and 25B, the first semiconductor chip portion 61 includes the pixel array 62, the color filter, and the on-chip lens which are at least formed on the first semiconductor substrate 102, and the multilayer wiring layer 103 which is formed on the surface of the first semiconductor substrate 102. The second semiconductor chip portion 65 includes the logic circuit 64 which is at least formed on the second semiconductor substrate 104, and the multilayer wiring layer 105 which is formed on the surface of the second semiconductor substrate 104.

In addition, in the present embodiment, the second semiconductor substrate 104 of the second semiconductor chip portion 65 is thinned so that a concave portion 106 is formed in the portion corresponding to the view-angle region A of the first semiconductor chip portion 61. Since the logic circuit 64 is formed on a polar surface of the second semiconductor substrate, for example, on a region in which the thickness is about 5 nm, the second semiconductor substrate 104 can be thinned so that the logic circuit 64 remains. By the thinning, for example, when the interlayer insulating films of the multilayer wiring layers 105 and 103 are formed as a film having a stress, only the region which corresponds to the thinned view-angle region A is curved to the concave portion 106 side. In addition, even when the film having the stress is separately formed on the surface of the multilayer wiring layer, the view-angle region A is curved similarly to the above.

Example of Manufacturing Method of Solid-State Imaging Device

Figure 23A:
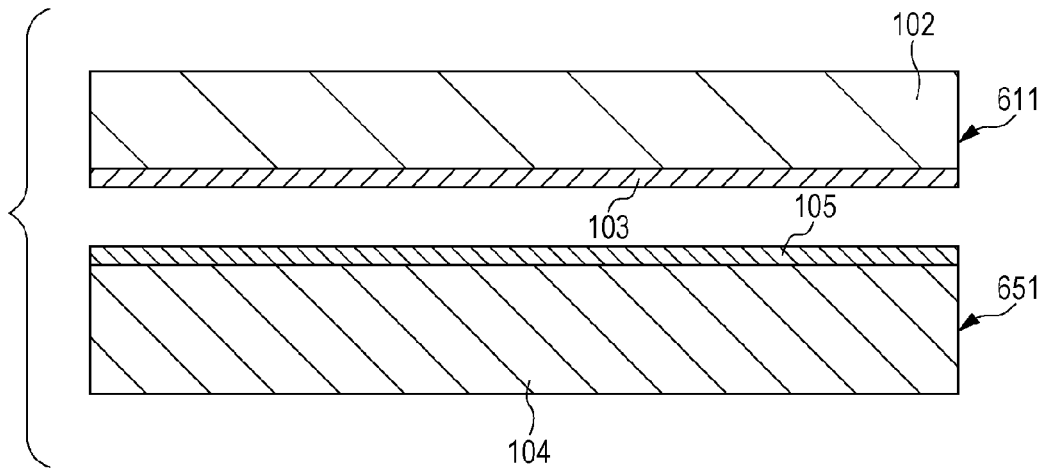
FIGS. 23A to 23C are manufacturing process diagrams (the first) illustrating an example of a manufacturing method of the solid-state imaging device according to the eighth embodiment.

FIGS. 23A to FIG. 24B illustrate an example of the manufacturing method of the solid-state imaging device 101 according to the eighth embodiment. First, as illustrated in FIG. 23A, a first semiconductor wafer 611 and a second semiconductor wafer 651 are prepared. In the first semiconductor wafer 611, the solid-state imaging portion corresponding to a plurality of first semiconductor chips is formed on the first semiconductor substrate 102 constituted by silicon thereof, and the multilayer wiring layer 103 in which wirings in a plurality of layers are disposed on the surface of the first semiconductor substrate 102 via the interlayer insulating film is formed. In the solid-state imaging portion corresponding to each first semiconductor chip portion, the pixel array in which a plurality of pixels constituted by photodiodes and a plurality of pixel transistors is arranged, or the control circuit constituted by the pixel array and a plurality of MOS transistors is formed. The multilayer wiring layer 103 is formed corresponding to each solid-state imaging portion. In the present embodiment, the interlayer insulating film is formed of a film having a stress. Except for that, a film which positively has a stress may be formed on the surface of the interlayer insulating film. In the second semiconductor wafer 651, a circuit configuration portion corresponding to a plurality of second semiconductor chips is formed on the second semiconductor substrate 104 constituted by silicon thereof, and the multilayer wiring layer 105 in which wirings in a plurality of layers are disposed on the surface of the second semiconductor substrate 104 via the interlayer insulating film is formed. The logic circuit is formed of a plurality of MOS transistors including a plurality of CMOS transistors in the circuit configuration portion. In the present embodiment, the interlayer insulating film of the multilayer wiring layer 105 is formed of a film having a stress. Except for that, a film which positively has a stress may be formed on the surface of the interlayer insulating film.

Figure 23B:
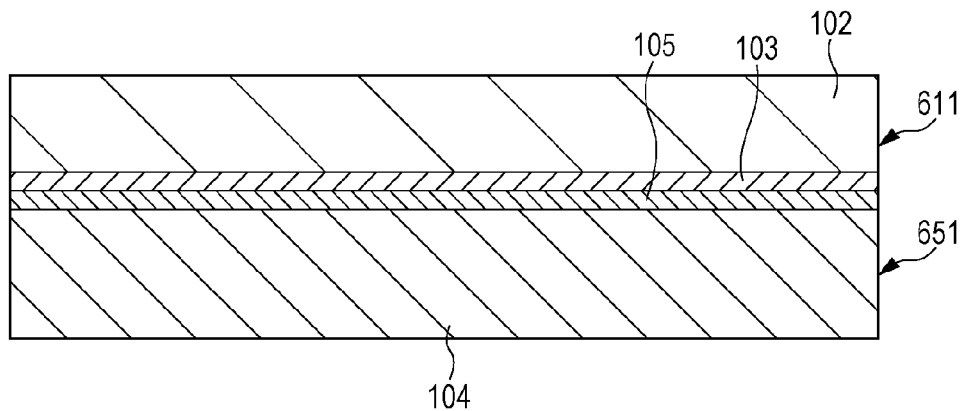

Next, as illustrated in FIG. 23B, the first semiconductor wafer 611 and the second semiconductor wafer 651 is bonded so that the interlayer insulating films face each other. The bonding can be performed through the bonding of an adhesive layer or a plasma bonding, and the like.

Figure 23C:
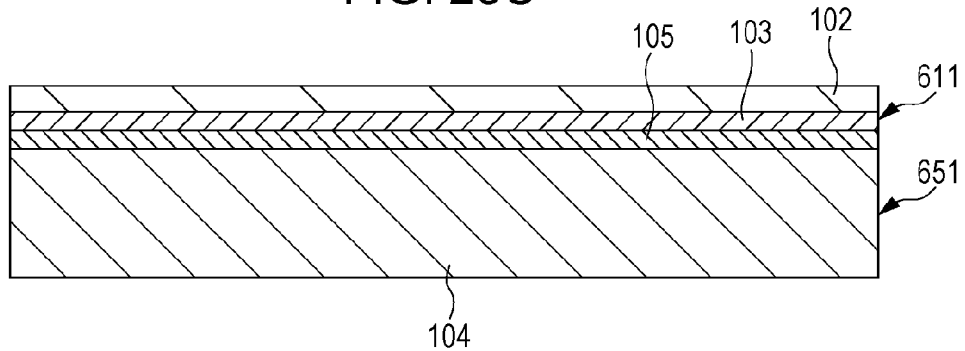

Next, as illustrated in FIG. 23C, the first semiconductor substrate 102 of the first semiconductor wafer 611 is thinned. Subsequently, although not illustrated, the interconnection between the solid-state imaging portion in the first semiconductor wafer 611 and the circuit configuration portion in the second semiconductor wafer 651 is performed, and the color filter and the on-chip lens are formed on the rear surface of the thinned first semiconductor substrate 102 corresponding to the pixel array of each solid-state imaging portion (for example, refer to FIG. 26).

Figure 24A:
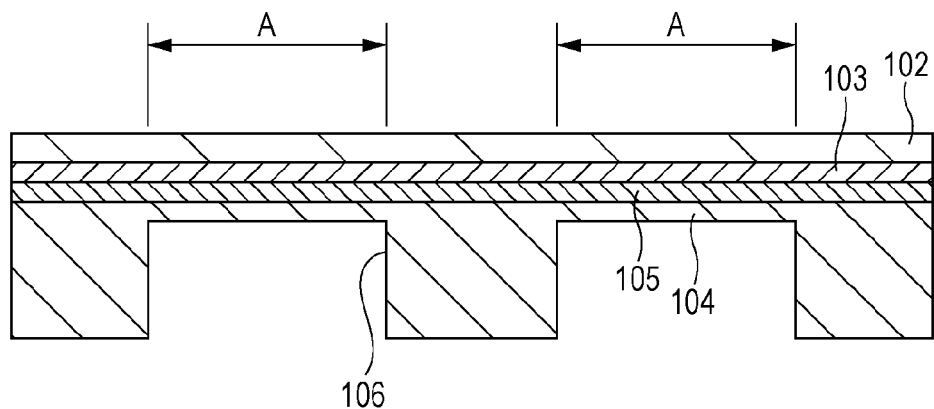
FIGS. 24A and 24B are manufacturing process diagrams (the second) illustrating an example of a manufacturing method of the solid-state imaging device according to the eighth embodiment.

Next, as illustrated in FIG. 24A, a portion of the second semiconductor substrate 105 of the second semiconductor wafer 651 is thinned from the rear surface side by a selective etching or the like. That is, the region of the second semiconductor substrate 104 corresponding to each view-angle region A of the first semiconductor substrate 102 side is thinned and the concave portion is formed so that the circuit configuration portion of the surface side of the second semiconductor substrate remains.

Figure 24B:
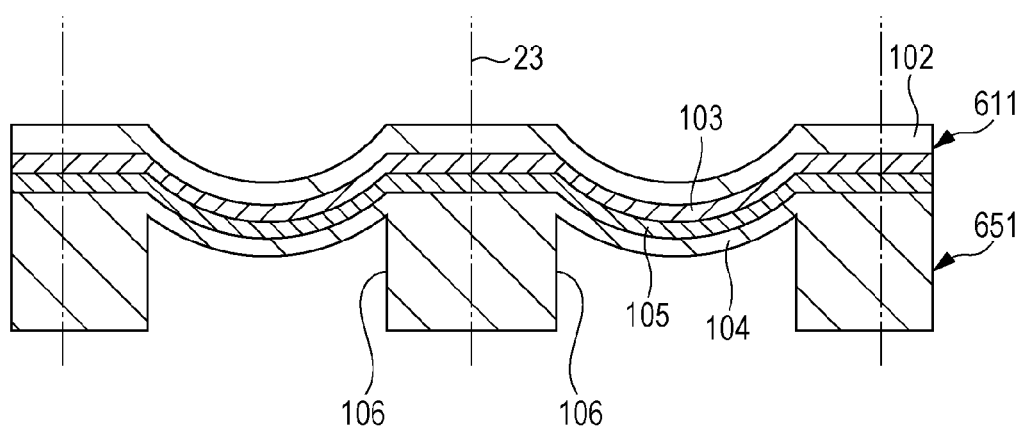

As illustrated in FIG. 24B, due to the fact that the portion corresponding to the view-angle region A of the second semiconductor substrate 104 is removed and becomes the thinned film state, only the region corresponding to the view-angle region A is curved by the effect in the stress of the interlayer insulating film, and the imaging region having a desired curved surface is formed. Next, the laminated semiconductor wafers 611 and 651 are divided along the scribe line which is illustrated as the dashed line 23 in FIG. 24B, and the intended backside-illumination type CMOS solid-state imaging device 101 in which the imaging surface is curved is obtained as illustrated in FIG. 22.

According to the solid-state imaging device 101 and the manufacturing method thereof according to the eighth embodiment, after the first and the second semiconductor wafers 611 and 651 are bonded to each other, the second semiconductor substrate 104 of the portion corresponding to each view-angle region is locally thinned. The view-angle region is curved by using the stress of the interlayer insulating film or the stress film due to the thinning. Accordingly, the matching accuracy of the center of the view-angle region and the optical center of the imaging lens system is improved, and suppression with respect to the lens aberration can be improved by curving the imaging surface. The imaging lens aberration can be suppressed at the solid-state imaging chip side, and the number of the lenses of the imaging lens system can be reduced. In the present embodiment, since it is not necessary to separately prepare the supporting substrate 4 having the concave portion 2 which is matched to the curved shape in the above-described embodiments and modifications, the number of the manufacturing processes can be reduced, and the present embodiment can be easily manufactured. Except for that, effects similar to those described in the first embodiment can be accomplished.

9. Ninth Embodiment

Configuration Example of Solid-State Imaging Device

Figure 27:
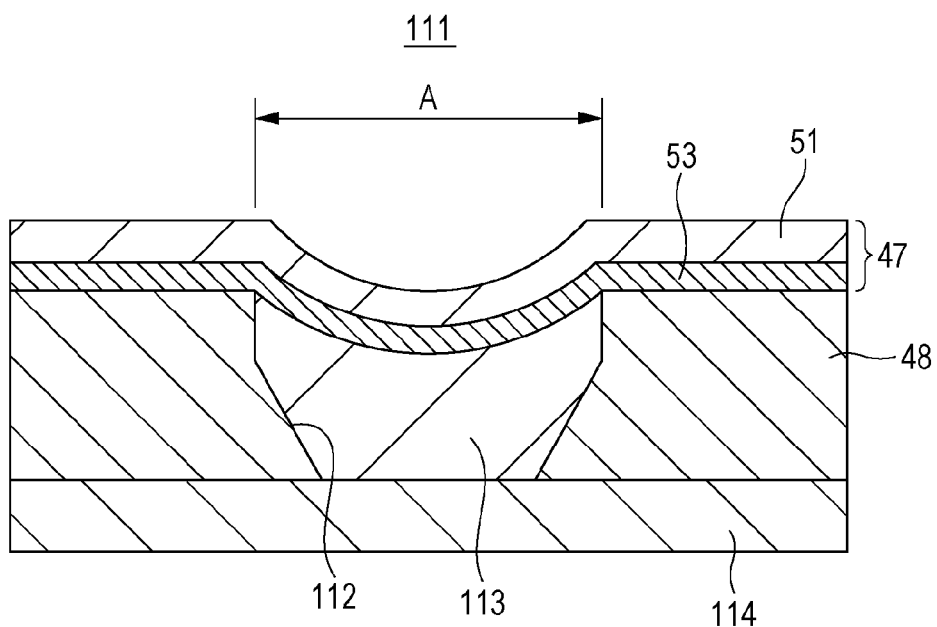
FIG. 27 is a schematic configuration diagram illustrating a ninth embodiment of a solid-state imaging device according to the present disclosure.

FIG. 27 illustrates a ninth embodiment of a solid-state imaging device of the present disclosure. The present embodiment is a case which is applied to the backside-illumination type CMOS solid-state imaging device. The solid-state imaging device 111 according to the ninth embodiment includes the solid-state imaging substrate 47 in which the backside-illumination type solid-state imaging portion is formed and thinned, and the supporting substrate 48 which is bonded on the solid-state imaging substrate 47. For example, the supporting substrate 48 is formed of a silicon substrate, and includes a concave portion 112 in which the portion corresponding to the view-angle region A of the solid-state imaging substrate 47 is removed over the entire region in the thickness direction. For example, an adhesive agent 113 which is volumetrically shrunk by light irradiation such as ultraviolet light or heating is filled in the concave portion 112. In addition, a sealing substrate 114 which seals the adhesive agent 113 is bonded on the rear surface of the supporting substrate 48. For example, the sealing substrate 114 can be formed of a silicon substrate, a glass substrate, or the like.

In the solid-state imaging substrate 47, the pixel region in which a plurality of pixels is arranged on the silicon substrate 51 and the periphery circuit portion are formed on the silicon substrate 51, the color filter and the on-chip lens are formed on the rear surface of the light incident side of the substrate 51, and the multilayer wiring layer 53 is formed on the surface opposite to the light incident side of the substrate 51. After the solid-state imaging substrate 47 is bonded on the supporting substrate 48 at the multilayer wiring layer 53 side, the solid-state imaging substrate 47 is thinned and the color filter and the on-chip lens are formed. The solid-state imaging device 46 corresponds to the so-called solid-state imaging chip.

In the present embodiment, the concave portion 112 is locally formed in the supporting substrate 48 which is bonded on the solid-state imaging substrate 47, the view-angle region A becomes the thinned film state, the adhesive agent 113 is filled in the concave portion 112, and the adhesive agent 113 is sealed by the sealing substrate 114. In addition, the adhesive agent 113 is volumetrically shrunk by light irradiation or heat treatment, and only the view-angle region A in the thinned film state is curved by the volumetric shrinkage.

Example of Manufacturing Method of Solid-State Imaging Device

Figure 28A:
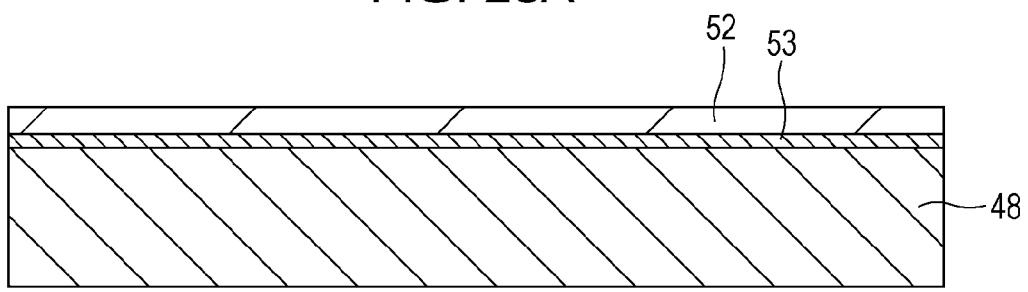
FIGS. 28A and 28B are manufacturing process diagrams (the first) illustrating an example of a manufacturing method of the solid-state imaging device according to the ninth embodiment.

FIGS. 28A to 29B illustrate an example of the manufacturing method of the solid-state imaging device 111 according to the ninth embodiment. First, as illustrated in FIG. 28A, the semiconductor wafer 52 formed of silicon is prepared, a plurality of solid-state imaging portions constituted by the pixel region and the peripheral circuit is formed on the semiconductor wafer 52, and the multilayer wiring layer 53 having wirings in a plurality of layers is formed on the surface of the semiconductor wafer 52 via the interlayer insulating film. Subsequently, after the semiconductor wafer 52 is bonded on the supporting substrate (semiconductor wafer) 48 in the multilayer wiring layer 53 side, the semiconductor wafer 52 is thinned. After the thinning, the color filter and the on-chip lens are formed on the semiconductor wafer 52.

Figure 28B:
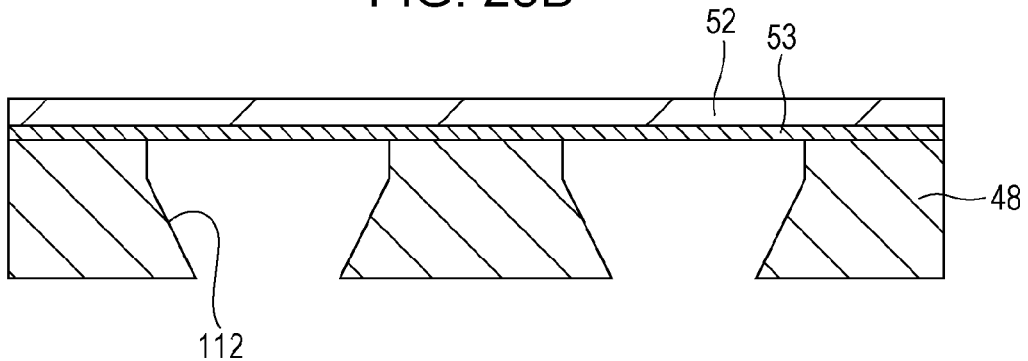

Next, as illustrated in FIG. 28B, a portion of the supporting substrate 48, that is, the portion corresponding to the view-angle region A in each solid-state imaging portion of the semiconductor wafer 52 side is selectively removed by etching and the concave portion 112 is formed. The view-angle region A becomes the thinned film state.

Figure 29A:
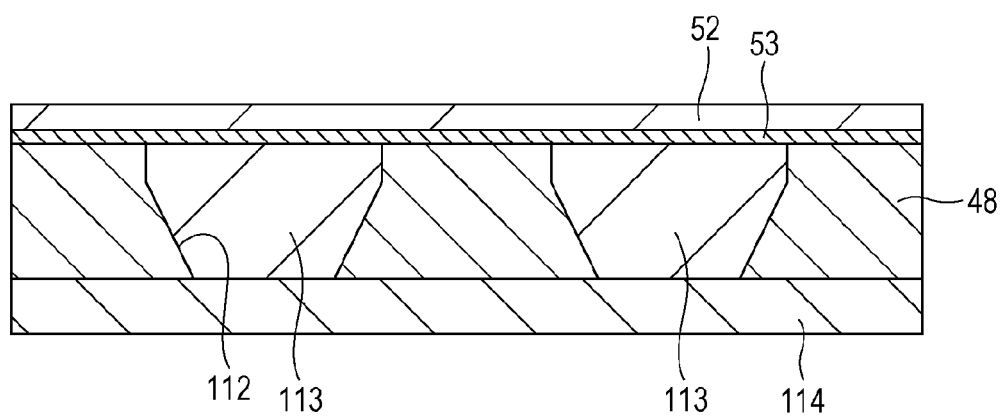
FIGS. 29A and 29B are manufacturing process diagrams (the second) illustrating an example of a manufacturing method of the solid-state imaging device according to the ninth embodiment.

Next, as illustrated in FIG. 29A, the adhesive agent 113 which is volumetrically shrunk by light irradiation or heat treatment is filled in each concave portion 112, and the sealing substrate 114 which is constituted by a semiconductor wafer or a glass wafer is bonded. The adhesive agent 113 and the interlayer insulating layer 53 of the region corresponding to the view-angle region are bonded to each other.

Figure 29B:
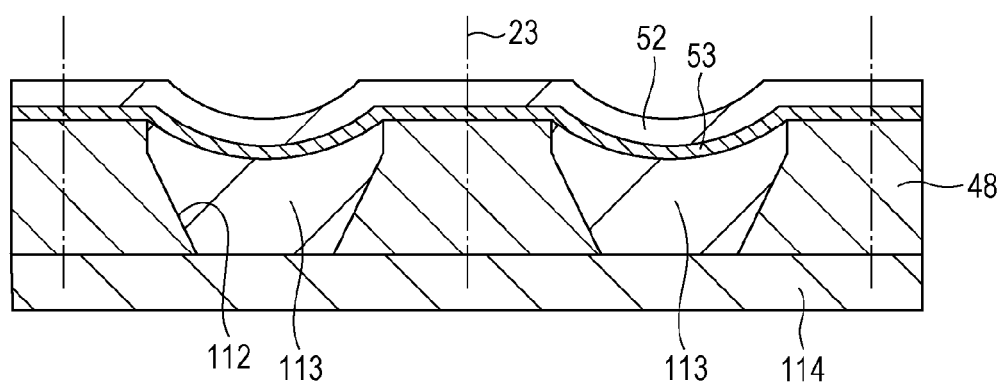

Next, the adhesive agent 113 is volumetrically shrunk by performing light irradiation or heat treatment with respect to the adhesive agent 113, as illustrated in FIG. 29B, only each view-angle region A is curved in a spherical shape, and the imaging surface of the curved surface having a desired curvature is formed. Next, the semiconductor wafer and the supporting substrate are divided along the scribe line which is illustrated as the dashed line 23 in FIG. 29B, and the intended backside-illumination type CMOS solid-state imaging device 111 in which the imaging surface is curved is obtained as illustrated in FIG. 27.

In the solid-state imaging device 111 and the manufacturing method thereof according to the ninth embodiment, the concave portion 112 corresponding to the view-angle region A is formed in a normal supporting substrate 48 which is bonded for thinning the semiconductor wafer 52, and the adhesive agent 113 is filled in the concave portion 112. Due to the fact that the adhesive agent 113 is volumetrically shrunk by performing light irradiation or heat treatment with respect to the adhesive agent 113 which is sealed by the sealing substrate 114, the view-angle region A is curved. Accordingly, the matching accuracy of the center of the view-angle region and the optical center of the imaging lens system is improved, and suppression with respect to the lens aberration can be improved by curving the imaging surface. The imaging lens aberration can be suppressed at the solid-state imaging chip side, and the number of the lenses of the imaging lens system can be reduced. In the present embodiment, since it is not necessary to separately prepare the supporting substrate 4 having the concave portion 2 which is matched to the curved shape in the above-described embodiments and modifications, the number of the manufacturing processes can be reduced, and the present embodiment can be easily manufactured. Except for that, effects similar to those described in the first embodiment can be accomplished.

10. Tenth Embodiment

Configuration Example of Solid-State Imaging Device

Figure 30:
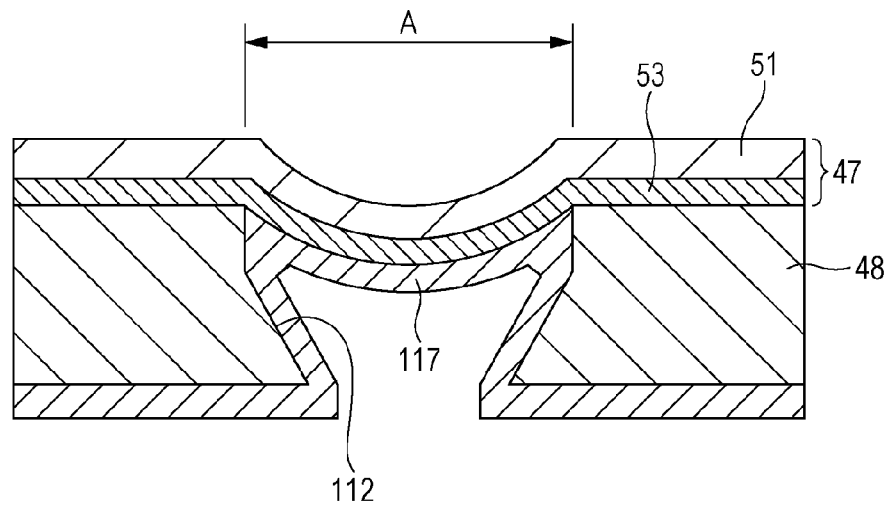
FIG. 30 is a schematic configuration diagram illustrating a tenth embodiment of a solid-state imaging device according to the present disclosure.

FIG. 30 illustrates a tenth embodiment of a solid-state imaging device of the present disclosure. The present embodiment is a case which is applied to the backside-illumination type CMOS solid-state imaging device. The solid-state imaging device 116 according to the tenth embodiment includes the solid-state imaging substrate 47 in which the backside-illumination type solid-state imaging portion is formed and thinned, and the supporting substrate 48 which is bonded on the solid-state imaging substrate 47. For example, the supporting substrate 48 is formed of a silicon substrate, and includes a concave portion 112 in which the portion corresponding to the view-angle region A of the solid-state imaging substrate 47 is removed over the entire region in the thickness direction. For example, a stress film 117 is formed over the entire rear surface of the supporting substrate including the inner surface of the concave portion 112. The insulating film having a stress or a heat shrinkable film which is shrunk by heat treatment can be formed as the stress film 117. In the present embodiment, the stress film 117 is formed of the heat shrinkable film.

In the solid-state imaging substrate 47, the pixel region in which a plurality of pixels is arranged on the silicon substrate 51 and the periphery circuit portion are formed on the silicon substrate 51, the color filter and the on-chip lens are formed on the rear surface of the light incident side of the substrate 51, and the multilayer wiring layer 53 is formed on the surface opposite to the light incident side of the substrate 51. After the solid-state imaging substrate 47 is bonded on the supporting substrate 48 at the multilayer wiring layer 53 side, the solid-state imaging substrate 47 is thinned and the color filter and the on-chip lens are formed. The solid-state imaging device 46 corresponds to the so-called solid-state imaging chip.

In the present embodiment, the concave portion 112 is locally formed in the supporting substrate 48 which is bonded on the solid-state imaging substrate 47, the view-angle region A becomes the thinned film state, and the stress film 117 is formed of the heat shrinkable film on the rear surface of the supporting substrate 48 including the inner surface of the concave portion 112. In addition, the stress 117 is heat-shrunk, and only the view-angle region A in the thinned film state is curved.

Manufacturing Method of Solid-State Imaging Device

FIGS. 31A to 32B illustrate an example of the manufacturing method of the solid-state imaging device 116 according to the tenth embodiment. Similarly to those described above, as illustrated in FIG. 31A, the semiconductor wafer 52 formed of silicon is prepared, a plurality of solid-state imaging portions constituted by the pixel region and the peripheral circuit is formed in the semiconductor wafer 52, and the multilayer wiring layer 53 having wirings in a plurality of layers is formed on the surface of the semiconductor wafer 52 via the interlayer insulating film. Subsequently, after the semiconductor wafer 52 is bonded on the supporting substrate (semiconductor wafer) 48 in the multilayer wiring layer 53 side, the semiconductor wafer 52 is thinned. After the thinning, the color filter and the on-chip lens are formed on the semiconductor wafer 52.

Figure 31A:
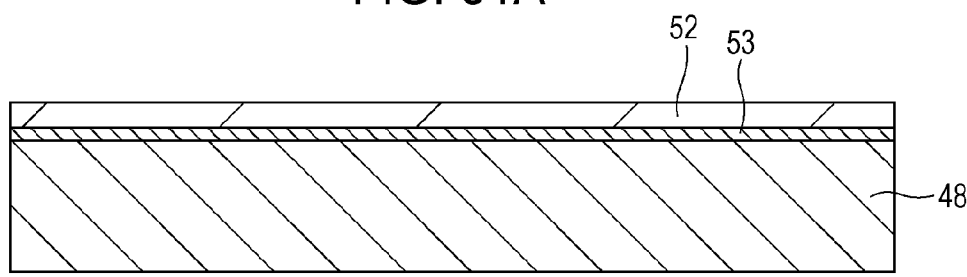
FIGS. 31A and 31B are manufacturing process diagrams (the first) illustrating an example of a manufacturing method of the solid-state imaging device according to the tenth embodiment.
Figure 31B:
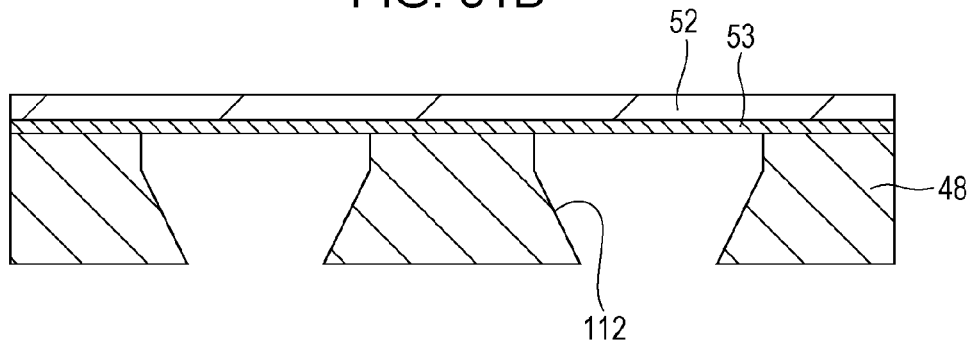

Next, as illustrated in FIG. 31B, a portion of the supporting substrate 48, that is, the portion corresponding to the view-angle region A in each solid-state imaging portion of the semiconductor wafer 52 side is selectively removed by etching and the concave portion 112 is formed. The view-angle region A becomes the thinned film state.

Figure 32A:
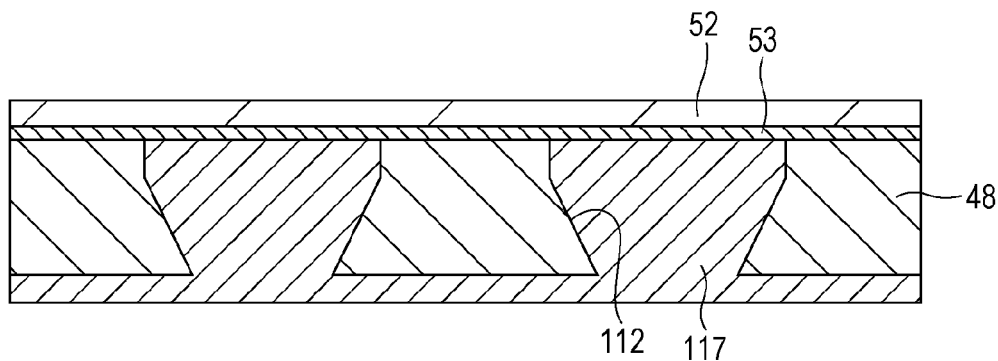
FIGS. 32A and 32B are manufacturing process diagrams (the second) illustrating an example of a manufacturing method of the solid-state imaging device according to the tenth embodiment.

Next, as illustrated in FIG. 32A, the stress film 117 constituted by the heat shrinkable film is formed on the entire rear surface of the supporting substrate 48 so as to fill in the concave portion 112.

Figure 32B:
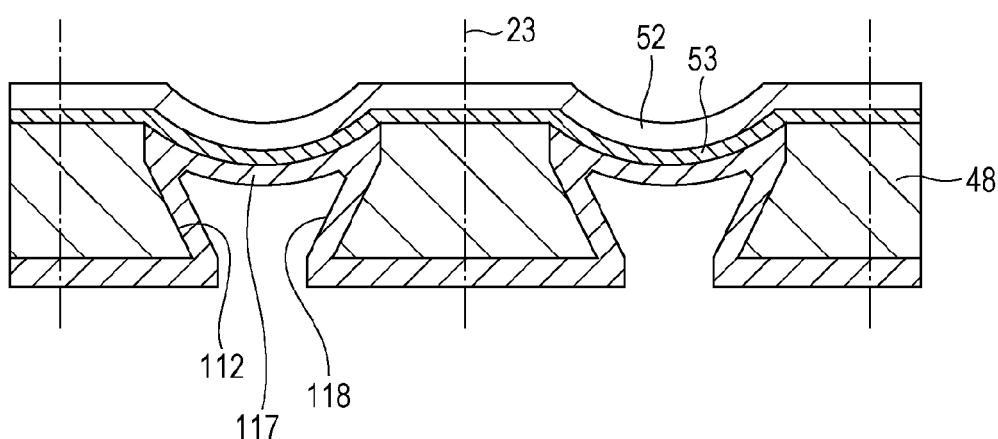

Next, as illustrated in FIG. 32B, for example, a portion of the stress film 117 in the concave portion 112 is removed by performing etching back so that the stress film 117 remains in the inner surface of the concave portion 112, and a cavity 118 is formed. Next, the stress film 117 is subjected to heat treatment. Due to the fact that stress film 117 is heat-shrunk by the heat treatment, the view-angle region A in the thinned film state is curved in a spherical shape to the cavity 118 side, and the imaging surface of the curved surface having a desired curvature is formed. Subsequently, the semiconductor wafer and the supporting substrate are divided along the scribe line which is illustrated as the dashed line 23 in FIG. 32B, and the intended backside-illumination type CMOS solid-state imaging device 116 in which the imaging surface is curved is obtained as illustrated in FIG. 30.

In the solid-state imaging device 116 and the manufacturing method thereof according to the tenth embodiment, the concave portion 112 corresponding to the view-angle region A is formed in a normal supporting substrate 48 which is bonded for thinning the semiconductor wafer 52, and the stress film 117 is formed from the inner surface of the concave portion 112 to the entire rear surface of the supporting substrate. Due to the fact that the stress film 117 is heat-shrunk, the view-angle region A is curved. Accordingly, the matching accuracy of the center of the view-angle region and the optical center of the imaging lens system is improved, and suppression with respect to the lens aberration can be improved by curving the imaging surface. The imaging lens aberration can be suppressed at the solid-state imaging chip side, and the number of the lenses of the imaging lens system can be reduced. In the present embodiment, since it is not necessary to separately prepare the supporting substrate 4 having the concave portion 2 which is matched to the curved shape in the above-described embodiments and modifications, the number of the manufacturing processes can be reduced, and the present embodiment can be easily manufactured. Except for that, effects similar to those described in the first embodiment can be accomplished.

The solid-state imaging devices according to the above-described embodiments and modifications are the cases which are applied to the backside-illumination type solid-state imaging device. However, an embodiment of the present disclosure can be also applied to a frontside-illumination type solid-state imaging device. This will be described below.

11. Eleventh Embodiment

Configuration Example of Solid-State Imaging Device

Figure 33:
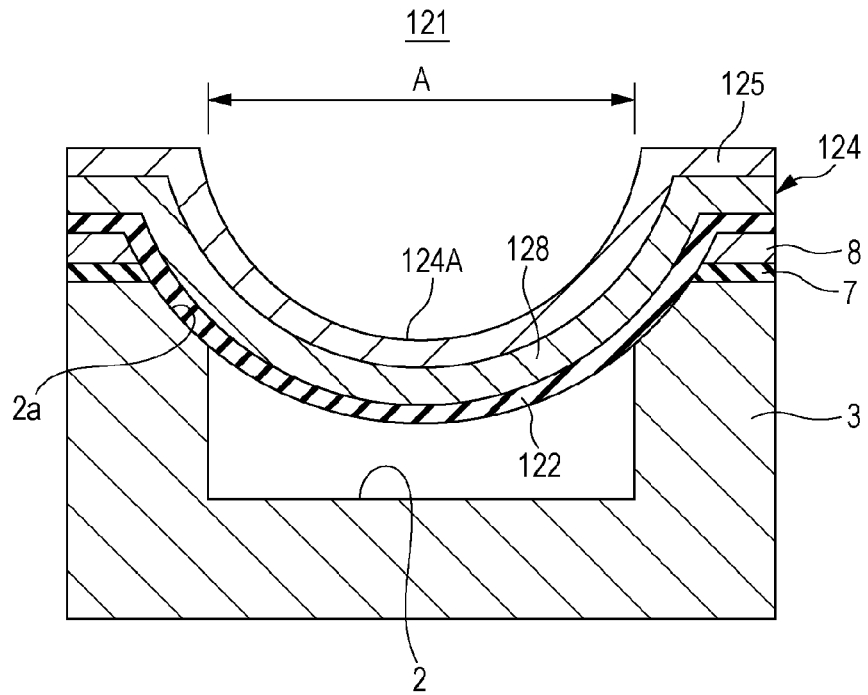
FIG. 33 is a schematic configuration diagram illustrating an eleventh embodiment of a solid-state imaging device according to the present disclosure.

FIG. 33 illustrates an eleventh embodiment of a solid-state imaging device of the present disclosure. The present embodiment is a case which is applied to the frontside-illumination type CMOS solid-state imaging device. The solid-state imaging device 121 according to the eleventh embodiment includes a supporting substrate 3 including a concave portion 2, the frontside-illumination type solid-state imaging chip 124 which is bonded on the supporting substrate so as to seal the concave portion 2 by a view-angle region, and a stress film 125 which is formed on the surface of the solid-state imaging chip 124.

The stress film 125 is formed on the surface of the light incident side of the frontside-illumination type solid-state imaging chip 124 by a film having a stress. For example, the stress film 125 is formed on the on-chip lens. As the stress film 125 having the stress, for example, a plasma silicon nitride film or a plasma silicon oxide film can be used.

In the solid-state imaging chip 124, as described below, a pixel region in which a plurality of pixels constituted by photodiodes and a plurality of pixel transistors is arranged and a periphery circuit portion for processing a signal are formed on a silicon substrate 128, and a multilayer wiring layer is formed on the surface of the silicon substrate 128. In addition, the color filter and the on-chip lens are formed on the multilayer wiring layer. After the silicon substrate 128 is thinned from the rear surface side, an insulating film 122 for bonding the supporting substrate is formed on the rear surface of the silicon substrate 128.

Moreover, the present embodiment includes the stress film 125 on the surface of the light illumination side, and the solid-state imaging chip 124 in the thinned film state is bonded to the supporting substrate 3. In the state where the solid-state imaging chip 124 is supported to the supporting substrate 3, the solid-state imaging chip 124 is constituted so as to be curved to the concave portion 2 side by the stress of the stress film 125. That is, the solid-state imaging chip 124 is curved according to the shape of the upper edge 2a of the concave portion 2. By the curving, the imaging surface 124A in the view-angle region A is formed in a curved surface corresponding to the field curvature which is generated by the imaging lens aberration.

Also in the present embodiment, similarly to those described above, the view-angle region is curved in the state where the semiconductor wafer including a plurality of solid-state imaging portions corresponding to each chip region is bonded on the supporting substrate 3. Thereafter, since the semiconductor wafer is divided into each solid-state imaging chip 124 along with the supporting substrate 3, the divided configuration is like a configuration as illustrated in FIG. 33.

Figure 34:
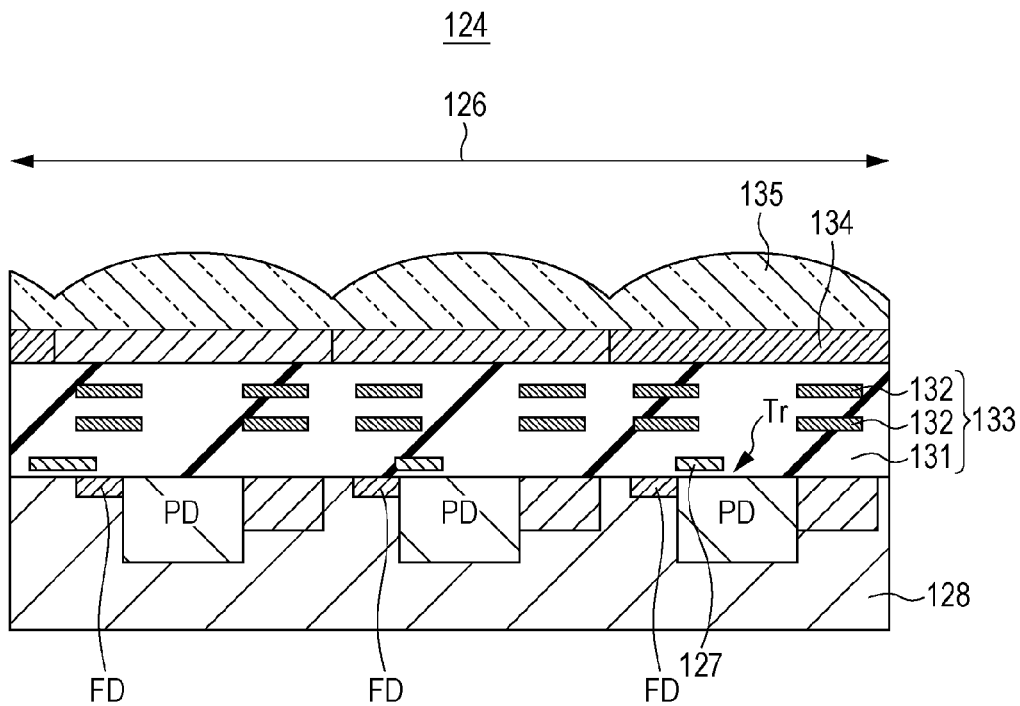
FIG. 34 is a schematic configuration diagram illustrating a main portion of a frontside-illumination type CMOS solid-state imaging chip.

FIG. 34 illustrates a schematic configuration (main portion) of an example of the frontside-illumination type solid-state imaging chip 124. In the solid-state imaging chip 124, photodiodes PD used as the photoelectric conversion portion and a plurality of pixels constituted by a plurality of pixel transistors Tr are two-dimensionally arranged on the silicon substrate 128, and the pixel region 126 is formed. In FIG. 34, a plurality of pixel transistors Tr is represented by a transfer transistor including the floating diffusion FD and a transfer gate electrode 127. A multilayer wiring layer 133 in which wirings 132 in a plurality of layers are disposed is formed on the surface side of the silicon substrate 128 via an interlayer insulating film 131. In addition, the color filter 134 and the on-chip lens 135 are formed on the multilayer wiring layer 133 corresponding to the pixel region 126. Although not illustrated, the periphery circuit portion including the logic circuit or the like is formed at the silicon substrate region of the outside of the pixel region 126. As illustrated in FIG. 34, in the present embodiment, before the solid-state imaging chip is bonded on the supporting substrate 3, the silicon substrate 128 is thinned from the rear surface side.

Since the other configurations are similar to those of the above-described first embodiment, the portions corresponding to those of FIG. 1 are denoted by the same reference numbers and the duplicate description is omitted in FIG. 33.

Example of Manufacturing Method of Solid-State Imaging Device

Figure 35A:
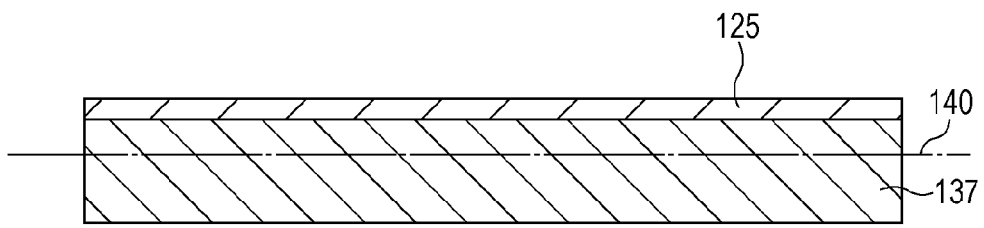
FIGS. 35A to 35C are manufacturing process diagrams illustrating an example of a manufacturing method of the solid-state imaging device according to the eleventh embodiment.
Figure 35B:
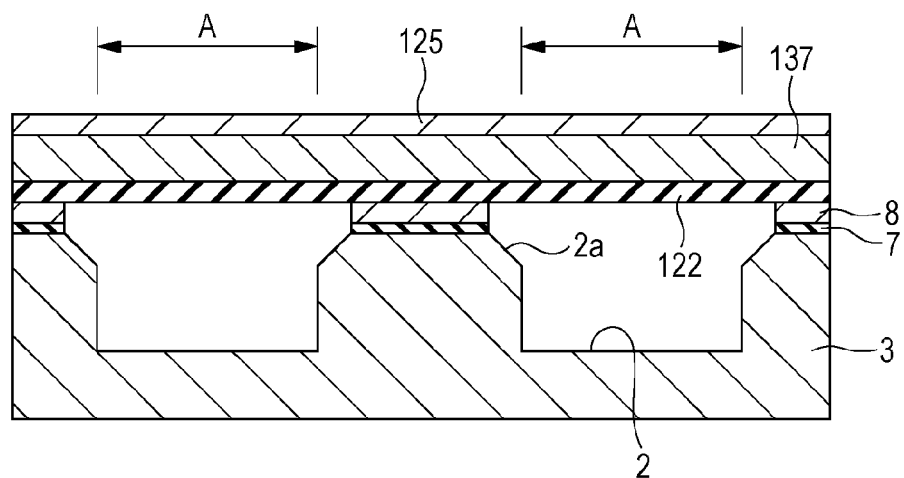
Figure 35C:
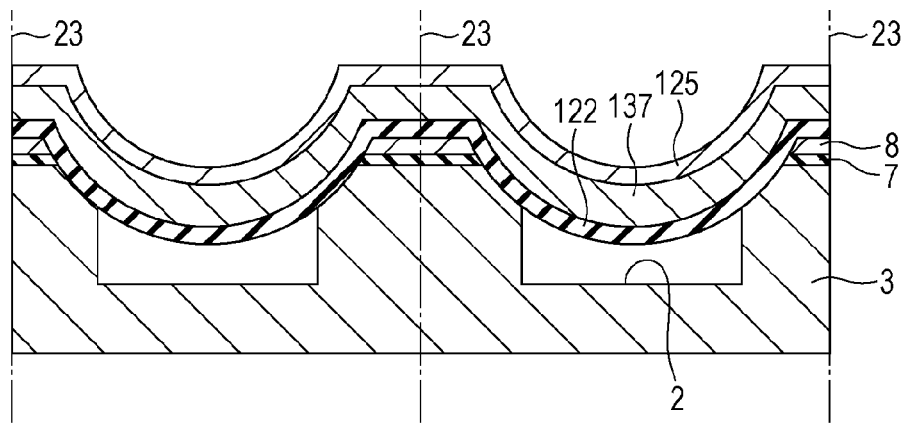

FIGS. 35A to 35C illustrate an example of the manufacturing method of the solid-state imaging device 121 according to the eleventh embodiment. As illustrated in FIG. 35A, a plurality of the frontside-illumination type solid-state imaging portions are formed at the region constituting each solid-state imaging chip of the semiconductor wafer 137 formed of silicon. As described above, each solid-state imaging portion includes the pixel region, the periphery circuit portion, the multilayer wiring layer, the color filter, the on-chip lens, or the like. In addition, the stress film 125 having a stress is formed on the surface of the semiconductor wafer 137 including the solid-state imaging portion, that is, the entire surface including the surface of the on-chip lens. Thereafter, the semiconductor wafer 137 is subjected to grinding, wet etching, or the like from the rear surface, and thinned until a position 140 indicated by a dashed-line. A desired insulating film 122 for bonding the supporting substrate 3 is formed on the rear surface of the thinned semiconductor wafer 137.

Next, as illustrated in FIG. 35B, the thinned semiconductor wafer 137 is bonded to the supporting substrate 3 including the concave portion 2. In this bonding, the view-angle region A of each solid-state imaging portion is aligned and bonded so as to seal the corresponding concave portion 2.

As illustrated in FIG. 35C, if the thinned semiconductor 137 is bonded to the supporting substrate 3, the view-angle region A is curved to a spherical shape of the concave portion 2 side by the stress of the stress film 125, and the imaging surface of the curved surface having a desired curvature is formed. Thereafter, the semiconductor wafer and the supporting substrate are divided along the scribe line which is illustrated as the dashed line 23 in FIG. 35C, and the intended frontside-illumination type CMOS solid-state imaging device 121 in which the imaging surface is curved is obtained as illustrated in FIG. 33.

According to the solid-state imaging device 121 and the manufacturing method thereof of the eleventh embodiment, the semiconductor wafer 137 is bonded to the supporting substrate 3 as it is, and only the frontside-illumination type view-angle region A is curved by using the stress of the stress film 125 formed on the surface side. Accordingly, the matching accuracy of the center of the view-angle region and the optical center of the imaging lens system is improved, and suppression with respect to the lens aberration can be improved by curving the imaging surface. The imaging lens aberration can be suppressed at the solid-state imaging chip side, and the number of the lenses of the imaging lens system can be reduced. Except for that, effects similar to those described in the first embodiment can be accomplished.

12. Twelfth Embodiment

Configuration Example of Solid-State Imaging Device

Figure 36:
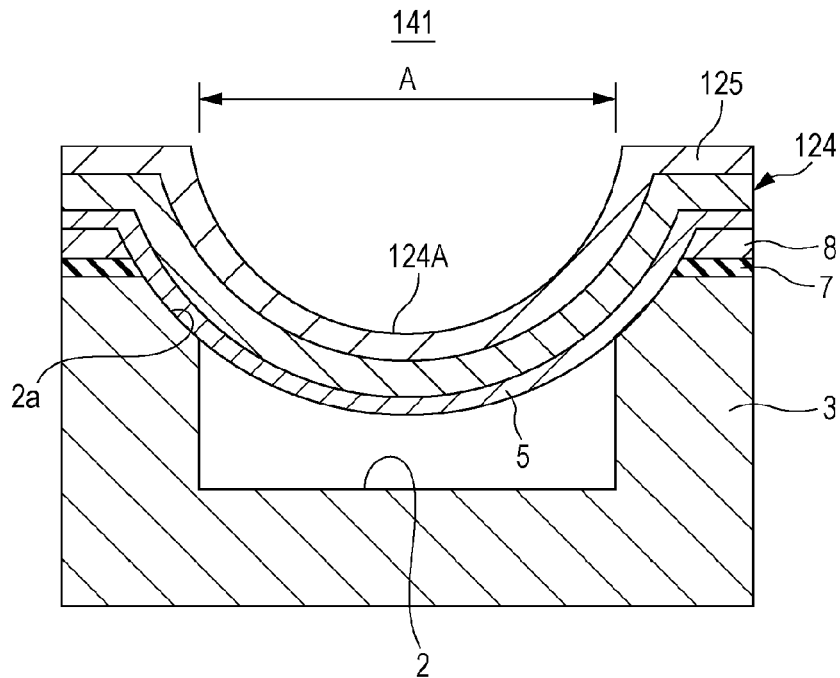
FIG. 36 is a schematic configuration diagram illustrating a twelfth embodiment of a solid-state imaging device according to the present disclosure.

FIG. 36 illustrates a twelfth embodiment of a solid-state imaging device of the present disclosure. The present embodiment is a case which is applied to the frontside-illumination type CMOS solid-state imaging device. In the solid-state imaging device 141 according to the twelfth embodiment, the stress film 125 having the stress is formed on the surface side of the frontside-illumination type solid-state imaging chip 124, and the stress film 5 having the stress is formed on the rear surface side, and the solid-state imaging chip 124 is bonded to the supporting substrate 3. The solid-state imaging chip 124 is thinned, and only the view-angle region A is curved to the concave portion 2 side by effects of the stress of the stress film 125 and the stress of the stress film 5 when the solid-state imaging chip 124 is bonded to the supporting substrate 3.

Since the other configurations are similar to those of the above-described eleventh embodiment, the portions corresponding to those of FIG. 33 are denoted by the same reference numbers and the duplicate description is omitted in FIG. 36.

In the method for manufacturing the solid-state imaging device 141, the stress film 5 having the stress is formed instead of the insulating film 122 in the process of FIG. 35B. Except for that, the solid-state imaging device 141 can be manufactured through the same processes which are described in FIGS. 35A to 35C.

According to the solid-state imaging device 141 of the twelfth embodiment, by using the stress film 125 having the stress and the stress film 5 having the stress, the view-angle region A can be curved with high controllability. Accordingly, the matching accuracy of the center of the view-angle region and the optical center of the imaging lens system is improved, and suppression with respect to the lens aberration can be improved by curving the imaging surface. The imaging lens aberration can be suppressed at the solid-state imaging chip side, and the number of the lenses of the imaging lens system can be reduced. Except for that, effects similar to those described in the first embodiment can be accomplished.

In addition, the second and the third embodiments can be applied to the frontside-illumination type solid-state imaging device. In this case, the stress film 125 having the stress is formed on the surface side of the solid-state imaging device instead of the stress film 5 having the stress. Moreover, the ninth and tenth embodiments can be applied to the frontside-illumination type solid-state imaging device. Except for that, in the frontside-illumination type solid-state imaging device, the configuration in which the notch 37 of the fourth embodiment is installed, or the configuration in which the film thickness of the solid-state imaging portion is varied in stages or continuously in the FIGS. 14A and 14B can be applied.

13. Thirteenth Embodiment

Configuration Example of Solid-State Imaging Device and First Example of Manufacturing Method Thereof In the second embodiment of FIG. 6 described above, the view-angle region is curved by using the compression effect of the stress film 5 having the stress and the adhesive agent 32. On the other hand, although not illustrated, in a solid-state imaging device of a first example of a thirteenth embodiment, the stress film 5 is omitted in the configuration of FIG. 6, and the view-angle region is curved by using only the compression effect of the adhesive agent 32. That is, in the solid-state imaging device according to the present embodiment, after the semiconductor wafer including a plurality of solid-state imaging portions corresponding to each chip region is bonded on the supporting substrate in which a plurality of concave portions is formed, the semiconductor wafer and the supporting substrate are divided into each solid-state imaging chip. In the present embodiment, the divided configuration includes the supporting substrate including the concave portion, the adhesive agent which is filled in the concave portion and has the volumetric shrinkage, and the solid-state imaging chip which is bonded on the supporting substrate so as to seal the concave portion by the view-angle region and is adhered by the adhesive agent. In addition, the view-angle region is curved to the concave portion by the volumetric shrinkage of the adhesive agent due to light irradiation or heating, and the imaging surface which is formed in the curved surface corresponding to the field curvature which is generated by the imaging lens aberration is provided.

In the manufacturing method of the solid-state imaging device according to the present embodiment, a plurality of concave portions is formed on the supporting substrate, and the adhesive agent having the volumetric shrinkage is filled in the concave portions. Next, the semiconductor wafer including a plurality of solid-state imaging portions corresponding to each chip region is bonded on the supporting substrate so as to seal each concave portion by the view-angle region of the solid-state imaging portion and is adhered by the adhesive agent. Next, the view-angle regions of a plurality of the solid-state imaging portions are curved to the concave portion side by the volumetric shrinkage of the adhesive agent due to the light irradiation or the heating in a state where the semiconductor wafer is thinned, and the imaging surface is formed in the curved surface corresponding to the field curvature which is generated by the imaging lens aberration. Next, the semiconductor wafer and the supporting substrate are divided into a plurality of the solid-state imaging portions constituting the solid-state imaging chip, and the intended solid-state imaging device is manufactured.

The solid-state imaging device of the present embodiment can be applied to the backside-illumination type or the frontside-illumination type solid-state imaging device. The configuration of the present embodiment is similar to that of the second embodiment except in that the stress film 5 is omitted. Therefore, since the configuration and the manufacturing method of the solid-state imaging device of the present embodiment correspond to those of FIGS. 6, 7A and 7B, and 8A and 8B in which the stress film 5 is omitted, the detailed descriptions are omitted.

According to the solid-state imaging device of the present embodiment, similarly to those described in the second embodiment, the entire surface of the view-angle region is evenly pulled by the volumetric shrinkage of the adhesive agent, and the entire view-angle region can be evenly curved to a hemispherical shape. By controlling the volumetric shrinkage of the adhesive agent, the curved shape of the view-angle region can be a more desired (imagined) curved shape. Accordingly, the matching accuracy of the center of the view-angle region and the optical center of the imaging lens system is improved, and suppression with respect to the lens aberration can be improved by curving the imaging surface. The imaging lens aberration can be suppressed at the solid-state imaging chip side, and the number of the lenses of the imaging lens system can be reduced. Except for that, effects similar to those described in the first embodiment can be accomplished.

According to the manufacturing method of the solid-state imaging device of the present embodiment, after the semiconductor wafer is bonded to the supporting substrate as it is, the semiconductor wafer is thinned, and the heat treatment or the light irradiation with respect to the adhesive agent is performed. The force which pulls the thinned semiconductor wafer to the concave portion side by the volumetrically shrunk adhesive agent is applied to the semiconductor wafer. The pulling force due to the adhesive agent is applied evenly to the entire adhered view-angle region. By the effect, the view-angle region of each solid-state imaging portion of the semiconductor wafer can be evenly curved to the concave portion side. By controlling the volumetric shrinkage of the adhesive agent, the curvature of the view-angle region which is curved can be appropriately controlled. Therefore, similarly to those described in the first embodiment, the matching accuracy of the center of the view-angle region and the optical center of the imaging lens system is improved, and the solid-state imaging device in which the imaging surface is curved and the lens aberration is suppressed can be manufactured. Except for that, effects similar to those of the first embodiment described above are accomplished.

Configuration Example of Solid-State Imaging Device and Second Example of Manufacturing Method Thereof In the third embodiment of FIG. 9 described above, the view-angle region is curved by using the stress film 5 having the stress and the differential pressure between a vacuum and the atmospheric pressure. On the other hand, although not illustrated, in a solid-state imaging device of a second example of a thirteenth embodiment, the stress film 5 is omitted in the configuration of FIG. 9, and the view-angle region is curved by using only the differential pressure. That is, in the solid-state imaging device according to the present embodiment, after the semiconductor wafer including a plurality of solid-state imaging portions corresponding to each chip region is bonded on the supporting substrate in which a plurality of concave portions is formed, the semiconductor wafer and the supporting substrate are divided into each solid-state imaging chip. In the present embodiment, the divided configuration includes the supporting substrate including the concave portion, and the solid-state imaging chip which is bonded on the supporting substrate so as to seal the concave portion by the view-angle region. In addition, the view-angle region is curved to the concave portion by the differential pressure between a vacuum in the concave portion and the atmospheric pressure of the outside of the solid-state imaging chip, and the imaging surface which is formed in the curved surface corresponding to the field curvature which is generated by the imaging lens aberration is provided.

In the manufacturing method of the solid-state imaging device according to the present embodiment, a plurality of concave portions is formed on the supporting substrate, and the semiconductor wafer including a plurality of solid-state imaging portions corresponding to each chip region is bonded on the supporting substrate so as to seal each concave portion by the view-angle region of the solid-state imaging portion in the vacuum chamber. Thereafter, the inner portion of the chamber reaches atmospheric pressure. The view-angle regions of a plurality of the solid-state imaging portions are curved to the concave portion side by the differential pressure between a vacuum and the atmospheric pressure in the state where the semiconductor wafer is thinned, and the imaging surface is formed in the curved surface corresponding to the field curvature which is generated by the imaging lens aberration. Next, the semiconductor wafer and the supporting substrate are divided into a plurality of the solid-state imaging portions constituting the solid-state imaging chip, and the intended solid-state imaging device is manufactured.

The solid-state imaging device of the present embodiment can be applied to the backside-illumination type or the frontside-illumination type solid-state imaging device. The configuration of the present embodiment is similar to that of the third embodiment except in that the stress film 5 is omitted. Therefore, since the configuration and the manufacturing method of the solid-state imaging device of the present embodiment correspond to those of FIGS. 9, 10A and 10B, and 11A and 11B in which the stress film 5 is omitted, the detailed descriptions are omitted.

According to the solid-state imaging device of the present embodiment, similarly to those described in the third embodiment, the entire surface of the view-angle region is evenly pulled by the differential pressure between the inner surface and the outer surface of the solid-state imaging chip, and the entire view-angle region can be evenly curved to a hemispherical shape. By controlling the degree of vacuum in the concave portion, the curved shape of the view-angle region can be a more desired (imagined) curved shape. Accordingly, the matching accuracy of the center of the view-angle region and the optical center of the imaging lens system is improved, and suppression with respect to the lens aberration can be improved by curving the imaging surface. The imaging lens aberration can be suppressed at the solid-state imaging chip side, and the number of the lenses of the imaging lens system can be reduced. Except for that, effects similar to those described in the first embodiment can be accomplished.

According to the manufacturing method of the solid-state imaging device of the present embodiment, after the semiconductor wafer and the supporting substrate are bonded to each other in the vacuum chamber, the semiconductor wafer and the supporting substrate are extracted to the state of the atmospheric pressure, and the semiconductor wafer is thinned. Due to the fact that the semiconductor wafer is thinned, the force which pulls the semiconductor wafer to the concave portion side by the differential pressure between a vacuum in the concave portion and the atmospheric pressure in the outer surface side of the semiconductor wafer is applied to the semiconductor wafer. The pulling force due to the differential pressure is applied evenly to the entire view-angle region. By the effect, the view-angle region of each solid-state imaging portion of the semiconductor wafer can be evenly curved to the concave portion side. By controlling the degree of vacuum in the concave portion, the curvature of the view-angle region which is curved can be appropriately controlled. Therefore, similarly to those described in the first embodiment, the matching accuracy of the center of the view-angle region and the optical center of the imaging lens system is improved, and the solid-state imaging device 35 in which the imaging surface is curved and the lens aberration is suppressed can be manufactured. Except for that, effects similar to those of the first embodiment described above are accomplished.

14. Fourteenth Embodiment

Configuration Example of Electronic Apparatus

For example, the solid-state imaging devices according to the above-described embodiments and modifications of the present disclosure can be applied to electronic apparatuses of a camera system such as a digital camera or a video camera, or a mobile phone having an imaging function, other apparatuses having an imaging function, or the like.

Figure 37:
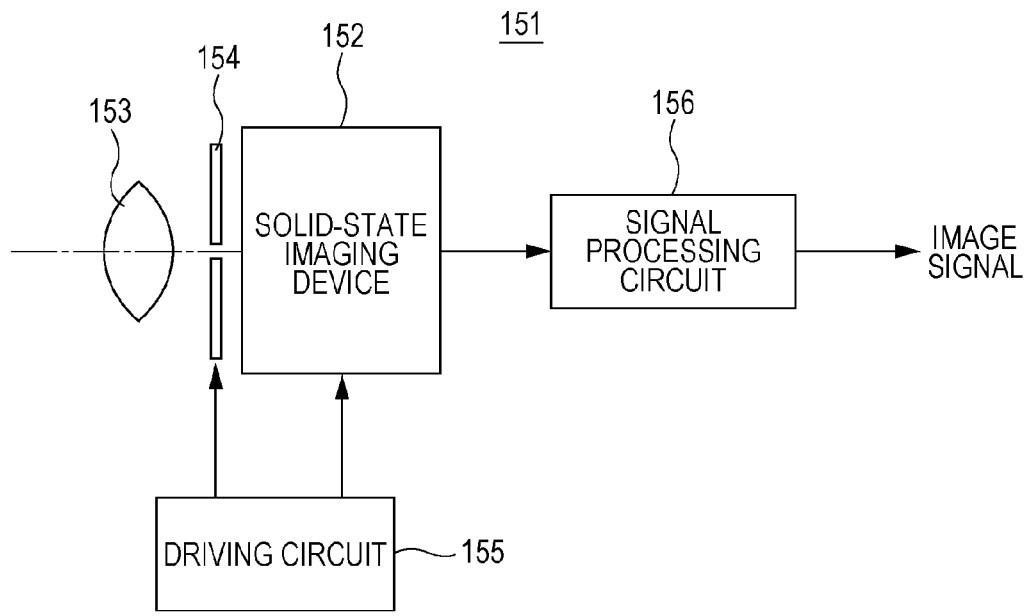
FIG. 37 is a schematic configuration diagram illustrating an electronic apparatus according to a thirteenth embodiment of the present disclosure.

FIG. 37 illustrates a fourteenth embodiment which is applied to a camera as an example of an electronic apparatus according to the present disclosure. The camera according to the present embodiment is exemplified as a video camera capable of performing photography of a static image or a moving image. The camera 151 of the present embodiment includes a solid-state imaging device 152, an optical systems 153 which introduces incident light into a received light sensing portion of the solid-state imaging device 152, and a shutter unit 154. In addition, the camera 151 includes a driving circuit 155 which drives the solid-state imaging device 152, and a signal processing circuit 156 which process an output signal of the solids-state imaging device 152.

The solid-state imaging device 152 may be applied to any one of the solid-state imaging devices of the above-described embodiments and modifications. The optical system (optical lens) 153 images an image light (incident light) from a subject on the imaging surface of the solid-state imaging device 152. Thereby, the signal charge is stored in the solid-state imaging device 152 for a predetermined interval. The optical system 153 may be an optical lens system which is constituted by a plurality of optical lenses.

The shutter unit 154 controls the light irradiation interval and the light shield interval into the solid-state imaging device 152. The driving circuit 155 supplies the driving signal which controls the transfer operation of the solid-state imaging device 152 and the shuttering operation of the shutter unit 154. The signal transfer of the solid-state imaging device 152 is performed by the driving signal (timing signal) supplied from the driving circuit 155.

The signal processing circuit 156 performs various signal processing. The image signal which is subjected to the signal processing is stored in a storage medium such as memory or output to a monitor.

According to the electronic apparatus of the fourteenth embodiment, in the backside-illumination type solid-state imaging device 152, the matching accuracy of the center of the view-angle region and the optical center of the imaging lens system is improved, and suppression with respect to the lens aberration can be improved by curving the imaging surface. Therefore, the number of the imaging lenses can be reduced, and the electronic apparatus having a high quality image can be provided. For example, the camera in which the image quality is improved can be provided.

The present disclosure contains subject matter related to that disclosed in Japanese Priority Patent Application JP 2010-260973 filed in the Japan Patent Office on Nov. 24, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A manufacturing method of a solid-state imaging device comprising:
    forming a plurality of concave portions in a supporting substrate;
    forming a stress film on a first surface of a semiconductor wafer which includes a plurality of solid-state imaging portions;
    bonding the first surface of the semiconductor wafer on the supporting substrate so as to seal each concave portion in a view-angle region of each of the solid-state imaging portions, each of the view-angle regions being a region in which a light-receiving pixel of the solid-state imaging device is arranged;
    curving the view-angle regions of the plurality of solid-state imaging portions to a concave portions side by stress of the stress film in a state where the semiconductor wafer is thinned; and dividing the semiconductor wafer and the supporting substrate into the plurality of solid-state imaging portions.

2. The manufacturing method of a solid-state imaging device according to claim 1,
wherein the bonding of the semiconductor wafer is performed in a vacuum chamber, and
thereafter, a pressure in the vacuum chamber is made to be in atmospheric pressure, and
the curving of the view-angle regions is performed by both effects of differential pressure between a vacuum in the vacuum chamber and the atmospheric pressure.

3. The manufacturing method of a solid-state imaging device according to claim 1, further comprising:
filling an adhesive agent having shrinkage characteristics into the concave portions of the supporting substrate,
wherein the bonding of the semiconductor wafer on the supporting substrate is performed by bonding between the supporting substrate and the semiconductor wafer and bonding between the adhesive agent and the semiconductor wafer, and
the curving of the view-angle regions is performed by both volumetric shrinkage of the adhesive agent due to a light irradiation and heating.

4. The manufacturing method of a solid-state imaging device according to claim 1, further comprising:
forming the plurality of solid-state imaging portions of the semiconductor wafer in a backside-illumination type,
wherein the stress film is formed as a film having a stress on a surface opposite to a light-incident side of the solid-state imaging portions, and
the curving of the view-angle regions is performed by the stress of the stress film due to the thinning of the semiconductor wafer.

5. The manufacturing method of a solid-state imaging device according to claim 1, further comprising:
forming the plurality of solid-state imaging portions of the semiconductor wafer in a frontside-illumination type.

6. A manufacturing method of a solid-state imaging device comprising:
forming a plurality of concave portions in a supporting substrate;
forming a stress film on a first surface of a semiconductor wafer which includes a plurality of solid-state imaging portions, the plurality of solid-state imaging portions of the semiconductor wafer being a frontside-illumination type;
bonding a second surface of the semiconductor wafer on the supporting substrate so as to seal each concave portion in a view-angle region of each of the solid-state imaging portions, each of the view-angle regions being a region in which a light-receiving pixel of the solid-state imaging device is arranged;
curving the view-angle regions of the plurality of solid-state imaging portions to the concave portions side by stress of the stress film in a state where the semiconductor wafer is thinned; and
dividing the semiconductor wafer and the supporting substrate into the plurality of solid-state imaging portions
wherein the bonding of the semiconductor wafer is performed in a vacuum chamber,
thereafter, a pressure in the chamber is made to be in atmospheric pressure, and
the curving of the view-angle regions is performed by both effects of differential pressure between a vacuum and the atmospheric pressure and the stress of the stress film.

* * * * *